(12) United States Patent
Shigeta

(10) Patent No.: US 11,810,426 B2
(45) Date of Patent: *Nov. 7, 2023

(54) MANAGEMENT SYSTEM OF SUBSTITUTE CURRENCY FOR GAMING

(71) Applicant: ANGEL GROUP CO., LTD., Shiga (JP)

(72) Inventor: Yasushi Shigeta, Shiga (JP)

(73) Assignee: ANGEL GROUP CO., LTD., Shiga (JP)

( * ) Notice: Subject to any disclaimer, the term of this patent is extended or adjusted under 35 U.S.C. 154(b) by 31 days.

This patent is subject to a terminal disclaimer.

(21) Appl. No.: 17/231,129

(22) Filed: Apr. 15, 2021

(65) Prior Publication Data

US 2021/0233355 A1 Jul. 29, 2021

Related U.S. Application Data

(63) Continuation of application No. 15/557,429, filed as application No. PCT/JP2016/072673 on Aug. 2, 2016, now Pat. No. 11,270,554.

(30) Foreign Application Priority Data

Aug. 3, 2015 (JP) .................................. 2015-163213
Nov. 19, 2015 (JP) .................................. 2015-240631
Feb. 1, 2016 (JP) .................................. 2016-030443

(51) Int. Cl.
*A63F 13/00* (2014.01)
*G07F 17/32* (2006.01)
(Continued)

(52) U.S. Cl.
CPC .......... *G07F 17/3248* (2013.01); *A63F 1/067* (2013.01); *A63F 1/18* (2013.01);
(Continued)

(58) Field of Classification Search
CPC ............... G07F 17/322; G07F 17/3248; G07F 17/3251; A63F 1/14
See application file for complete search history.

(56) References Cited

U.S. PATENT DOCUMENTS 3,953,932 A 5/1976 Graves
4,026,309 A 5/1977 Howard
(Continued)

FOREIGN PATENT DOCUMENTS

CN 1890005 A 1/2007
CN 101495198 A 7/2009
(Continued)

OTHER PUBLICATIONS

International search report dated Oct. 25, 2016 for corresponding PCT application PCT/US2016/072673 cites the U.S. Patent and foreign patent documents above.
(Continued)

*Primary Examiner* — David L Lewis
*Assistant Examiner* — Eric M Thomas
(74) *Attorney, Agent, or Firm* — NORTON ROSE FULBRIGHT US LLP

(57) ABSTRACT

A detection system including a control device detecting fraud performed in a game table by using a result of an image analysis performed by an image analyzing device is included. A substitute currency for gaming used for this detection system has a multi-layer structure in which a plurality of plastic layers having different colors are stacked, a coloring layer is included at least in the middle, and white layers or thin-color layers (may be layers having a color thinner than that of the coloring layer; not illustrated in the drawing) are stacked on both sides of the coloring layer disposed in the middle.

21 Claims, 31 Drawing Sheets

(51) Int. Cl.
- *A63F 1/18* (2006.01)
- *A63F 3/00* (2006.01)
- *B32B 27/08* (2006.01)
- *B32B 37/18* (2006.01)
- *G06F 1/18* (2006.01)
- *G06K 19/077* (2006.01)
- *G06Q 50/10* (2012.01)
- *H05K 7/14* (2006.01)
- *A63F 1/06* (2006.01)
- *A63F 9/24* (2006.01)

(52) U.S. Cl.
CPC .......... *A63F 3/00157* (2013.01); *B32B 27/08* (2013.01); *B32B 37/182* (2013.01); *G06F 1/187* (2013.01); *G06K 19/077* (2013.01); *G06Q 50/10* (2013.01); *G07F 17/322* (2013.01); *G07F 17/3206* (2013.01); *G07F 17/3237* (2013.01); *G07F 17/3241* (2013.01); *H05K 7/1401* (2013.01); *H05K 7/1489* (2013.01); *A63F 2009/2435* (2013.01); *A63F 2009/2489* (2013.01); *A63F 2250/58* (2013.01); *G06T 2207/20084* (2013.01); *G07F 17/3293* (2013.01)

(56) References Cited

U.S. PATENT DOCUMENTS

| | | | |
|---|---|---|---|
| 4,814,589 | A | 3/1989 | Storch et al. |
| 5,361,885 | A | 11/1994 | Modler |
| 5,651,548 | A | 7/1997 | French |
| 5,735,742 | A | 4/1998 | French |
| 5,794,532 | A | 8/1998 | Gassies et al. |
| 6,039,650 | A | 3/2000 | Hill |
| 6,913,531 | B1 | 7/2005 | Yoseloff |
| 7,448,485 | B1 | 11/2008 | Rutler |
| 8,616,984 | B2 | 12/2013 | Mattice et al. |
| 9,361,577 | B2 | 6/2016 | Toshiba |
| 2002/0042298 | A1 | 4/2002 | Soltys et al. |
| 2002/0042299 | A1 | 4/2002 | Soltys et al. |
| 2003/0064798 | A1 | 4/2003 | Grauzer et al. |
| 2004/0219975 | A1 | 11/2004 | Soltys et al. |
| 2005/0051965 | A1 | 3/2005 | Gururajan |
| 2005/0059479 | A1 | 3/2005 | Soltys et al. |
| 2005/0121852 | A1 | 6/2005 | Soltys et al. |
| 2005/0139665 | A1 | 6/2005 | Sato |
| 2005/0173054 | A1 | 8/2005 | Peterson |
| 2006/0019739 | A1 | 1/2006 | Soltys et al. |
| 2006/0160608 | A1 | 7/2006 | Hill et al. |
| 2006/0252554 | A1 | 11/2006 | Gururajan et al. |
| 2007/0060311 | A1 | 3/2007 | Rowe et al. |
| 2007/0077987 | A1 | 4/2007 | Gururajan et al. |
| 2007/0105618 | A1 | 5/2007 | Chapet et al. |
| 2007/0184898 | A1 | 8/2007 | Miller et al. |
| 2007/0197299 | A1 | 8/2007 | Miller et al. |
| 2007/0241903 | A1 | 10/2007 | Shimazu et al. |
| 2007/0278314 | A1 | 12/2007 | Chapet |
| 2008/0041932 | A1 | 2/2008 | James et al. |
| 2008/0076529 | A1 | 3/2008 | Richards et al. |
| 2008/0113767 | A1 | 5/2008 | Nguyen et al. |
| 2008/0113783 | A1 | 5/2008 | Czyzewski et al. |
| 2008/0188292 | A1 | 8/2008 | Walker |
| 2009/0075725 | A1 | 3/2009 | Koyama |
| 2009/0146373 | A1 | 6/2009 | Chapet |
| 2009/0191933 | A1 | 7/2009 | French |
| 2009/0233699 | A1 | 9/2009 | Koyama |
| 2010/0105486 | A1 | 4/2010 | Shigeta |
| 2010/0130288 | A1 | 5/2010 | Shigeta |
| 2010/0160032 | A1 | 6/2010 | Paton |
| 2010/0240446 | A1 | 9/2010 | Koyama et al. |
| 2010/0285869 | A1* | 11/2010 | Walker ............... G07F 17/3251 463/16 |
| 2011/0052049 | A1 | 3/2011 | Rajaraman et al. |
| 2012/0040727 | A1 | 2/2012 | Gururajan et al. |
| 2012/0080845 | A1 | 4/2012 | Emori et al. |
| 2012/0208622 | A1* | 8/2012 | Delaney ............... G07F 17/322 463/25 |
| 2012/0241344 | A1 | 9/2012 | Gronau et al. |
| 2012/0252564 | A1 | 10/2012 | Moore et al. |
| 2012/0282998 | A1 | 11/2012 | Emori et al. |
| 2013/0233923 | A1 | 9/2013 | Hoyt et al. |
| 2013/0277911 | A1 | 10/2013 | Shigeta |
| 2013/0313776 | A1 | 11/2013 | Gelinotte et al. |
| 2013/0316797 | A1 | 11/2013 | Gelinotte et al. |
| 2014/0057703 | A1* | 2/2014 | LeStrange .......... G07F 17/3255 463/25 |
| 2014/0291399 | A1 | 10/2014 | Koyama |
| 2014/0332595 | A1 | 11/2014 | Moreno et al. |
| 2014/0345173 | A1 | 11/2014 | Bretz |
| 2015/0036920 | A1 | 2/2015 | Wu et al. |
| 2015/0097335 | A1 | 4/2015 | Shigeta |
| 2015/0141125 | A1 | 5/2015 | LeStrange et al. |
| 2015/0312517 | A1 | 10/2015 | Hoyt et al. |
| 2015/0356825 | A1 | 12/2015 | Okada et al. |
| 2016/0171336 | A1 | 6/2016 | Schwartz |

FOREIGN PATENT DOCUMENTS

| | | |
|---|---|---|
| CN | 101662965 A | 3/2010 |
| CN | 101919110 A | 12/2010 |
| CN | 101957905 A | 1/2011 |
| CN | 102123770 A | 7/2011 |
| CN | 103262100 A | 8/2013 |
| CN | 104620288 A | 5/2015 |
| EP | 1589502 | 10/2005 |
| EP | 2545967 A2 | 1/2013 |
| JP | 64500243 A | 2/1989 |
| JP | H01500243 A | 2/1989 |
| JP | 03102917 | 10/1991 |
| JP | 06134140 A | 5/1994 |
| JP | H06-134140 A | 5/1994 |
| JP | 2000061122 A | 2/2000 |
| JP | 2000259796 A | 9/2000 |
| JP | 2002007989 A | 1/2002 |
| JP | 2002-312745 A | 10/2002 |
| JP | 2003126535 A | 5/2003 |
| JP | 2004-102953 A | 4/2004 |
| JP | 2005144032 A | 6/2005 |
| JP | 2005190025 A | 7/2005 |
| JP | 2005342175 A | 12/2005 |
| JP | 2006021000 A | 1/2006 |
| JP | 2006231089 | 9/2006 |
| JP | 2007-310696 A | 11/2007 |
| JP | 2008077140 A | 4/2008 |
| JP | 2009018021 A | 1/2009 |
| JP | 2009066172 A | 4/2009 |
| JP | 2009066173 A | 4/2009 |
| JP | 2009153799 A | 7/2009 |
| JP | 2009219588 A | 10/2009 |
| JP | 2010128915 A | 6/2010 |
| JP | 2010187807 A | 9/2010 |
| JP | 2010213940 A | 9/2010 |
| JP | 2011067339 A | 4/2011 |
| JP | 2011-106899 A | 8/2011 |
| JP | 2012234389 A | 11/2012 |
| JP | 2013117814 A | 6/2013 |
| JP | 2013198626 A | 10/2013 |
| JP | 2014504164 A | 2/2014 |
| JP | 2014064867 A | 4/2014 |
| JP | 2014-095974 A | 5/2014 |
| JP | 2014140576 A | 8/2014 |
| JP | 2014-203139 A | 10/2014 |
| JP | 2015061696 A | 4/2015 |
| JP | 2015-128458 A | 7/2015 |
| JP | 2016110232 A | 6/2016 |
| JP | 2017505661 A | 2/2017 |
| KR | 10-2009-0081140 A | 7/2009 |
| KR | 101289354 B1 | 7/2013 |
| KR | 1020130130414 A | 12/2013 |
| KR | 10-2014-0113725 A | 9/2014 |
| WO | 8706372 A1 | 10/1987 |
| WO | 2005124666 A1 | 12/2005 |
| WO | 2007/100945 A2 | 9/2007 |

(56) References Cited

FOREIGN PATENT DOCUMENTS

| WO | 2008045075 A2 | 4/2008 |
| WO | 2008120749 A1 | 10/2008 |
| WO | 2012058401 A2 | 5/2012 |
| WO | 2014182306 A1 | 11/2014 |
| WO | 2015107902 | 7/2015 |

OTHER PUBLICATIONS

International Application No. PCT/JP2017/025796, International Search Report dated Oct. 3, 2017.
International Application No. PCT/JP2017/032692, International Search Report dated Oct. 10, 2017.
Singaporean Search Report and Written Opinion dated Feb. 20, 2018 for corresponding Singaporean application 11201709269Y.
New Zealand First Examination Report dated Mar. 21, 2018 for corresponding New Zealand application 734963.
New Zealand First Examination Report dated Mar. 27, 2018 for corresponding New Zealand application 735237.
New Zealand First Examination Report dated Apr. 5, 2018 for corresponding New Zealand application 735240.
New Zealand First Examination Report dated Mar. 27, 2018for corresponding New Zealand application 736686.
European Search Report dated Apr. 20, 2018 for corresponding European application 17197089.0.
European Search Report dated May 2, 2018 for family European application 17197105.4.
European Search Report dated May 4, 2018 for family European application 17206785.2.
Singaporean Written Opinion dated Jun. 11, 2018 for family Singaporean application 10201710385X.
Australian Examination Report No. 1 dated Nov. 2, 2018 for AU application No. 2016302326.
Japanese Office Action dated Nov. 27, 2018 for JP application No. 2017-533091.
New Zealand 2nd Office Action dated Nov. 23, 2018 for NZ application No. 734963.
Singaporean 2nd Office Action dated Dec. 6, 2018 for SG application No. 11201709269Y.
Korean Office Action dated Dec. 19, 2018 for KR application No. 10-2017-7021788.
European Search Report dated Jan. 30, 2019 for EP application No. 16833046.2.
JP Office Action dated May 7, 2019 for JP application No. 2017-533091.
JP Office Action dated May 14, 2019 for JP application No. 2017-208980.
Singapore Written Opinion dated Jul. 3, 2019 for SG application No. 10201710384Y.
Japanese Office Action dated Sep. 24, 2019 issued in JP Application 2017-533091.
European Search Report dated Oct. 7, 2019 issued in EP 172067852.
U.S. Office Action dated Oct. 7, 2019 issued in U.S. Appl. No. 15/812,099.
Japanese Office Action dated Jan. 28, 2020 issued in JP Application 2017-208980.
Office Action dated Apr. 20, 2020 issued in Canadian Application 2984408.
Office Action dated May 15, 2020 issued in U.S. Appl. No. 15/812.099.
Office Action dated May 20, 2020 issued in CN Application 201711181850.6.
Office Action dated Jun. 23, 2020 issued in CN Application 201711183807.3.
EP Search Report dated Jul. 1, 2020 issued in EP Application 20164390.5.
Office Action dated Sep. 15, 2020 issued in JP Application 2019-021869.
Office Action dated Sep. 16, 2020 issued in CN Application 201680020454.2.
U.S. Offic Action dated Mar. 22, 2019 for U.S. Appl. No. 15/792,195.
Korean Allowance dated Oct. 28, 2021 issued in KR Application 10-2019-7030053.
Japanese Office Action dated Apr. 19, 2022 issued in JP Application 2021-057618.
Australian Office Action dated Apr. 20, 2022 issued in AU Application 2020201831.
Australian Office Action dated Apr. 22, 2022 issued in AU Application 2021202569.
Japanese Office Action dated Apr. 26, 2022 issued in JP Application 2021-037723.
Japanese Office Action dated Jun. 28, 2022 issued in JP Application 2021-169974.
2nd Office Action dated Apr. 2, 2021 issued in CN Application 201711133807.3.
Japanese Office Action dated Oct. 18, 2022 issued in JP Application 2021-037723.
Japanese Office Action dated Nov. 29, 2022 issued in JP Application 2021-165982.
Japanese Office Action dated Dec. 13, 2022 issued in JP Application 2022-063745.
Chinese Office Action dated Jun. 8, 2023 issued in CN Application 202111551345.2.
Japanese Office Action dated Aug. 29, 2023 issued in JP Application 2022-167337.

* cited by examiner

MANAGEMENT SYSTEM OF SUBSTITUTE CURRENCY FOR GAMING

CROSS-REFERENCE TO RELATED APPLICATIONS

This application is a continuation from U.S. patent application Ser. No. 15/557,429 filed Sep. 11, 2017, which is a 371 of International Application No. PCT/JP2016/072673 filed Aug. 2, 2016, which claims priority to JP Pat. App. No. 2015-163213 filed Aug. 3, 2015; JP Pat. App. No. 2015-240631 filed Nov. 19, 2015; and JP Pat. App. No. 2016-30443 filed Feb. 1, 2016; each of which is incorporated herein by reference.

TECHNICAL FIELD

The present invention relates to substitute currency for gaming (gaming chips) in a game house, an inspection device, and a management system for table games, and more particularly, to a technology for detecting fraud.

BACKGROUND ART

In game houses such as casinos, there are various attempts for preventing fraud. A game house includes monitoring cameras used for monitoring fraud and prevents fraud by determining fraud of a game, fraud according to collection or repayment of substitute currency for gaming that is different from the result of win/loose, and the like based on an image acquired from the monitoring camera.

Meanwhile, in order to perceive the number or a total amount of bet substitute currency for gaming, it has been proposed to perceive the amount of substitute currency for gaming by attaching a radio IC (RFID) tag to each substitute currency for gaming.

In a card game monitoring system disclosed in WO 2015/107902 A, it is determined whether or not substitute currency for gaming placed on a game table is collected or re-payed according to a result of win/loose by performing an image analysis of the movement of substitute currency for gaming, whereby fraud is monitored.

SUMMARY OF INVENTION

An object of the present invention is to provide new substitute currency for gaming, an inspection device, and a management system for table gates that detects fraud in a game in a game house or a mistake or fraud when substitute currency for gaming is bet or is paid off.

Substitute currency for gaming according to an aspect of the present invention is substitute currency for gaming in which a stacked structure body formed by a plurality of plastic layers is configured by stacking at least a coloring layer and a white layer or a thin-color layer, a stripe pattern is formed on a side face in a stacking direction, a configuration enabling a type of substitute currency for gaming to be specified by the coloring layer is included, a print layer representing a type of the substitute currency for gaming is applied to a further upper and lower faces of the stacked structure body, and a layer structure is formed by thermo-compressing each interlayer.

In the substitute currency for gaming described above, a side ID that can be individually identified may be attached to an outer face of the white layer or the thin-color layer.

In the substitute currency for gaming described above, the side IDs may be attached to at least three or more positions spaced apart in a rotation direction of the side face of the substitute currency for gaming.

In the substitute currency for gaming described above, the side ID may be printed using ink that is not visible for visible light.

In the substitute currency for gaming described above, the side ID may be printed using ink absorbing infrared rays.

In the substitute currency for gaming described above, the side ID may be disposed in a plurality of rows on each of outer faces of two layers of the white layers or the thin-color layers.

In the substitute currency for gaming described above, R processing may be performed for outer angles of upper and lower faces of the print layer.

In the substitute currency for gaming described above, at least one layer of the plurality of plastic layers may be a heavy layer containing metal powder used for increasing the weight.

In the substitute currency for gaming described above, the metal powder used for increasing the weight may be a metal oxide and may be one or a plurality of metal oxides, particularly, among a zinc oxide and a titanium oxide.

In the substitute currency for gaming described above, white layers or thin-color layers may be disposed on both sides with the coloring layer interposed therebetween, and thicknesses of upper and lower layers of the white layers or the thin-color layers having the coloring layer interposed therebetween may be configured to be different from each other.

In the substitute currency for gaming described above, an RFID may be tightly fixed between plastic layers each forming any one of the coloring layer and the white layer or the thin-color layer.

In the substitute currency for gaming described above, a face code formed using UV emission ink or ink absorbing infrared rays may be disposed on the print layer.

In the substitute currency for gaming described above, a structure in which side IDs are attached to a side face, and an RFID is built may be formed, a face code formed using UV emission ink or ink absorbing infrared rays is disposed on the print layer, and information of the sides ID attached to the side face and information of the RFID may be associated with each other, the information of the side ID and information of the face code may be associated with each other, or the information of the side ID, the information of the RFID, and the information of the face code may be associated with each other.

An inspection device according to an aspect of the present invention is an inspection device inspecting the substitute currency for gaming and includes: an RFID reading device that reads information of the RFID of the substitute currency for gaming; an ID reading device that reads the side ID disposed on the side face; and a control device. A relation between information of the side ID acquired by the ID reading device and information acquired by the RFID reading device is configured to be inspected.

An inspection device according to another aspect of the present invention is an inspection device inspecting the substitute currency for gaming and includes: a face code reading device that reads the face code formed using UV emission ink or ink absorbing infrared rays disposed on the surface of the substitute currency for gaming; an ID reading device that reads the side ID disposed on the side face; and a control device. The control device is configured to inspect a relation between information of the side ID acquired by the ID reading device and information acquired by the face code reading device.

An inspection device according to further another aspect of the present invention is an inspection device inspecting the substitute currency for gaming and includes: a face code reading device that reads the face code formed using UV emission ink or ink absorbing infrared rays disposed on the surface of the substitute currency for gaming; an ID reading device that reads the side ID disposed on the side face; an RFID reading device that reads information of the RFID of the substitute currency for gaming; and a control device. A relation among information of the side ID acquired by the ID reading device, information acquired by the face code reading device, and information acquired by the RFID reading device is configured to be inspected.

In the inspection device described above, the side ID may be printed using at least one or a combination of ink that is visible for visible light and ink absorbing infrared rays, and the ID reading device may include one or a plurality of visible-light cameras or infrared-ray cameras corresponding to the ink used for printing the side ID or a camera capable of performing switching among a plurality of functions of a visible-light camera and an infrared-ray camera corresponding to the ink.

In the inspection device described above, a determination device of a type of the substitute currency for gaming that images the side face of the substitute currency for gaming and determines a color of a stripe pattern of the side face in a stacking direction or a print inspecting device that reads a print of a print layer arranged in the substitute currency for gaming may be further included, and a relation between the type of the substitute currency for gaming and a print content of the print layer may be inspected.

A method of manufacturing substitute currency for gaming according to an aspect of the present invention includes: forming a stacked structure body formed by a plurality of plastic layers by stacking at least a coloring layer and a white layer or a thin-color layer; arranging a print layer in which a drawing pattern is printed on at least an upper face or a lower face of the stacked structure body of the plurality of plastic layers; generating a gaming substitute currency original plate by heating and welding the layers by performing thermo-pressing of the layers of the stacked structure body and the print layer; and acquiring a plurality of substitute currencies for gaming having a predetermined shape by performing punching processing of the gaming substitute currency original plate using a mold and performing R processing of upper and lower angles of outer sides of the substitute currency for gaming using a mold at the time of performing the punching processing.

A method of manufacturing substitute currency for gaming according to another aspect of the present invention includes: forming a stacked structure body formed by a plurality of plastic layers by including a coloring layer at least in the middle and stacking a white layer or a thin-color layer on upper and lower sides of the coloring layer disposed in the middle; using a layer containing metal powder or a metal oxide used for increasing the weight inside the layer as at least one layer of the plurality of plastic layers; arranging a print layer in which a drawing pattern is printed on at least an upper face or a lower face of the stacked structure body; generating a gaming substitute currency original plate by heating and welding the layers by performing thermo-pressing of the layers of the stacked structure body and the print layer; and acquiring a plurality of substitute currencies for gaming having a predetermined shape by performing punching processing of the gaming substitute currency original plate using a mold.

In the method of manufacturing substitute currency for gaming described above, a side ID may be attached through inkjet printing.

In the method of manufacturing substitute currency for gaming described above, an RFID may be interposed between the layers of the stacked structure body, and the layers having the RFID interposed therebetween may be heated and welded when the layers are thermos-compressed, and a periphery of the RFID may be tightly fixed by the plastic layers.

In the method of manufacturing substitute currency for gaming described above, one or a plurality of face codes, security marks, optical variable devices (OVD) may be printed in the print layer.

A management system of a table game according to an aspect of the present invention includes: a card distributing device that determines and displays a result of winning/losing of each game in a game table; a camera device that images and records substitute currency for gaming placed on the game table by using a camera; a management control device that specifies and stores a position, types, and quantities of the substitute currency for gaming placed on the game table by a game participant by using a result of the imaging performed by the camera device in each game. The substitute currency for gaming is formed as a structure body including a coloring layer and a white layer or a thin-color layer at least in an outer appearance to form a stripe pattern on a side face in an axial direction and has a configuration enabling the type of the substitute currency for gaming to be specified using the coloring layer, and the management control device has a calculation function of calculating a balance of a casino side on the game table for each game by using the result of winning/losing acquired from the card distributing device and the result of the imaging of the position, the types, and the quantities of the substitute currency for gaming placed by a game participant.

In the management system of a table game described above, the management control device may have a function of determining the types and an amount of the substitute currency for gaming by using colors of coloring layers by measuring the numbers of the coloring layers or white layers or thin-color layers of the substitute currency for gaming placed by each game participant.

In the management system of a table game described above, while the management control device images the position, the types, and the quantities of the substitute currency for gaming placed by each game participant in each game, it is performed when the card distributing device detects drawing of a first card, before and after the drawing, or after recognition of a dealer's signal representing an end of betting in the management control device.

A management system of a table game according to another aspect of the present invention includes: a gaming substitute currency tray that is disposed on a game table and holds substitute currency for gaming for each type; a camera device that images the substitute currency for gaming placed in the gaming substitute currency tray by using a camera; and a management control device that specifies and stores types and quantities of substitute currency for gaming disposed on the gaming substitute currency tray by using a result of the imaging performed by the camera device. The substitute currency for gaming is formed as a structure body including a coloring layer and a white layer or a thin-color layer at least in an outer appearance to form a stripe pattern on a side face in an axial direction and has a configuration enabling the type of the substitute currency for gaming to be specified using the coloring layer, and the management control device is configured to be able to measure a total amount of the substitute currency for gaming disposed on the gaming substitute currency tray by using a result of the imaging of the types and the quantities of the substitute currency for gaming disposed on the gaming substitute currency tray.

In the management system of a table game described above, the management control device may have a function of determining the types and an amount of the substitute currency for gaming by using colors of coloring layers by measuring the numbers of the coloring layers or white layers or thin-color layers of substitute currency for gaming placed by each game participant.

In the management system of a table game described above, the management control device may be configured to be able to determine a difference of a real total amount of substitute currency for gaming after end of a game that is perceived in the gaming substitute currency tray of a dealer of the game table that does not correspond to an increased/decreased amount of substitute currency for gaming calculated based on an amount of substitute currency for gaming bet by all the players and a result of winning/losing of the game.

In the management system of a table game described above, the acquisition of the total amount of the substitute currency for gaming in the gaming substitute currency tray through the management device after a settlement at the time of end of a game may be performed at one of:

1) time when re-payment for winning substitute currency for gaming ends;
2) time when cards used in the game are collected and are disposed in a disposal area of the table;
3) time when a predetermined button accompanying a winning/losing result determining device is pressed; and
4) time when a marker representing winning/losing is returned to the original state.

In the management system of a table game described above, the camera device may also be able to image bills used for exchange of the substitute currency for gaming, and the management control device may be configured to specify types and quantities of substitute currency for gaming disposed on the gaming substitute currency tray to be decreased according to exchange of the substitute currency for gaming disposed on the gaming substitute currency tray and bills by using a result of the imaging of the bills and be able to perform a comparison/measurement with a real total amount of the substitute currency for gaming disposed on the gaming substitute currency tray.

In the management system of a table game described above, the management control device may determine through a comparison whether a total amount of substitute currency for gaming perceived in the gaming substitute currency tray of a dealer of a game table corresponds to an increase/decrease according to a paid amount of substitute currency for gaming corresponding to exchanged bills after the exchange of the bills and substitute currency for gaming is performed and an increase/decrease in substitute currency for gaming calculated based on an amount of substitute currency for gaming bet by all the players and a result of winning/losing of the game.

In the management system of a table game described above, the management control device may have an artificial intelligence-utilizing or deep-learning structure capable of acquiring information of types and quantities of substitute currency for gaming also in a state in which a part or one unit of the substitute currency for gaming is hidden due to a blind area of the camera when the types and the quantities of the substitute currency for gaming are measured and determined.

In the management system of a table game described above, a side ID may be attached to the white layers or the thin-color layers of the side face of the substitute currency for gaming at least at three or more positions spaced apart in a rotation direction, types and manufacturing information of substitute currency for gaming may be able to be specified by reading the side ID by using the ID reading device, and the specified information specified through measurement may have a configuration that can be collated and managed with a predetermined database.

In the management system of a table game described above, the side ID may be printed using at least one of or both ink that is visible for visible light and ink absorbing infrared rays, and the ID reading device may include one or a plurality of visible-light cameras or infrared-ray cameras corresponding to the ink used for printing the side ID or a camera capable of performing switching among a plurality of functions of a visible-light camera and an infrared-ray camera corresponding to the ink.

In the management system of a table game described above, the camera device imaging and recording substitute currency for gaming disposed on the game table may be configured to image the substitute currency for gaming by using one or a plurality of cameras having different heights arranged at predetermined positions.

According to a system of the present invention, fraud in collecting and repaying substitute currency for gaming according to a result of win/loose of a game can be detected.

In addition, according to a system of the present invention, even when a card is bent according to player's squeeze of the card that is frequently performed in a Baccarat game or the like, the rank and the suit of the card can be determined through an image analysis, and a total amount of substitute currency for gaming that is in a blind area or overlaps each other can be perceived together with the position. In addition, fraud at the time of exchange of bills and substitute currency for gaming can be detected as well.

DESCRIPTION OF EMBODIMENTS

Figure 1:
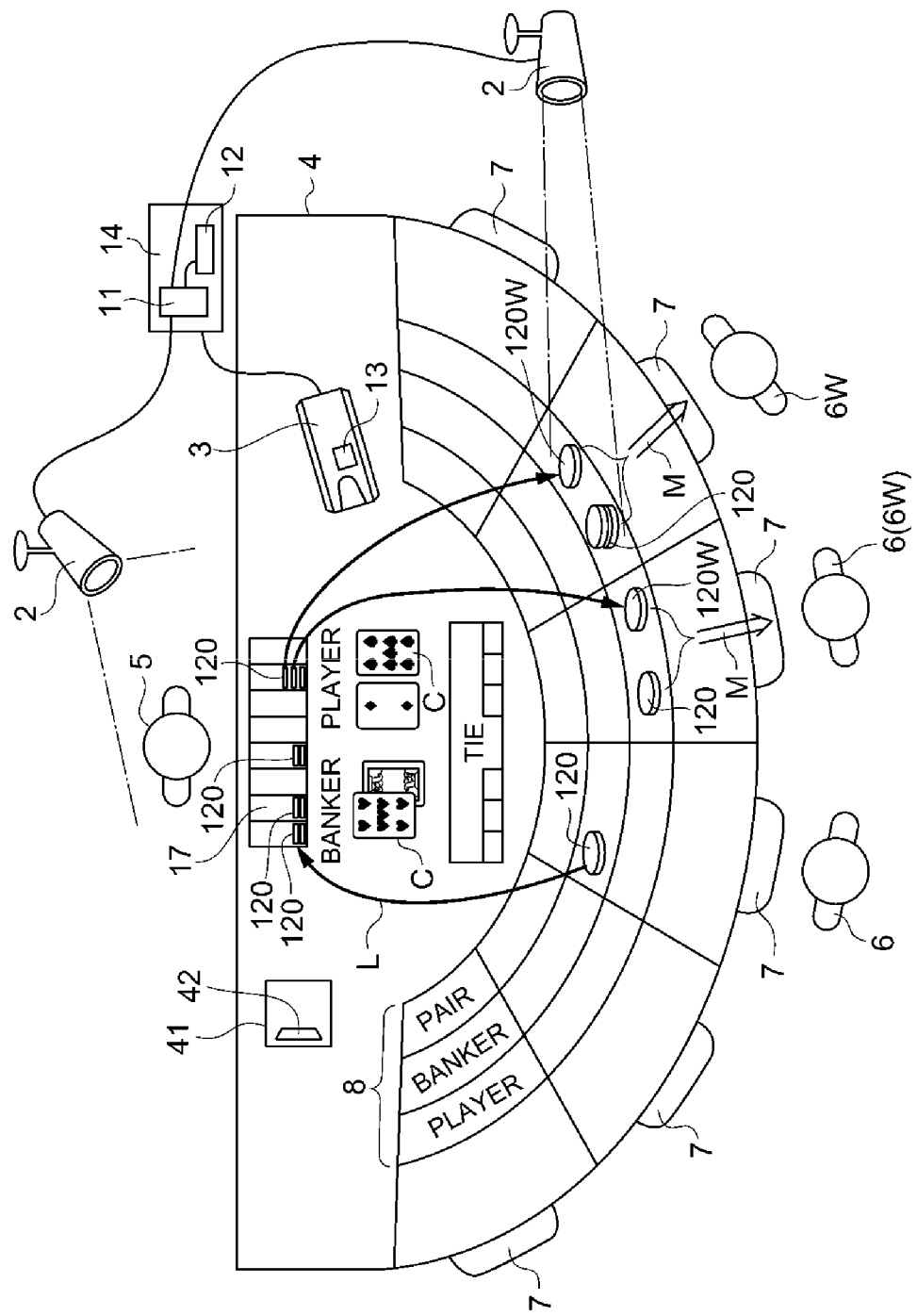
FIG. 1 is a diagram illustrating an overview of the whole fraud detecting system in a game house including a plurality of gaming tables according to a first embodiment of the present invention.

In game houses such as casinos, while substitute currency for gaming is piled to have a high volume and is placed on a game table, there is a problem in that a total amount cannot be correctly read by a reading device for IC tags disposed under the game table, and, when the sensitivity of the reading device is increased, substitute currency or gaming placed at a different position (winning/losing depends on the position) is added, and there is a problem in that a total amount of substitute currency for gaming at each position cannot be perceived. In addition, in imaging using a camera, there is a problem in that a blind area is generated according to the viewing angle of the camera, or substitute currency for gaming enters a shadow due to overlapping, and thus, there is a problem in that a total amount of substitute currency for gaming cannot be perceived.

In addition, according to player's squeeze (a behavior for seeing a card little by little by bending a card facing the back side while enjoying the rank of the card or the like) of a card, which is frequently performed in a Baccarat game, or the like, the card is bent, and there is a problem in that the rank and the suit of the card cannot be determined through an analysis of an image acquired from a camera.

Furthermore, fraud on a game table has been advanced, and there is a new problem in that fraud using an advanced betting method or the like that cannot be found in simple detection of a large winning amount on a game table or the like cannot be found by using a camera or tracking a winning amount. In addition, the prevention of fraud according to a conspiracy of a dealer and a player is not sufficient according to the conventional technology.

In order to solve the various problems described above, a fraud detecting system according to a first embodiment in a game house including a plurality of game tables is a fraud detecting system in a game house including a plurality of game tables and includes: a game recording device that records a state of progress of a game performed on each of the game table as a video including a dealer and a player through a camera; an image analyzing device that performs an image analysis of the recorded video of the state of progress of the game; a card distributing device that determines and displays a result of winning/losing of each game in the game table; and a control device that detects fraud performed in the game table by using a result of the image analysis performed by the image analyzing device and the result of winning/losing determined by the card distributing device.

In addition, in the fraud detecting system, the card distributing device has a structure capable of reading the rank of each distributed card, and the control device has a structure capable of determining match/mismatch by combining information of a rank acquired by the image analyzing device from a video of each card distributed in the game table and information of a rank of a card read by the card distributing device.

In addition, in the fraud detecting system, the image analyzing device or the control device has an artificial intelligence-utilizing or deep-learning structure capable of acquiring information of a rank of a card from a card that is distributed in the game table and is bent by the player or is contaminated.

Furthermore, in the fraud detecting system, the control device acquires the position, the kind, and the quantity of substitute currency for gaming that is bet by each player through the image analyzing device and determines whether or not collection of losing substitute currency for gaming that is bet by each player and repayment for the winning substitute currency for gaming are appropriately performed according to the result of winning/losing of the game by analyzing the video of the state of progress of the game through the image analyzing device.

In addition, in the fraud detecting system, the image analyzing device or the control device has an artificial intelligence-utilizing or deep-learning structure capable of acquiring information of the kind, the quantity, and the position of the bet substitute currency for gaming also in a state in which a plurality of substitute currency for gaming placed on a game table is in a state in which a part or the whole one is hidden according to a hidden area of the camera.

Furthermore, in the fraud detecting system, the control device has an artificial intelligence-utilizing or deep-learning structure capable of comparing/calculating whether or not the amount of substitute currency for gaming perceived in a dealer's tray for substitute currency for gaming in the game table is increased/decreased according to the collection of losing substitute currency for gaming that is bet by each player and a paid amount for winning substitute currency for gaming based on a result of winning/losing of the game after the game ends and a settlement.

In addition, in the fraud detecting system, the control device has an artificial intelligence-utilizing or deep-learning structure capable of acquiring the position and the amount of substitute currency for gaming that is bet at each play position of the game table and extracting an abnormal situation by comparing a winning/losing history and an acquired amount of substitute currency for gaming for each player that are acquired from a result of winning/losing of each game with statistical data of past game.

Furthermore, in the fraud detecting system, the control device has an artificial intelligence-utilizing or deep-learning structure capable of extracting an abnormal situation by comparing a state in which the amount of the bet substitute currency for gaming at the time of losing is smaller than the amount of the bet substitute currency for gaming at the time of losing at a play position of a game table with statistical data of past games.

In addition, in the fraud detecting system, the control device has a structure capable of specifying whether the abnormal situation is extracted through the image analyzing device or an individual player at a play position at which winning of a predetermined amount of more is acquired.

Furthermore, in the fraud detecting system, the control device has a warning function for giving a notification of the presence of a specific player at another game table when the specified player leaves the seat and arrives at the another game table.

In order to solve the various problems described above, according to the present invention, a fraud detecting system in a game house including a plurality of game tables includes: a game recording device that records a state of progress of a game performed on each of the game table as a video including a dealer and a player through a camera; a card distributing device that determines a result of winning/losing of each game in the game table; an image analyzing device that performs an image analysis of the recorded video of the state of processing of the game; and a control device that can detect bills and substitute currency for gaming in the game table by using a result of the image analysis performed by the image analyzing device, and the image analyzing device or the control device has an artificial intelligence-utilizing or deep-learning structure capable of detecting exchange of bills and substitute currency for gaming in the game table in a situation other than in the middle of dealing cards based on information acquired from the card distributing device or the dealer, recognizing a total amount of genuine bills verified using among the bills and capable of recognizing a total amount of substitute currency for gaming also in a state in which a plurality of substitute currency for gaming come out onto the game table as an exchange target is in a state in which a part or the whole one is hidden due to a blind area of the camera and comparing a total amount of bills come out from the player onto the game table and a total amount of substitute currency for gaming come out from the dealer with each other and determining whether or not the both quantities match.

In addition, in the fraud detecting system, the control device has an artificial intelligence-utilizing or deep-learning structure capable of comparing/calculating whether or not the amount of substitute currency for gaming perceived in a dealer's tray for substitute currency for gaming in the game table is increased/decreased according to a payed amount of substitute currency for gaming corresponding to exchanged bills after a settlement through exchange of bills and substitute currency for gaming.

Furthermore, in the fraud detecting system, the control device has an artificial intelligence-utilizing or deep-learning structure capable of comparing/calculating match/mismatch of an input amount of bills according to a dealer's input and a total amount of bills according to a result of the image analysis performed by the image analyzing device after the settlement through exchange of bills and substitute currency for gaming. In addition, the control device has an artificial intelligence-utilizing or deep-learning structure capable of comparing/calculating match/mismatch of a total input amount of bills according to a dealer's input in the game table for which the dealer is responsible and a total amount of bills according to a result of the image analysis performed by the image analyzing device.

According to a fraud detecting system according to this embodiment, also when a card is bent according to player's squeeze of the card that is frequently performed in a Baccarat game or the like, the rank and the suit of the card can be determined through an image analysis, and a total amount of substitute currency for gaming disposed in the blind area or overlapping substitute currency for gaming can be perceived together with the position. In addition, fraud at the time of exchange of bills and substitute currency for gaming can be detected as well.

Hereinafter, an overview of the whole fraud detecting system in a game house including a plurality of game tables according to a first embodiment of the present invention will be described in more detail.

FIG. 1 is a diagram illustrating an overview of the whole system, the fraud detecting system in a game house including a plurality of game tables 4 includes: a game recording device 11 that records the state of progress of a game performed in the game table 4 as a video including players 6 and a dealer 5 through a plurality of camera devices 2; an image analyzing device 12 that performs an image analysis of the recorded video of the state of process of the game; and a card distributing device 3 that determines and displays a result of winning/losing of each game in the game table 4. The card distributing device 3 is a so-called electronic shooter that has already been used by persons skilled in the art and has rules of a game programmed in advance and has a structure capable of determining winning/losing of a game by reading information of distributed cards C. For example, in a Baccarat game, winning of the baker, winning of a player, or tie (drawn) is determined basically based on the ranks of two to three cards, and a determination result (a result of winning/losing) is displayed in a result display lamp 13.

The fraud detecting system further includes a control device 14 that compares the rank of actual cards according to a result of the image analysis performed by the image analyzing device 12 and a result of winning/losing determined by the card distributing device 3 with each other and detects fraud (mismatch between a sum of ranks of distributed cards and a result of winning/losing) performed in the game table 4. The card distributing device 3 has a structure capable of reading Ranks (A, 2 to 10, J, Q, K) and suits (hearts, spades, or the like) of cards C that are manually distributed by the dealer 5, and the control device 14 has a structure capable of determining match/mismatch by collating information of a rank and suites acquired by the image analyzing device 12 (using artificial intelligence) from a video (captured by using the camera device 2) of cards distributed in the game table 4 and information of cards and suits read by the card distributing device 3 with each other. The image analyzing device 12 and the control device 14 of the fraud detecting system have a structure integrally including a computer formed as one body or by a plurality of configurations, a program, and a memory.

Figure 3:
FIG. 3 is an enlarged diagram of a mark illustrating contamination of a card perceived according to the first embodiment of the present invention.

The image analyzing device 12 and the control device 14 have an artificial intelligence-utilizing or deep-learning structure capable of acquiring information of ranks of cards also for cards C that are distributed in the game table 4 and are bent or contaminated by the player 6. For a contaminated card C, as illustrated in FIG. 3, there is a situation in which it is difficult to determine clubs or spades. Also in such a case, the suite can be determined by an artificial intelligence-utilizing computer or control system, an analysis and a determination of an image using a deep learning (structure) technology. In addition, also in a case where a card is bent according to a player's squeeze of a card, which is frequently performed in a Baccarat game or the like, by using self-learning of examples of many deformations of images or the like, a suit and a rank of a card before deformation can be recognized according to an artificial intelligence-utilizing computer or control system and a deep learning (structure) technology. The artificial intelligence-utilizing computer or control system and the deep learning (structure) technology are known as a person skilled in the art and can be used, and thus, detailed description thereof will not be presented.

Figure 2A:
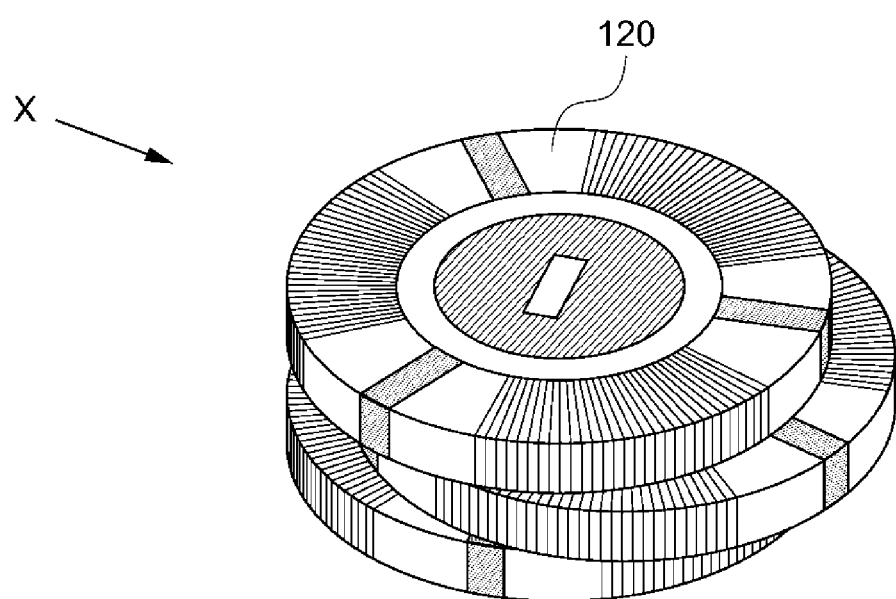
FIG. 2A is a perspective view of substitute currency for gaming illustrating an example of another overlapping state of substitute currency for gaming perceived according to the first embodiment of the present invention.
Figure 2B:
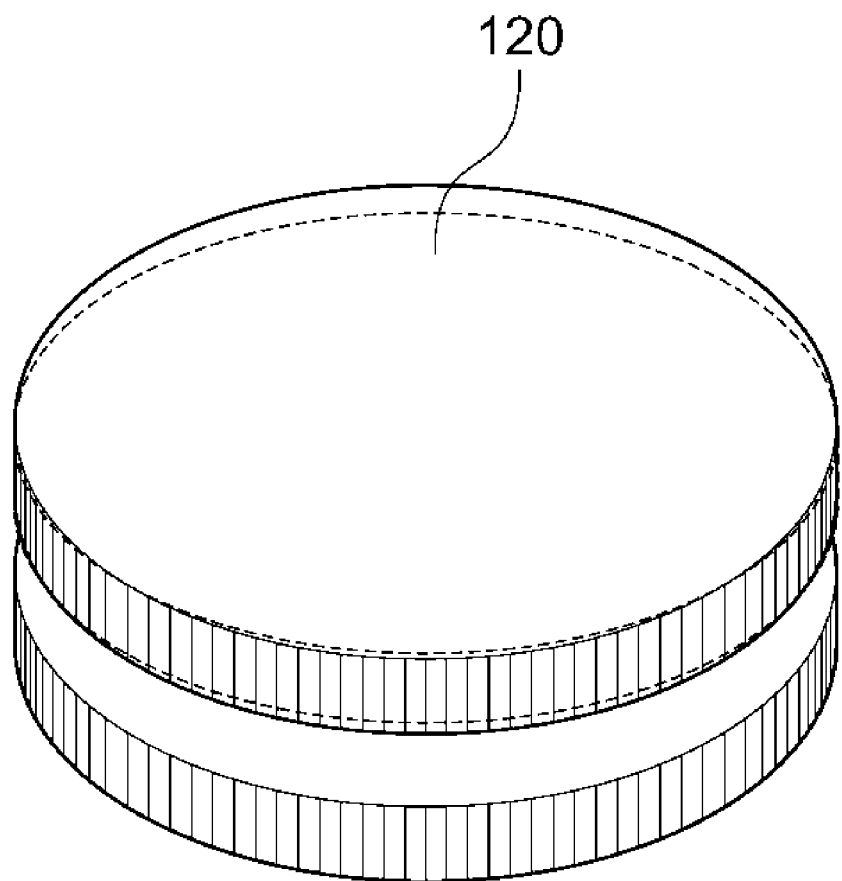
FIG. 2B is a perspective view of substitute currency for gaming illustrating an example of another overlapping state of substitute currency for gaming perceived according to the first embodiment of the present invention.

The control device 14 having an artificial intelligence-utilizing or deep learning structure can perceive a position (a player, a banker, or a pair) inside a bet area 8 on which each player 6 bets substitute currency 120 for gaming, the type (a value of a different amount is assigned to substitute currency 120 for gaming for each color) of the bet substitute currency 120 for gaming through the camera device 2 and the image analyzing device 12. Not only there is a case where the substitute currency 120 for gaming is vertically arranged to be superimposed but also there is a case where the substitute currency for gaming is superimposed with deviations as illustrated in FIG. 2A. In such a case, in a case where the camera device 2 is positioned in the direction of an arrow X illustrated in FIG. 2A (or the direction of the substitute currency 120 for gaming is relatively in a blind area), as illustrated in FIG. 2B, it is assumed that the substitute currency 120 for gaming is not visible (enters a blind area).

According to the artificial intelligence-utilizing computer or control system or the deep-learning technology, by using a self-learning function or the like, hidden substitute currency 120 for gaming due to a blind area or the like is recognized (there are case where a part of one unit of substitute currency for gaming is hidden or a case where the whole substitute currency for gaming is hidden), and the number of quantity and the like can be correctly perceived.

In this way, since a position (a player, a banker, or a pair) inside the bet area 8 on which the substitute currency 120 for gaming is bet and the type (a value of a different amount is assigned to substitute currency 120 for gaming for each color) and the quantity of the bet substitute currency 120 for gaming can be perceived, the control device 14 determines whether or not collection (denoted by an arrow L) of the losing substitute currency for gaming bet by each player 6 and payment (120W) for winning substitute currency for gaming to a player 6W who has won are properly performed according to a result of winning/losing of a game in accordance with a result of winning/losing of the game determined by the card distributing device 3 in each game by analyzing a video of the state of process of the game through the image analyzing device 12. In a case where a determination result acquired through an analysis using the image analyzing device 12 is different from a result (for example, a result of reading using an RFID) of reading using the other means, the intelligent-type control device 14 stores the analysis image and can verify the result later. As a result of the verification, in the case of an error in the intelligent-type control device 14, by using the analysis image as sample data of teacher leaning in the deep-learning technology, the accuracy of the intelligent-type control device 14 can be improved.

The control device 14 can analyze and acquire a total amount of the substitute currency 120 for gaming in the tray 17 for substitute currency for gaming for the dealer 5 in the game table 4 by using the image analyzing device 12 and can compare and calculate whether or not a total amount of the substitute currency 120 for gaming inside the tray 17 for the substitute currency 120 for gaming has been increased or decreased according to the amount of collection of the losing substitute currency 120 for gaming bet by each player 6 and the amount of the payment 120W for winning substitute currency for gaming to a player 6W who has won after the end of the game and the settlement based on a result of winning/losing of the game. A total amount of the substitute currency 120 for gaming in the tray 17 for substitute currency 120 for gaming may be constantly acquired using means such as an RFID, and the control device 14 determines whether or not the increased/decreased amount is correct by analyzing the video of the state of progress of the game through the image analyzing device 12.

For this, the artificial intelligence-type or deep-leaning structure is also used.

In this example, since fraud or a mistake is detected based on a result of winning/losing of a game, information of the type of bet substitute currency 120 for gaming, the position (a player, a banker, or a pair) inside the bet area 8 on which the substitute currency 120 for gaming is bet, and the quantity of the substitute currency 120 for gaming, and an increased/decreased amount of the substitute currency 120 for gaming in the tray 17 for substitute currency for gaming after the end of the collection of losing substitute currency for gaming and the repayment for the won substitute currency 120 for gaming without acquiring the movement of the substitute currency 120 for gaming after the end of the game, that is, whether the bet substitute currency 120 for gaming has been moved to the player side or the dealer side.

For example, in the case of Baccarat, a result of winning/losing of a game can be determined based on rules of Baccarat by reading ranks of cards C delivered in that game by the card distributing device 3. In addition, a result of winning/losing of a game can be determined also by imaging an area on the game table 4 by using the camera device 2, analyzing the image using the image analyzing device 12, and collating a result of the analysis with the rules of the game by using the control device 14. In such a case, a winning/losing result determining device is configured by the camera device 2, the image analyzing device 12, and the control device 14. The information of a player of each play position 7, the type of bet substitute currency 120 for gaming, the position (a player, a banker, or a pair) inside the bet area 8 on which the substitute currency 120 for gaming is bet, and the quantity of the substitute currency 120 for gaming is acquired by imaging the substitute currency 120 for gaming placed on the bet area 8 by using the camera device 2 and analyzing the image for each play position 7 by using the image analyzing device 12.

In addition, an increased/decreased amount of substitute currency 120 for gaming in the tray 17 for substitute currency for gaming before and after the collection of losing substitute currency 120 for gaming and the repayment for winning substitute currency 120 for gaming can be calculated by comparing a total amount of the substitute currency 120 for gaming disposed inside the tray 17 for substitute currency for gaming before the collection of losing substitute currency 120 for gaming and the repayment for won substitute currency 120 for gaming with a total amount of the substitute currency 120 for gaming disposed inside the tray 17 for substitute currency for gaming after the collection of losing substitute currency 120 for gaming and the repayment for won substitute currency 120 for gaming.

The total amount of the substitute currency 120 for gaming disposed inside the tray 17 for substitute currency for gaming before the collection of losing substitute currency 120 for gaming and the repayment for won substitute currency 120 for gaming and the total amount of the substitute currency 120 for gaming disposed inside the tray 17 for substitute currency for gaming after the collection of losing substitute currency 120 for gaming and the repayment for won substitute currency 120 for gaming can be detected by imaging the tray 17 for substitute currency for gaming housing the substitute currency 120 for gaming using the camera device 2 and analyzing the image using the image analyzing device 12. In addition, by embedding an RFID representing the amount inside substitute currency 120 for gaming and arranging an RFID reader in the tray 17 for substitute currency for gaming, a total amount of the substitute currency 120 for gaming housed in the tray 17 for substitute currency for gaming may be configured to be detected.

For example, it is assumed that the total amount of the substitute currency 120 for gaming disposed on the tray 17 for substitute currency for gaming before the start of a game is Bb, and the total amount of the substitute currency 120 for gaming disposed on the tray 17 for substitute currency for gaming after the game ends, and the collection of losing substitute currency 120 for gaming and the re-payment for winning substitute currency 120 for gaming is Ba. In addition, in this game, a total amount of all the play positions 7 of substitute currency 120 for gaming that is bet on the player area is bp, a total amount of all the play positions 7 of substitute currency 120 for gaming that is bet on the banker area is bb, and a total amount of all the play positions 7 of substitute currency 120 for gaming that is bet on a tie area is bt. For example, in a case where a result of winning/losing of a game is the winning of the banker, Ba−Bb=bp−bb+bt needs to be satisfied. Alternatively, the total amount Ba of the substitute currency 120 for gaming of the tray 17 for substitute currency for gaming after the end of the game needs to be (Bb+bp−bb+bt). Otherwise, it can be determined that there is fraud or a mistake in the collection or repayment of the substitute currency for gaming.

Figure 13A:
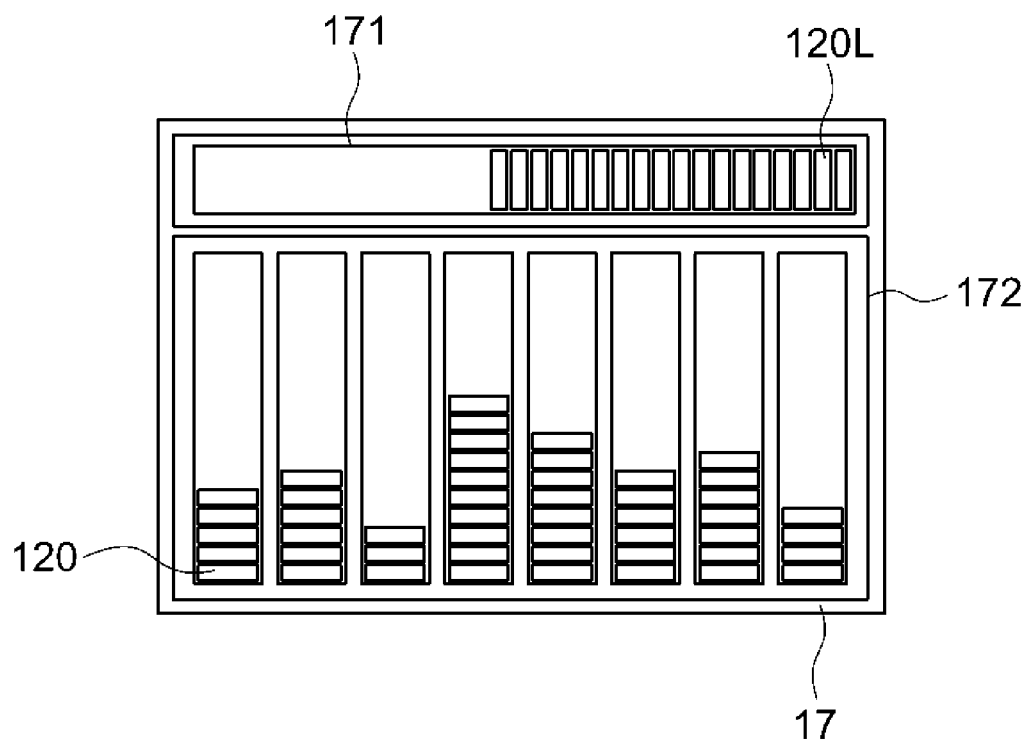
FIG. 13A is a diagram illustrating details of a tray for substitute currency for gaming according to the first embodiment of the present invention.
Figure 13B:
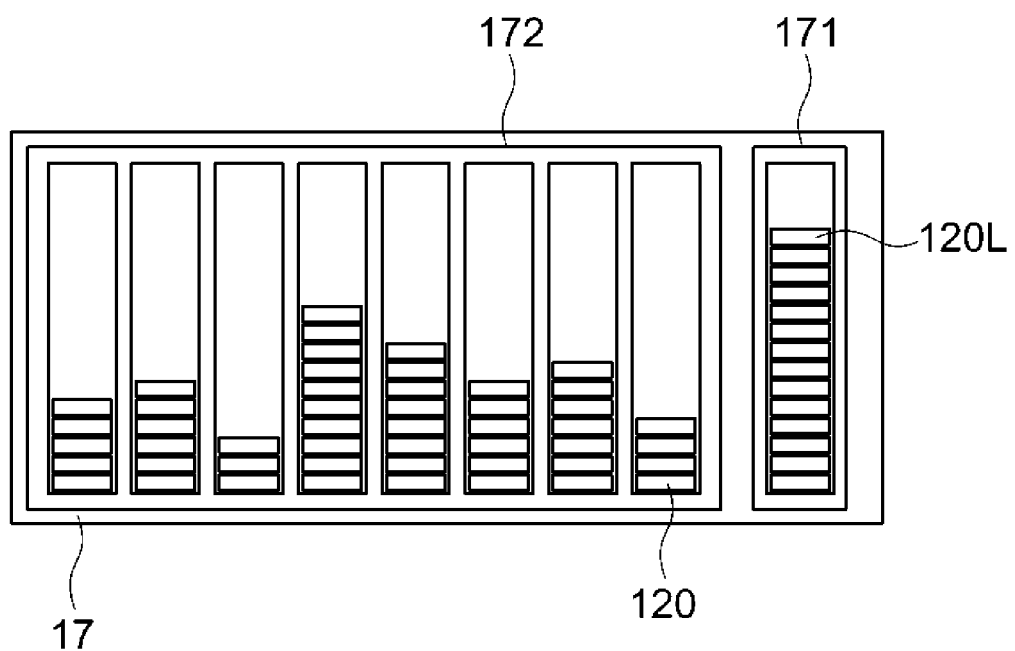
FIG. 13B is a diagram illustrating another example of a tray for substitute currency for gaming according to the first embodiment of the present invention.

FIG. 13A is a diagram illustrating details of a tray for substitute currency for gaming according to this embodiment, and FIG. 13B is a diagram illustrating another example of a tray for substitute currency for gaming. In the tray 17 for substitute currency for gaming, a collection tray 171 for substitute currency for gaming that is used for collecting and temporarily storing substitute currency 120L for gaming that is bet by a losing player 6L and a repayment tray 172 for substitute currency 120W for gaming that is used for storing substitute currency 120L for gaming to be re-payed are arranged. The image analyzing device 12 and the control device 14 acquire the position, the type, and the quantity of substitute currency 120L for gaming that is bet by the losing player 6L and calculates an increased amount (an amount of substitute currency 120 for gaming to be present in the collection tray 171 for substitute currency for gaming) of substitute currency OL for gaming in the game. In addition, the image analyzing device 12 and the control device 14 acquires a real total amount of substitute currency 120 for gaming in the tray 171 for substitute currency for gaming after the collection and compare a total amount with the real total amount to determine whether or not there is a difference therebetween.

In addition, for the repayment of substitute currency 120W for gaming for a winning player 6W, by using substitute currency 120 for gaming that is present in the repayment tray 172 for substitute currency for gaming, a sufficient time can be secured for the image analyzing device 12 and the control device 14 to acquire a real total amount of substitute currency 120 for gaming in the collection tray 171 for substitute currency for gaming after collection.

As illustrated in FIG. 1, the game table 4 includes a disposal area 41 and/or a disposal slot 42 used for disposing cards C used in a game. When a game ends, the cards C used in the game are collected and are put into the disposal area 41 or the disposal slot 42 on the game table 4.

The game table 4 further includes a marker 43 representing winning/losing of a game.

Figure 4A:
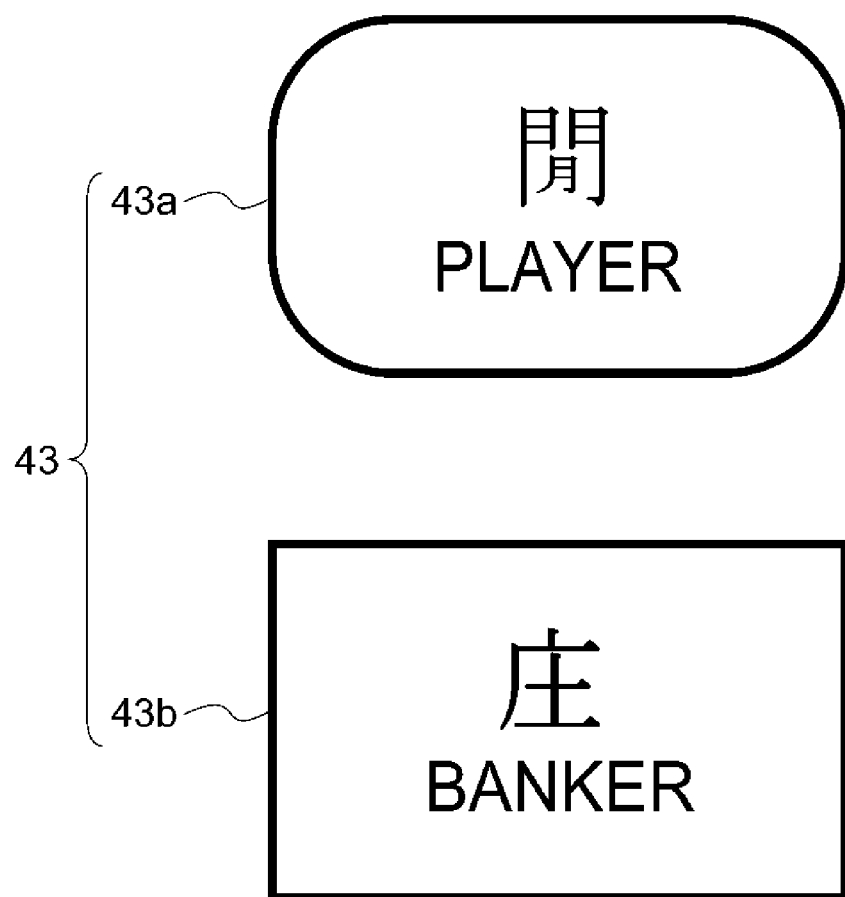
FIG. 4A is a plan view illustrating the front side of a marker.
Figure 4B:
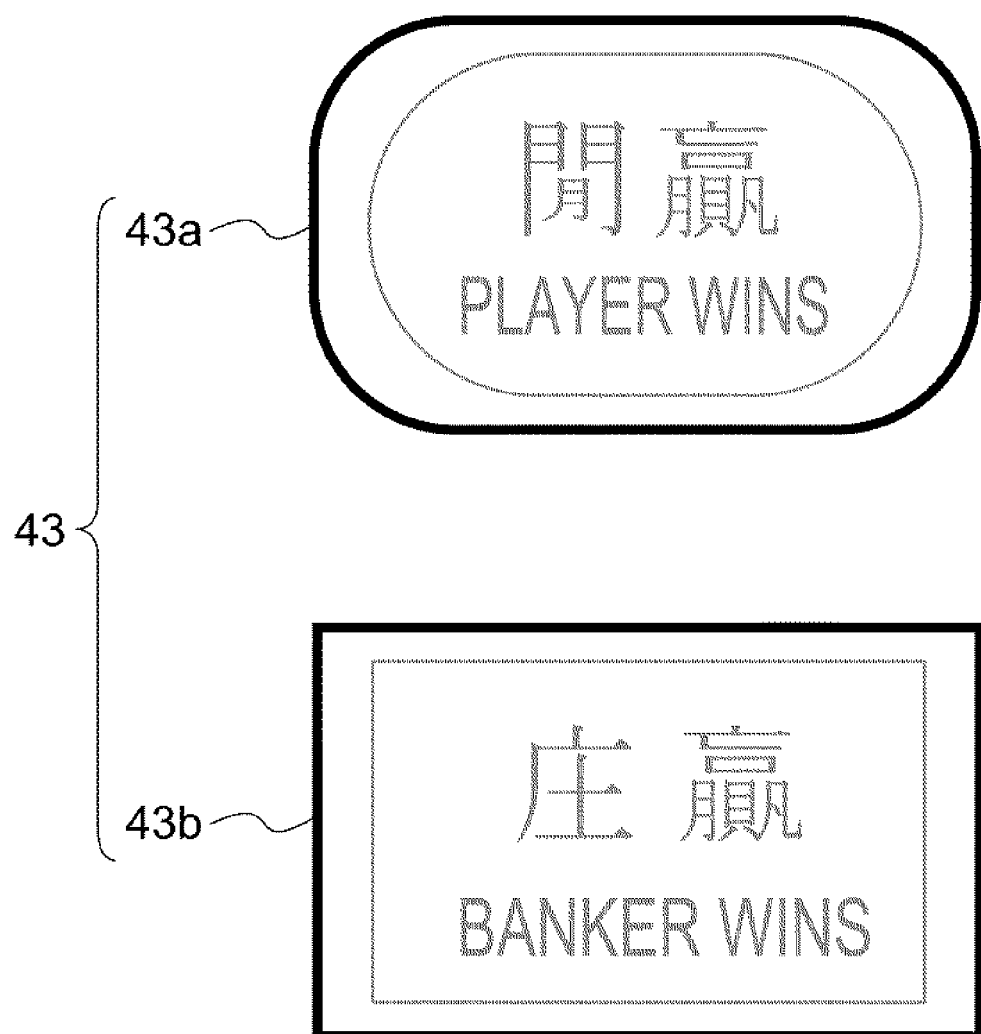
FIG. 4B is a plan view illustrating the back side of a marker.

FIG. 4A is a plan view illustrating the front side of a marker, and FIG. 4B is a plan view illustrating the back side of a marker. In a Baccarat game, two types of a marker 43a representing the winning of the player and a marker 43b representing the winning of the banker are used, and, when a result of a game comes out, the dealer 5 overturns the marker of the winning side out of the player or the banker. In this way, winning/losing of a game is represented on the table to be easily understood. The overturned marker is returned to the original state by the dealer 5 after the collection and the repayment of substitute currency 120 for gaming. By returning the marker to the original state, it also represents a state in which a next game can be started.

As above, in this embodiment, the control device 14 calculates the amount of bet substitute currency for gaming on the game table 4 and a balance of substitute currency for gaming from a result of winning/losing of a game for each game and verifies an increased amount of the balance of substitute currency for gaming inside the tray 17 for substitute currency for gaming after the game. When a difference is detected in this verification, the control device 14 generates an alarm or adds recording of an indication thereof in the recording of a video captured by the camera device 2. A casino operator can peruse the reason for the difference by checking the video.

The fraud detecting system according to this embodiment adds/subtracts an increased/decreased amount of substitute currency for gaming in a game calculated based on the positions, the types, and the quantities of substitute currency 120 for gaming that is bet by all the players 6 in the game and a result of winning/losing of the game acquired by the winning/losing result determining device to/from a total amount of substitute currency 120 for gaming in the tray 17 for substitute currency for gaming before a settlement of each game, compares a total amount of substitute currency 120 for gaming to be present in the tray 17 for substitute currency for gaming after the settlement at the time of the end of the game with a real total amount of substitute currency 120 for gaming in the tray 17 for substitute currency for gaming at the time of end of the game that is acquired through the image analyzing device 12, and determines whether or not there is a difference between a total amount and a real total amount.

The control device 14 acquires the position, the type, and the quantity of substitute currency for gaming that is bet by each player through the image analyzing device 12, acquires a real total amount of substitute currency for gaming placed in the tray for substitute currency for gaming when all the collections of losing substitute currency for gaming bet by each player end, compares a total amount of substitute currency 120 for gaming to be present in the tray 17 for substitute currency for gaming, which is acquired by adding an increased amount in the tray 17 for substitute currency for gaming in the game based on the positions, the types, and the quantities of substitute currency for gaming bet by losing players to a total amount of substitute currency for gaming placed in the tray for substitute currency for gaming before a settlement of each game, with a real total amount of substitute currency 120 for gaming placed in the tray 17 for substitute currency for gaming, and determines whether or not there is a difference between the total amount and the real total amount.

In a case where the control device 14 compares a total amount of substitute currency 120 for gaming to be present in the tray 17 for substitute currency for gaming, which is acquired by adding an increased amount in the tray 17 for substitute currency for gaming in the game based on the positions, the types, and the quantities of substitute currency 120 for gaming bet by losing players to a total amount of substitute currency 120 for gaming placed in the tray 17 for substitute currency for gaming before a settlement of each game, with a real total amount of the substitute currency 120 for gaming placed in the tray 17 for substitute currency for gaming, and determines that there is no difference between the total amount and the real total amount, and compares a total amount to be present in the tray 17 for substitute currency for gaming after the settlement at the time of end of the game with a real total amount of substitute currency 120 for gaming placed in the tray 17 for substitute currency for gaming at the time of end of the game acquired through the image analyzing device 12, and determines that there is a difference between the total amount and the real total amount, the control device 14 determines a mistake in the payment and generates a payment error signal used for giving a notification of the mistake in the payment.

In the tray 17 for substitute currency for gaming, the collection tray 171 for substitute currency for gaming that collects and temporarily stores substitute currency 120 for gaming bet by losing players is arranged, and the image analyzing device 12 compares a total amount of substitute currency 120 for gaming to be present in the collection tray 171 for substitute currency for gaming, which is acquired by adding an increased amount of substitute currency 120 for gaming in the game that is calculated based on the positions, the types, and the quantities of the substitute currency 120L for gaming bet by losing players, with a real total amount of the substitute currency 120 for gaming placed in the tray 171 for substitute currency for gaming, and determines whether or not there is a difference between the total amount and the real total amount.

When the control device 14 determines a difference in the real total amount of the substitute currency 120 for gaming acquired from the tray 17 for substitute currency for gaming for the dealer 5 of the game table 4 not corresponding to the increased/decreased amount of the substitute currency for gaming calculated based on the amount of substitute currency for gaming bet by all the players and a result of winning/losing of the game, the game recording device 11 assigns an index or time to the acquired video or can be reproduced with a collection scene or a payment scene of the substitute currency 120 for gaming specified such that the recording of the game in which the difference occurs can be analyzed by the game recording device 11.

In this way, the control device 14 acquires a total amount of substitute currency for gaming (chips) placed in the tray 17 for substitute currency for gaming after a settlement at the time of end of a game through the image analyzing device 12. In this case, the determination of "after the settlement" is when one of 1) to 4) described below occurs:

1) when repayment for won substitute currency 120 for gaming (won chips) ends 2) when cards C used in the game are collected and are disposed in the disposal area or the disposal slot of the table 3) when a predetermined button accompanying the winning/losing result determining device is pressed 4) when the marker 43 representing winning/losing is returned to the original state In the management system of the table game, the management control device images the positions, the types, and the quantities of substitute currency for gaming that is placed by game participants in each game when any one of 1) to 3) described below is detected:

1) when the card distributing device detects that a first card is drawn 2) before and after drawing 3) after the management control device recognizes a dealer's bet end sign In addition, the control device 14 has an artificial intelligence-utilizing or deep-learning structure capable of acquiring the position (a position for betting on the player, the banker, or the fair) and the amount (the types and quantities) of bet substitute currency for gaming at each player position 7 of the game table 4, comparing a winning/losing history of each player 6 and the amount (won amount) of acquired substitute currency for gaming that can be acquired based on the result of winning/losing of each game with statistical data of many (big data) games in the past, and extracting an abnormal situation (set in the casino).

Typically, the control device 14 is included which has an artificial intelligence-utilizing or deep-learning structure capable of extracting an occurrence of a won amount of a certain amount (one million dollars) or more and an abnormal situation in which, in a play position 7 of a specific game table 4, a state in which the amount of bet substitute currency for gaming is small at the time of losing a game, and the amount of bet substitute currency for gaming is large at the time of winning a game is continued for several games and is determined as an abnormal situation based on a comparison with statistical data (big data or the like) of games in the past.

In addition, the control device 14 (integrated with the image analyzing device 12) of the fraud detecting system has a structure capable of extracting an abnormal situation or specifying an individual player 6 at the play position 7 at which winning of a predetermined amount of more is acquired. In such specifying of a player 6, the image of each face is specified with a profit and an identify number (an ID or the like) assigned thereto in the image analyzing device 12. Then, the control device 14 has a warning function for giving a notification of the presence of a specific player in another game table when the specified player 6 leaves a seat and arrives at the another game table. More specifically, a notice is given to a pit manager managing each game table 4 or each table staff (or a dealer), wherein further prevention of an abnormal phenomenon is achieved.

The control device 14 includes a database recording a history of exchange of bills K and substitute currency 120 for gaming, refers to the database at the interval of a predetermined time or in units of one day and determines through a comparison whether or not the amount of substitute currency 120 for gaming acquired in the tray 17 for substitute currency for gaming for the dealer 5 of the game table 4 has been increased or decreased according to a payed amount of substitute currency 120 for gaming corresponding to exchanged bills K or a total amount of payment of bills K corresponding to exchanged substitute currency 120 for gaming.

In addition, a winning/losing history of each play position 7 and the amount (won amount) of acquired substitute currency for gaming may be monitored without specifying an individual player 6.

In such a case, while, in a case where each player 6 leaves the seat, the player 6 cannot be tracked, an abnormal situation such as a case where, a state in which the amount of bet substitute currency for gaming is small at the time of losing a game at a specific play position 7 of one game table 4, and the amount of bet substitute currency for gaming at the time of winning a game is large is continued for several games or the like can be detected. Then, in a case where such a play position 7 is detected, there is a suspicion that there is fraud or a mistake at the play position 7. Then, by verifying a video in which the play position 7 is imaged, a fraud or a mistake can be found.

More specifically, the camera device 2 is mounted to image at least substitute currency 120 for gaming placed in the bet area 8 of the game table 4. The image analyzing device 12 analyzes images captured by the camera device 2 and detects a position among the positions of the player, the banker, and the tie of the bet area 8 at which substitute currency for gaming is placed for each user position 7 and the amount of the placed substitute currency for gaming. In addition, the card distributing device 3 also functions as a winning/losing result determining device and determines a result of winning/losing of a game. The control device 14, based on the position (the player, the banker, or the tie) inside the bet area 8 at which the substitute currency 120 for gaming is placed and the result of winning/losing of the game, records monitors) a winning/losing history for each play position 7 and the amount (an acquired amount of the substitute currency for gaming) of the substitute currency for gaming that has been acquired. Here, any one of the winning/losing history and the acquired amount of the substitute currency for gaming may be recorded. In a case where the winning/losing history/or the acquired amount of the substitute currency for gaming is in an abnormal situation (set in the casino) when compared with the statistical data of many (big data) games in the past, the control device 14 specifies this player position 7 as a play position at which a suspicion of fraud is present.

In a case where there is a suspicion of fraud for a specific player position 7, the fraud detecting system may be configured to generate an alarm (light, a sound, or a vibration) such that at least the dealer gets near at the time point. In this way, a game thereafter is stopped at least at the place or the like, and the continuation of fraud can be blocked. In addition, information representing a suspicion of fraud may be added to a video that is captured and recorded by the camera device 2. Accordingly, by checking the video, the cause of the suspicion of fraud can be investigated.

The fraud detecting system in a game house including a game table according to this embodiment further has a function of performing an inspection at the time of exchange of bills and substitute currency for gaming that is frequently performed in the game table 4. In a game house such as a casino, before a game, a player 6 exchanges bills (cash or the like) and substitute currency for gaming at a predetermined substitute currency for gaming clearing house. However, when all the substitute currency for gaming is used, the player 6 can continue the game by exchanging cash (bills) with substitute currency 120 for gaming on the game table (a Baccarat table or the like) without leaving the seat from the game table 4. However, here, there is a chance for fraud between the dealer 5 and the player. The exchange of cash (bills) for substitute currency 120 for gaming on a game table (for example, a Baccarat table or the like) needs to be performed when a game does not advance. In order to determine winning/losing of a game, the card distributing device 3 can detect the start of dealing of cards and the end of dealing (a time period for determining winning/losing). For this reason, the card distributing device 3 detects a situation other than the distribution (dealing) of cards, and the control device 14 detects exchange of bills and substitute currency 120 for gaming on the game table 4 in a situation other than the dealing of cards (illustrated in FIG. 5).

Being in the middle of the dealing (or any other situation) of cards can be detected based on information acquired from the operation of the card distributing device 3 or the dealer 5.

Figure 5:
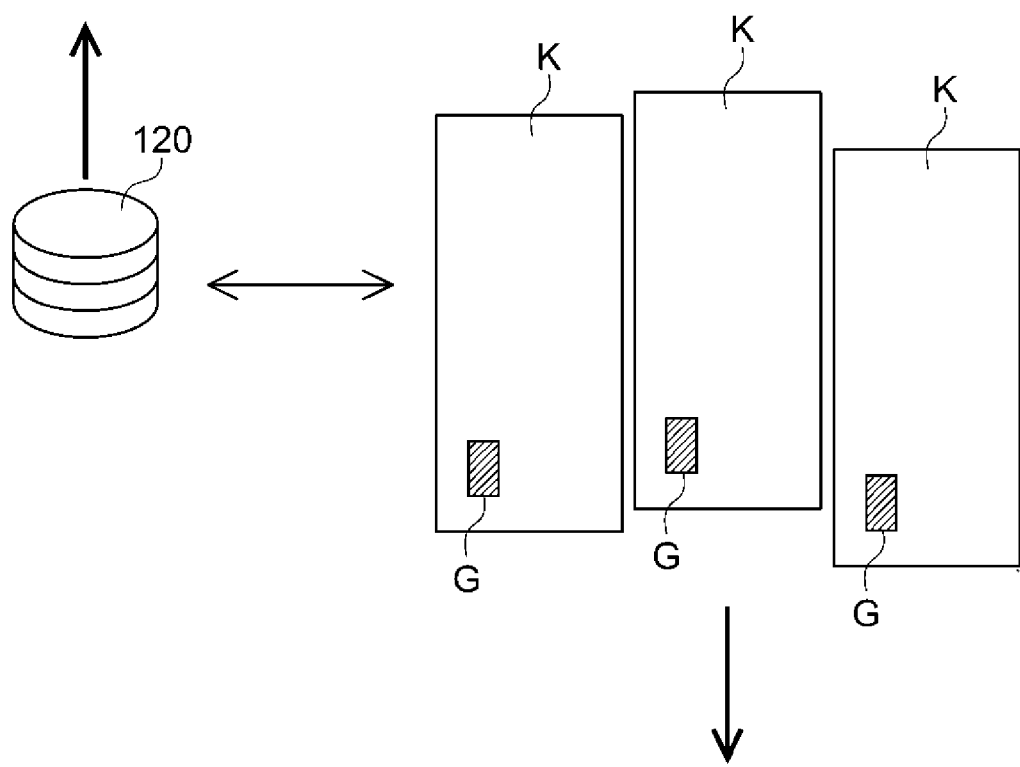
FIG. 5 is an explanatory diagram simplifying a video of the state of exchange of bills and substitute currency for gaming perceived according to the first embodiment of the present invention.

The control device 14 can recognize the quantity and the amount of bills by performing an image analysis of the surfaces of the bills K. In addition, in the game table 4, it is determined whether or not bills K to be exchanged for substitute currency 120 for gaming are genuine by detecting genuine marks G of the bills by emitting black light. As illustrated in FIG. 5, the control device 14 has an artificial intelligence-utilizing or deep-learning structure verifying the genuine marks G through an image analysis, recognizing a total amount of genuine bills, being capable of recognizing a total amount of substitute currency for gaming even in a state in which a plurality of substitute currency for gaming come out onto the game table as an exchange target is hidden due to a blind area of the camera device 2, comparing a total amount of the bills K come out onto the game table 4 from a player with a total amount of the substitute currency 120 for gaming come out from the dealer 5, and being capable of determining whether or not both the amounts match each other.

The control device 14 has an artificial intelligence-utilizing or deep-leaning structure capable of determining whether or not a total amount of substitute currency 120 for gaming placed in the tray 17 for substitute currency for gaming for the dealer 5 of the game table 4 has been increased/decreased according to a paid amount of substitute currency for gaming corresponding to the exchanged bills after a settlement through exchange of the bills and the substitute currency for gaming. A case may be considered as well in which the total amount of the substitute currency 120 for gaming placed in the tray 17 for substitute currency for gaming for the dealer 5 is constantly acquired in advance by using RFIDs of substitute currency 120 for gaming or the like. In addition, the total amount of the substitute currency 120 for gaming housed in the tray 17 for substitute currency for gaming can be detected by imaging the tray 17 for substitute currency for gaming housing the substitute currency 120 for gaming by using the camera device 2 and analyzing the image using the image analyzing device 12.

In addition, the control device 14 detects whether an increase/decrease in the amount of the substitute currency 120 for gaming present inside the tray 17 for substitute currency for gaming before and after the exchange of bills and the substitute currency for gaming matches an exchange amount of the substitute currency for gaming as a result of an image analysis on the game table 4. The amount of paid bills may be input by the dealer 5 to the control device 14 through key input or the like or may be specified by imaging an area disposed on the game table 4 in which bills are paid by using the camera device 2 and analyzing the image using the image analyzing device 12.

As described above, the control device 14 determines whether or not a decreased amount of the substitute currency 120 for gaming from the tray 17 for substitute currency for gaming according to the exchange of bills and the substitute currency for gaming matches the amount paid to the dealer 5 from players 6. In addition, the control device 14 is an intelligence-type control device capable of determining match/mismatch of an input amount (commonly, according to key input or the like) of bills input by the dealer 5 and a calculated amount of bills that is a result of an image analysis performed by the image analyzing device 12 after the settlement through the exchange of the bills and the substitute currency for gaming through a comparison and calculation and may have an artificial intelligence-utilizing or deep-learning structure.

Furthermore, the control device 14 has an artificial intelligence-utilizing or deep-learning structure capable of determining match/mismatch of a total amount of bills according to the input of a dealer in the game table 4 for which the dealer is responsible and a total amount of bills according to a result of an image analysis using the image analyzing device 12 through a comparison and calculation.

The control device 14 determines whether or not the amount of substitute currency 120 for gaming perceived in the tray 17 for substitute currency for gaming for the dealer 5 of the game table 4 has increased/decreased according to a paid amount of substitute currency 120 for gaming corresponding to exchanged bills after the exchange of the bills and the substitute currency 120 for gaming or a paid amount of bills corresponding to the exchanged substitute currency 120 for gaming through a comparison.

The control device 14 is a control device having an artificial intelligence-utilizing or deep-learning structure capable of acquiring information of the types and the quantities of the substitute currency 120 for gaming even in a state in which a part of or the whole one unit of substitute currency for gaming is hidden when the types and the quantities of the substitute currency 120 for gaming are determined.

A management system according to a second embodiment relates to a management system of table games in a game house.

In a game house such as a casino, there are various attempts preventing dealer's mistakes in handling substitute currency for gaming (substitute currency for gaming). A game house includes monitoring cameras used for monitoring dealer's mistakes in handling substitute currency for gaming, and such mistakes are prevented using a determination of mistakes and fraud according to collection and repayment of substitute currency for gaming that are different from a result of winning/losing based on images acquired using the monitoring cameras and the like.

Meanwhile, in order to acquire the quantity and a total amount of substitute currency for gaming, it has been proposed to acquire the amount of the substitute currency for gaming by attaching an IC tag to each substitute currency for gaming.

In a card game monitoring system disclosed in PCT Application Publication No. PCT/JP2015/000171, it is determined whether or not substitute currency for gaming place on a game table is collected or re-payed according to a result of winning/losing by performing an image analysis of movement of the substitute currency for gaming, and monitoring of dealer's mistakes in handling the substitute currency for gaming is performed.

Figure 7:
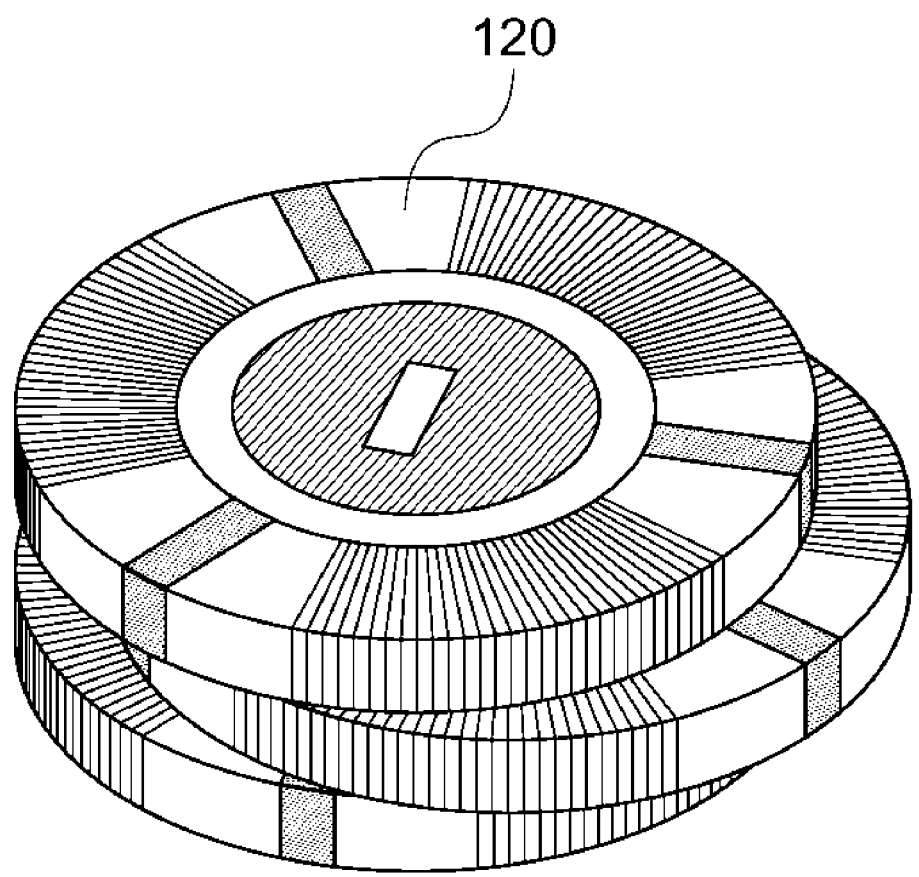
FIG. 7 is a perspective view of conventional substitute currency for gaming.

In game houses such as casinos, while substitute currency for gaming is piled to have a high volume and is placed on a game table, there is a problem in that a total amount cannot be correctly read by a reading device for IC tags disposed under the game table, and, when the sensitivity of the reading device is increased, substitute currency or gaming placed at a different position (winning/losing depends on the position) is added, and there is a problem in that a total amount of substitute currency for gaming at each position cannot be perceived. In addition, conventionally, as illustrated in FIG. 7, the pattern of substitute currency for gaming (substitute currency for gaming) 9 is complicated, and, when a plurality of substitute currency for gaming are piled, there is a problem in that the quantity of such a pile cannot be accurately acquired using a camera.

Furthermore, fraud on a game table has been advanced, and there is a new problem in that fraud using an advanced betting method or the like that cannot be found in simple detection of a large winning amount on a game table or the like cannot be found by using a camera.

In addition, it is necessary for a dealer to collect or re-paid substitute currency for gaming placed on a game table according to a result of winning/losing. In a case this is to be determined by performing an image analysis of the substitute currency for gaming, since the pattern of the substitute currency for gaming (substitute currency for gaming) is complicated, there is a problem in that it cannot be determined whether or not a dealer correctly performs re-payment when substitute currency for gaming corresponding to the bet substitute currency for gaming is re-payed by using a currently-existing practical image analyzing technology, and the prevention of mistakes is not sufficient.

In order to solve the various problems described above, a management system of table games according to this embodiment includes: a card distributing device that determines and displays a result of winning/losing of each game in a game table; a measurement device that measures the types and the quantities of substitute currency for gaming place on the game table by using a camera; and a management control device that specifies and stores the position, the types, and the quantity of substitute currency for gaming placed on the game table by a game participant by using a result of the measurement performed by the measurement device in each game. The substitute currency for gaming has a configuration in which a plurality of plastic layers of different colors are stacked, at least a coloring layer is included in the middle, and a stripe pattern in a stacking direction is formed on a side face by employing a multi-layer structure in which white layers or thin-color layers are stacked on both sides of the coloring layer disposed in the middle, and the type of the substitute currency for gaming can be specified by using the coloring layer. The management control device has calculation functions of determining a winner and a loser among participants in each game by using a result of winning/losing acquired from the card distributing device and a result of the measurement of the position, the types, and the quantities of the substitute currency for gaming placed by each game participant and calculating the balance of the casino side in the game table for each game.

In addition, in the management system, the management control device has a structure including a function of determining the quantity of the substitute currency for gaming by measuring the number of coloring layers, the white layers, or the thin-color layers of the substitute currency for gaming placed by each game participant.

In order to solve the various problems, substitute currency for gaming according to this embodiment has a configuration in which a plurality of plastic layers of different colors are stacked, at least a coloring layer is included in the middle, and a stripe pattern in a stacking direction is formed on a side face by stacking white layers or thin-color layers on both sides of the coloring layer, and the type of the substitute currency for gaming can be specified by using the coloring layer.

In addition, in the substitute currency for gaming, on the surface of the white layer or the thin-color layer, a print representing the type of the substitute currency for gaming is formed, transparent layers are disposed in outermost layers, and each interlayer is thermos-compressed to form a structure of at least five layers.

In addition, in the substitute currency for gaming, marks using UV ink or ink (carbon black ink) absorbing infrared rays are arranged on the surfaces of the white-color layers or the thin-color layers, or embossing processing is performed for the transparent layer of the outermost layer, or R processing is performed for the ends of the transparent layers of the outermost layers, or the coloring layer is formed by a plurality of layers, and RFIDs may be built in the coloring layers.

In order to solve the various problems described above, an inspection device inspecting substitute currency for gaming according to this embodiment includes: a passage including an inlet and an output through which the substitute currency for gaming can pass in a radial direction; a gaming substitute currency type determining device that determines a color of the stripe in the staking direction of the side face by imaging the side face of the substitute currency for gaming passing through the passage; a mark reading device that reads a mark, which is formed using the UV ink or the ink (carbon black ink) absorbing infrared rays, arranged on the surface of the passing substitute currency for gaming; a print inspecting device that reads a print representing the type arranged on the surface of the substitute currency for gaming in a vertical direction with respect to the passage; and a control device of the whole device. The control device is configured to inspect whether or not the type of the substitute currency for gaming determined by the gaming substitute currency type determining device matches a content of the print representing the type acquired by the print inspecting device.

According to the system of this embodiment, even in a case where many substitute currencies for gaming (substitute currency for gaming) are piled up, the quantity of the substitute currencies for gaming can be determined, and a total amount of relatively overlapping substitute currency for gaming can be acquired based on the position and the color.

Figure 6:
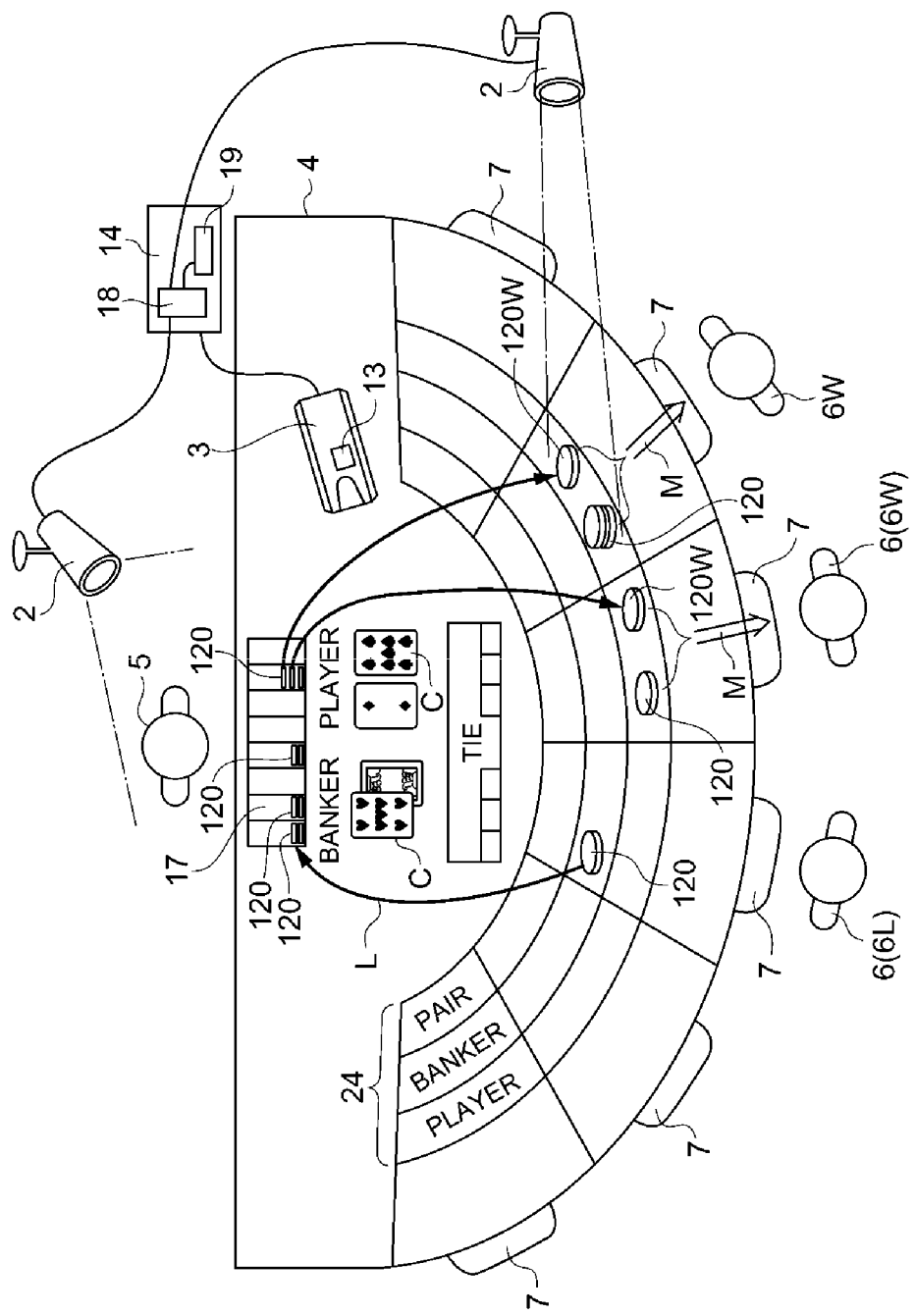
FIG. 6 is a plan view illustrating an overview of the whole management system for table games in a game house according to a second embodiment of the present invention.

Hereinafter, a management system of table games in a game house including a game table according to an embodiment of the present invention will be described. FIG. 6 is a diagram that illustrates an overview of the whole system. The management system of table games in a game house including a plurality of game tables 4 includes: a measurement device 19 including an image analyzing device 18 that records a state of process of a game played in the game table 4 as a video including game participants 6 and a dealer 5 through a plurality of camera devices 2 and performs an image analysis of the recorded video of the state of process of the game; and a card distributing device 3 that determines and displays a result of winning/losing of each game in the game table 4. The card distributing device 3 is a so-called electronic shooter that has already been used by persons skilled in the art and has rules of a game programmed in advance and has a structure capable of determining winning/losing of a game by reading information of distributed cards C. For example, in a Baccarat game, winning of the baker, winning of a player, or tie (drawn) is determined basically based on the ranks of two to three cards, and a determination result (a result of winning/losing) is displayed in a result display lamp 13.

The management control device 14 reads information (ranks and suits) of cards C acquired from the card distributing device 3 and determines a result of winning/losing of each game and determines a winner 6W and a loser 6L among the participants 6 in each game by using a result of measurement of the position, the types, and the quantities of substitute currency 120 for gaming placed by the game participants 6.

In addition, the management control device 14 has a calculation function of calculating a balance (an amount acquired by subtracting a total amount of substitute currency 120 for gaming that is re-paid to a winner 6W among the participants 6 from a total amount of substitute currency 120 for gaming bet by the loser 6L) of the casino side in the game table 1 for each game.

The image analyzing device 18, the measurement device 19, and the management control device 14 of this detection system have a structure integrally including a computer formed as one body or by a plurality of configurations, a program, and a memory.

Figure 8:
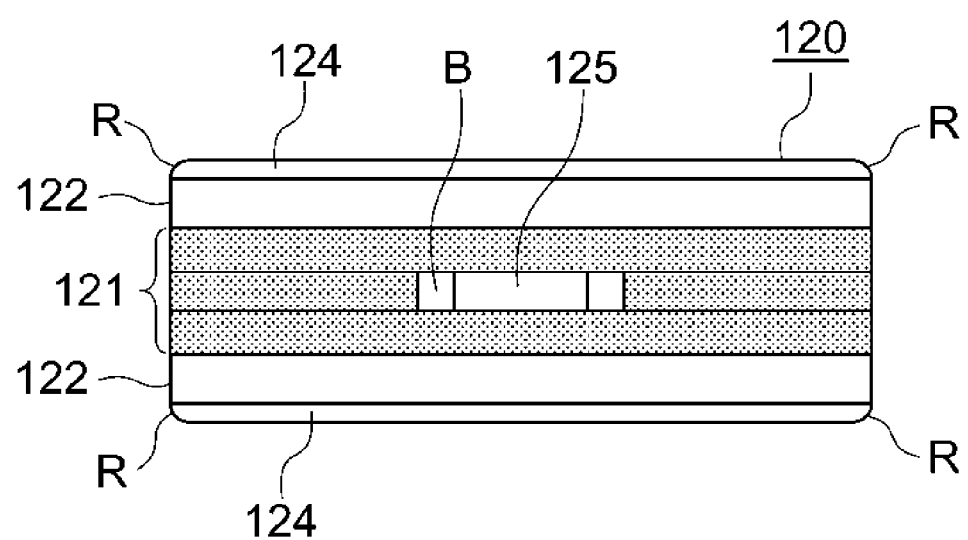
FIG. 8 is a side-face cross-sectional view of substitute currency for gaming according to the second embodiment of the present invention.

Next, details of substitute currency for gaming used in this detection system will be described. FIG. 8 is a front cross-sectional view of substitute currency 120 for gaming used in this detection system. The substitute currency 120 for gaming has a multi-layer structure in which a plurality of plastic layers having different colors are stacked, a coloring layer 121 is included at least in the middle, and white layers 122 or thin-color layers (while not illustrated in the drawing, the layers may be layers of a color that is thinner than that of the coloring layer 121) are stacked on both sides of the coloring layer 121 of the middle.

Figure 9A:
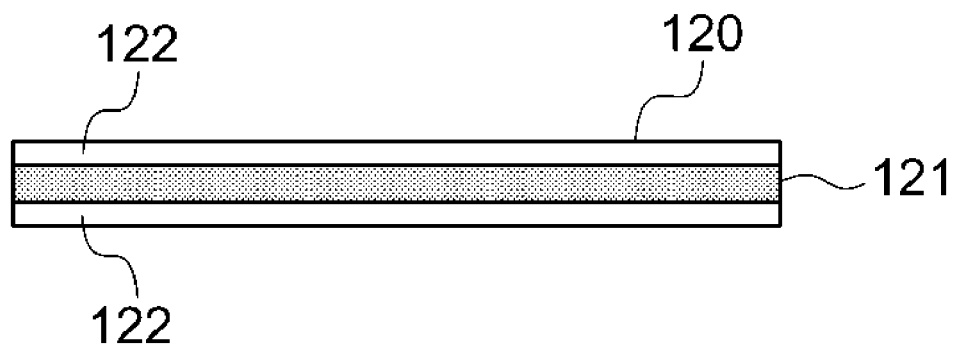
FIG. 9A is a side view of substitute currency for gaming according to the second embodiment of the present invention.

In this way, by employing a multi-layer structure in which the coloring layer 121 is included, and white layers 122 or thin-color layers (while not illustrated in the drawing, the layers may be layers of a color that is thinner than that of the coloring layer 121) are stacked on both sides of the coloring layer 121 of this middle, as illustrated in FIG. 9A, a stripe pattern is formed on the side face in the stacking direction, and the type of the substitute currency 120 for gaming can be specified by changing the color (red, green, yellow, blue, or the like) of the coloring layer 121 for each type (10 points, 20 points, 100 points, 1000 points, and the like) of the substitute currency 120 for gaming.

Figure 10A:
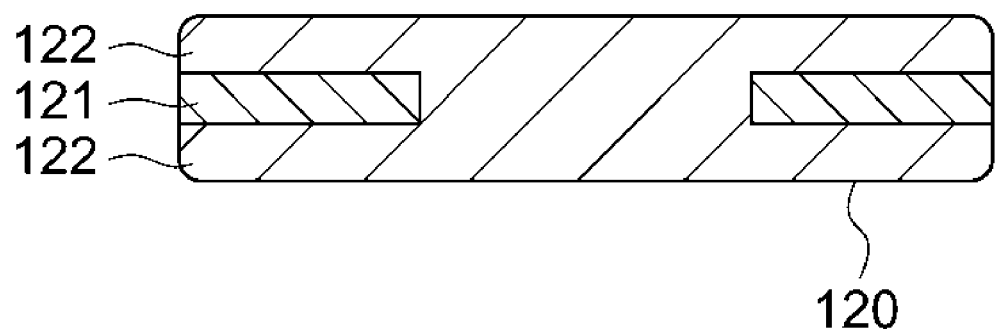
FIG. 10A is a diagram illustrating another example of substitute currency for gaming according to the second embodiment of the present invention.
Figure 10B:
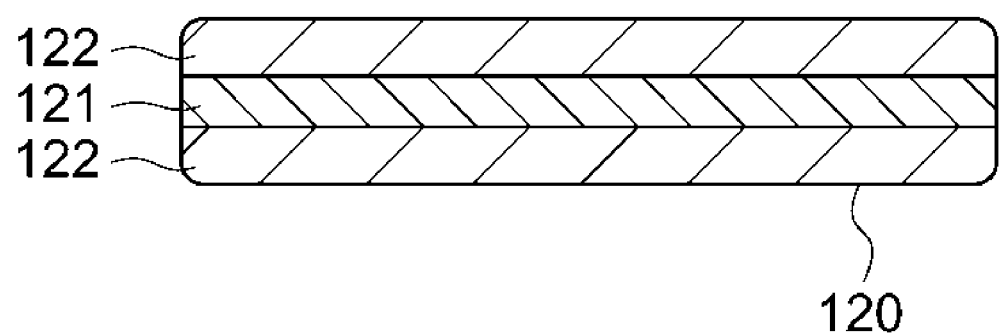
FIG. 10B is a diagram illustrating another example of substitute currency for gaming according to the second embodiment of the present invention.

The substitute currency 120 for gaming is configured as a structure body including the coloring layer 121 and the white layer 122 or the thin-color layer at least in the outer appearance to form a stripe pattern in the axial direction on the side face and has a configuration enabling the type of the substitute currency 120 for gaming to be specified using the coloring layer 121. While FIGS. 10A and 10B illustrate different examples, in the examples, the coloring layer 121 and the white layer 122 or the thin-color layer are formed through injection molding, and so-called two-color molding is used in which, first, the coloring layer 121 is molded inside a die for molding (not illustrated in the drawing), and thereafter, the white layer 122 or the thin-color layer is molded.

Figure 9B:
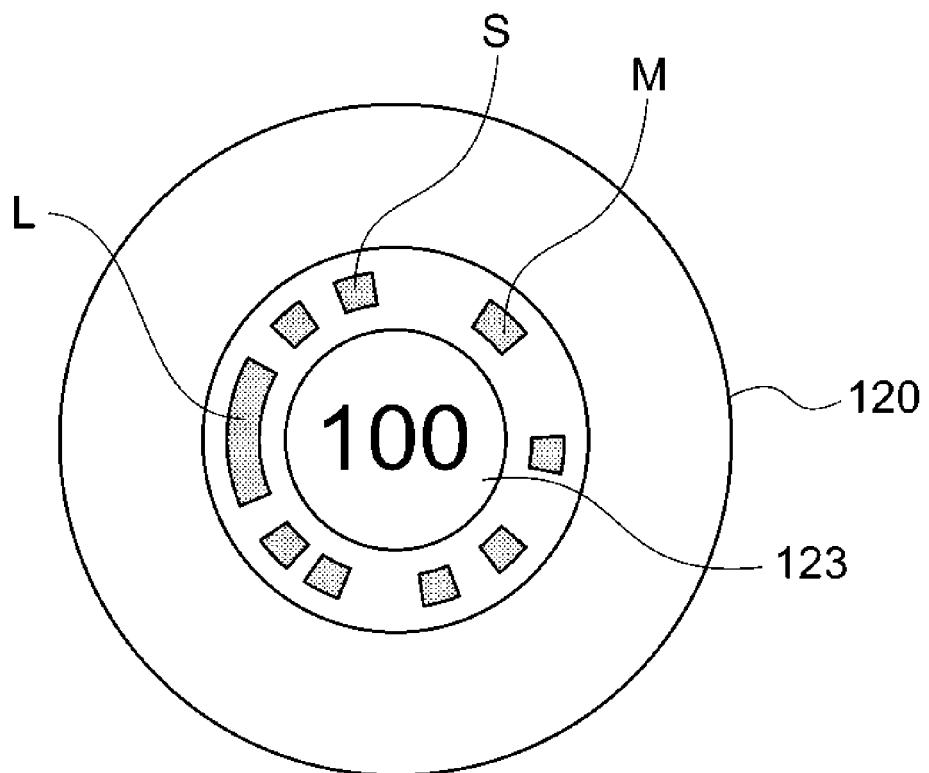
FIG. 9B is a side view of substitute currency for gaming according to the second embodiment of the present invention.

In addition, as illustrated in FIG. 9B, in the substitute currency 120 for gaming, prints 123 (100 points or the like) representing the type of the substitute currency 120 for gaming are formed on the surfaces (the upper face and the lower face) of the white layer 122. As illustrated in FIG. 8, the transparent layers 124 are disposed in the outermost layers, and each interlayer is thermos-compressed, and a structure of at least five layers is formed. Such substitute currency 120 for gaming is formed by using a plastic material having a thin long shape, and layers (the coloring layer 121, the white layer 122, and the transparent layer 124) are thermo-compressed to form a closely adhering state (a structure of five layers or the like) in the state of a long length, and thereafter, holes having a circular shape, a rectangular shape, or the like are formed therein through press or the like.

When a hole is formed through the press, die of mold for punching, and the size of punching are designed, and R processing (round angle) is performed for the ends of the transparent layer 124 of the outermost layer.

That is, in order to manufacture the substitute currency 120 for gaming, first, a plate-shaped coloring layer 121 formed using plastic and a plate shaped white layer 122 or a thin-color layer formed using plastic are stacked, and a stacked structure body configured by a plurality of plastic layers is formed. Then, drawing patterns are printed on the upper face and the lower face of this stacked structure body, and transparent layers 124 are formed thereon. Then, the layers of the stacked structure body and the transparent layers 124 are heated and pressed to be heated and welded, whereby a substitute currency original plate is generated. Then, punching processing is performed for the substitute currency original plate acquired in this way, whereby a plurality of substitute currencies 120 for gaming having a predetermined shape are acquired. When this punching processing is performed, R processing is performed for upper and lower angles of the substitute currency 120 for gaming using a mold.

Figure 11:
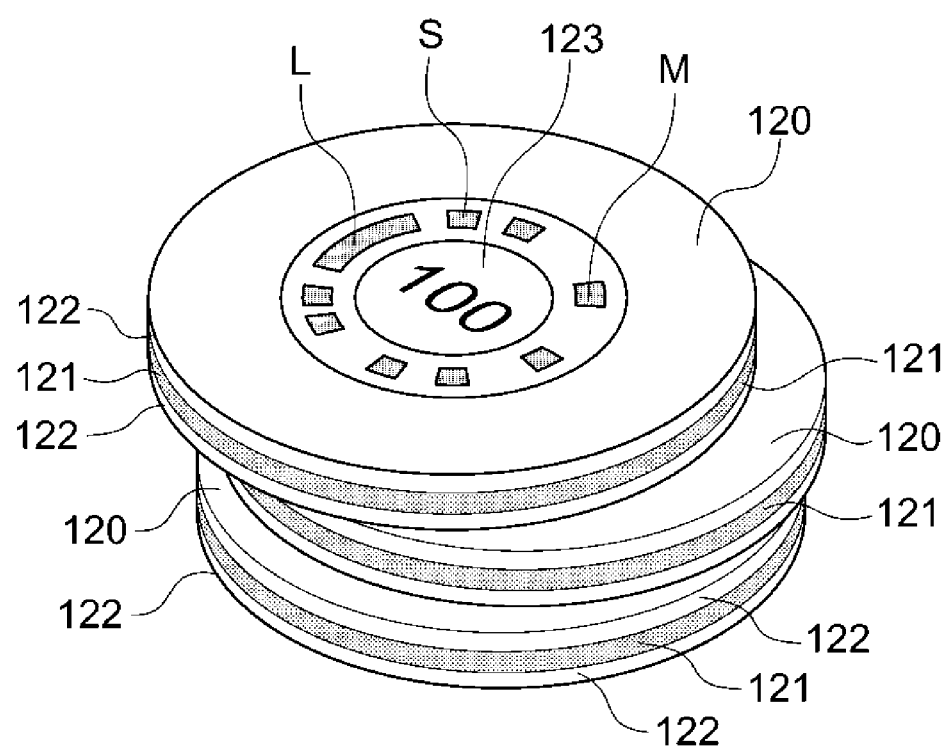
FIG. 11 is a perspective view of a state in which substitute currency for gaming is piled according to the second embodiment of the present invention.

In addition, in the substitute currency 120 for gaming, face codes using the UV ink or ink (carbon black ink) absorbing an infrared rays are arranged on the surface of the white layer 122 (see FIG. 9B). This face codes represent the authenticity of the substitute currency 120 for gaming, and, when ultraviolet rays (or infrared rays) are emitted thereto, a mark is visible to the eyes, and a combination of the form and the number of the marks represents the authenticity. FIG. 11 is a perspective view of a state in which the substitute currency 120 for gaming is stacked up, and a face code M is acquired by combining a long code L and a short code S. In the outermost layers, while transparent layers (print layers) 124 are thermally compressed or formed as coating layers to cover the print 123 and the face code, embossing processing is performed for these transparent layers 124, and the close adherence between the substitute currencies 120 for gaming is prevented. In addition, in this embodiment, while an example has been described in which face codes are printed on the surfaces of the white layers 122, instead of the face codes or together with the face codes, one or both of a security mark and an optically variable device (OVD) may be printed.

The R processing (R) is performed for the ends of the transparent layers (print layer) 124 of the outermost layer for which the print 123 (100 points or the like), and in the punching process of the substitute currency 120 for gaming, the surfaces of the white layers 122 are prevented from being deformed to appear on the side face. In addition, it is prevented that a sharp end remains in the substitute currency 120 for gaming and damages the hands or the other substitute currency 120 for gaming.

The coloring layer 121, as illustrated in FIG. 8, may be formed by a plurality of colored layers (three layers in the case illustrated in FIG. 8). Since the plurality of colored layers (three layers in the case illustrated in FIG. 8) are thermos-compressed, a state in which the three-layer structure can be visually observed, as illustrated in FIG. 8, is not formed. However, three layers are illustrated in FIG. 8 for description. In addition, in a middle layer among the three layers of the coloring layer 121, a partly hollowed portion B is arranged, and an RFID 125 is built therein.

In addition, without arranging the hollowed portion B in the coloring layer 121, the RFID 125 may be built in the substitute currency 120 for gaming by arranging the RFID 125 between the coloring layer 121 having a flat surface and the white layer 122 having a flat surface and performing thermos-compressing of the coloring layer 121 and the white layer 122 as it is. By configuring at least one of the coloring layer 121 and the white layer 122 using a material such as plastic that can be thermally deformed, out of the coloring layer 121 and the white layer 122 having the RFID 125 interposed therebetween through thermal compression, a plastic layer is thermally deformed, and accordingly, the RFID 125 is tightly fixed between such layers without arranging the hollowed portion B.

Figure 12:
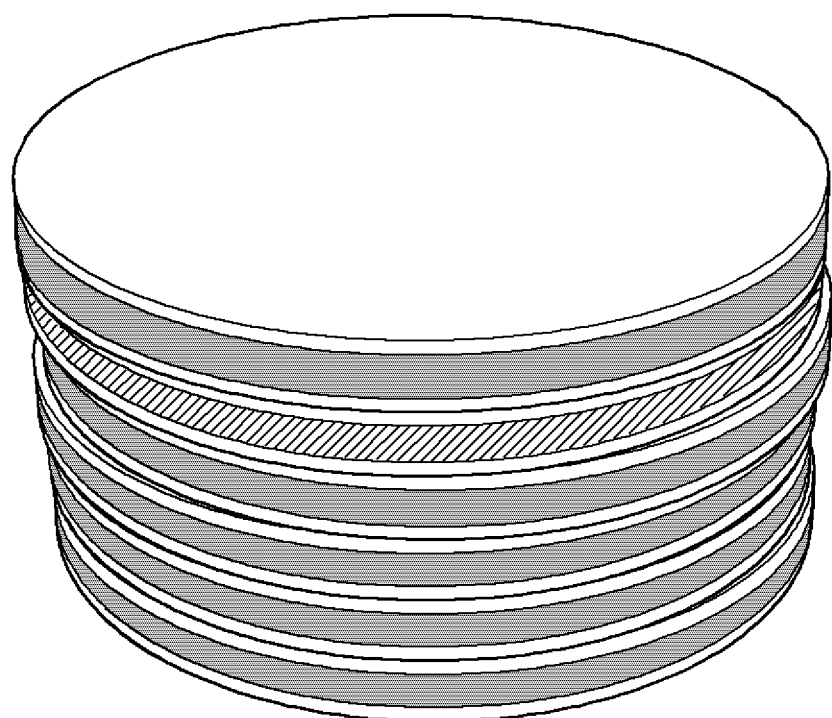
FIG. 12 is a perspective explanatory photographic diagram illustrating a state in which different kinds of substitute currency for gaming are piled.

FIG. 12 is a perspective explanatory photographic diagram that illustrates a state in which substitute currency for gaming of different types are piled up. The management control device 14 images substitute currency 120 for gaming placed on the game table 1 by the game participant 6 by using the camera device 2 and measures each area 8 (whether the bet is on the banker, the player, the pair, or the tie) in which the substitute currency 120 for gaming is placed by using the measurement device 19 including the image analyzing device 18, and the measurement device 19 (by using information acquired by the image analyzing device 18) analyzes and measures the number and the colors of coloring layers 121 (or the thin-color layers) or white layers 122 of the substitute currency 120 for gaming that is stacked in each area and determines the types and the quantities of the substitute currency 120 for gaming. The management control device 14 performs control of the camera device 2 such that imaging using the camera device 2 is performed when the first card is drawn from the card distributing device, before and after the drawing, or after a dealer's sign representing the end of betting.

The management control device 14 may be a control device having an artificial intelligence-utilizing or deep learning structure. The management control device 14 can perceive the position 8 (a position betting on a player, a banker, or a pair), the types (a value of a different amount is assigned to the substitute currency 120 for gaming for each color), and the quantities of the substitute currency 120 for gaming that is bet by each participant 6 through the camera device 2 and the image analyzing device 18. The artificial intelligence-utilizing computer or control system can perceive the position 8 (a position betting on a player, a banker, or a pair), the types (a value of a different amount is assigned to the substitute currency for gaming for each color), and the quantities of the substitute currency 120 for gaming by using a self-learning function or the like in the deep-learning (structure) technology, and thus, according to a result of winning/losing of a game determined by the card distributing device 3 in each game, determines whether or not the collection (denoted using an arrow L) of substitute currency 120 for gaming bet by a losing participant 6L and the re-payment (payment (120W)) for winning substitute currency 120 for gaming for the winning game participant 6W are appropriately performed according to a result of winning/failure of the game in each game by analyzing a video of the state of progress of the game by using the management control device 14 through the image analyzing device 18.

In such a case, as illustrated in FIG. 11 (compared to conventional substitute currency for gaming illustrated in FIG. 7), a stacked multi-layer structure is formed, and a stripe pattern is formed on the side face in the stacking direction, and accordingly, the measurement device 19 including the image analyzing device 18 can accurately perform the measurement of the types and the quantities of substitute currency for gaming in an easy manner. In addition, by using an artificial intelligence-utilizing computer or control system and a deep-learning (structure) technology, the analysis and the determination of the image can be performed more accurately. The artificial intelligence-utilizing computer or control system and the deep-learning (structure) technology are known to persons skilled in the art and can be used, and thus, detailed description thereof will be abbreviated.

The management control device 14 can analyze and perceive a total amount of substitute currency 120 for gaming in the tray 17 for substitute currency for gaming for the dealer 5 of the game table 4 by using the image analyzing device 18 and can determine through a comparison and calculation whether or not a total amount of the substitute currency 120 for gaming placed inside the tray 17 for substitute currency for gaming has been increased/decreased according to the collection of the losing substitute currency 120 for gaming bet by each game participant 6 and the amount of the payment 120W for winning substitute currency for gaming to the winning game participant 6W after the game ends and is settled based on the result of winning/losing of the game. The total amount of the substitute currency 120 for gaming in the tray 17 for substitute currency for gaming may be constantly acquired by using means such as RFIDs, and it is determined whether or not the increased/decreased amount is correct by the management control device 14 by analyzing a video of the state of progress of the game through the image analyzing device 18. For these, an artificial intelligence-utilizing or deep-learning structure may be utilized.

In addition, the management control device 14 may have an artificial intelligence-utilizing or deep-learning structure capable of acquiring the position (a position for betting on the player, the banker, or the fair) and the amount (the types and quantities) of bet substitute currency for gaming at each player position 7 of the game table 4, comparing a winning/losing history of each player 6 and the amount (won amount) of acquired substitute currency for gaming that can be acquired based on the result of winning/losing of each game with statistical data of many (big data) games in the past, and extracting an abnormal situation (set in the casino). Typically, the management control device 14 is included which has an artificial intelligence-utilizing or deep-learning structure capable of extracting an occurrence of a won amount of a certain amount (one million dollars) or more and an abnormal situation in which, in a play position 7 of a specific game table 4, a state in which the amount of bet substitute currency for gaming is small at the time of losing a game, and the amount of bet substitute currency for gaming is large at the time of winning a game is continued for several games and is determined as an abnormal situation based on a comparison with statistical data (big data or the like) of games in the past.

The total amount of the substitute currency 120 for gaming in the tray 17 for substitute currency for gaming for the dealer 5 of the game table 4 is settled for the substitute currency 120 for gaming bet by each participant 6 after each game, and the management control device 14 has a structure capable of determining through a comparison and calculation whether or not an increase/decrease in the substitute currency for gaming that corresponds to a settlement is correct after the settlement.

In the tray 17 for substitute currency for gaming used for storing the substitute currency 120 for gaming for the dealer 5 illustrated in FIG. 6, the types and the quantities of the substitute currency 120 for gaming can be determined by analyzing and measuring the numbers and the colors of the coloring layers 121 or the white layers 122 of the substitute currency 120 for gaming stacked in the horizontal direction by using the measurement device 19 (by using the information acquired by the image analyzing device 18). The total amount of the substitute currency 120 for gaming for the tray 17 for storing substitute currency for gaming is constantly (or at predetermined time intervals) acquired in this way. As the management control device 14 has a calculation function of calculating a settlement amount (calculation of a balance of the casino side in the game table 4 (an amount acquired by subtracting a total amount of the substitute currency 120 for gaming re-paid to the winner 6W among the participants 6 from a total amount of the substitute currency 120 for gaming bet by the loser 6L) of each game for each game (see description presented above), the total amount of the substitute currency 120 for gaming of the tray 17 for substitute currency for gaming is constantly (or at intervals of a predetermined time) is verified. That is, it is verified whether or not an increase/decrease in the substitute currency for gaming matches a result of an image analysis performed by the image analyzing device 18 and the settlement amount of each game performed by the dealer 5.

FIG. 13A is a diagram that illustrates details of a tray for substitute currency for gaming according to this embodiment, and FIG. 13B is a diagram that illustrates another example of the substitute currency for gaming. In the tray 17 for substitute currency for gaming, a collection tray 171 for substitute currency for gaming that is used for collecting and temporarily storing substitute currency 120L for gaming that is bet by a losing player 6L and a repayment tray 172 for substitute currency 120W for gaming that is used for storing substitute currency 120L for gaming to be re-payed are arranged. The image analyzing device 12 and the control device 14 acquire the position, the type, and the quantity of substitute currency 120L for gaming that is bet by the losing player 6L and calculates an increased amount (an amount of substitute currency 120L for gaming to be present in the collection tray 171 for substitute currency 120 for gaming) of substitute currency 120L for gaming in the game. In addition, the image analyzing device 12 and the control device 14 acquire a real total amount of the substitute currency 120 for gaming in the tray 171 for substitute currency for gaming after the collection and determine whether or not there is a difference between the total amount and the real total amount through a comparison.

Figure 14A:
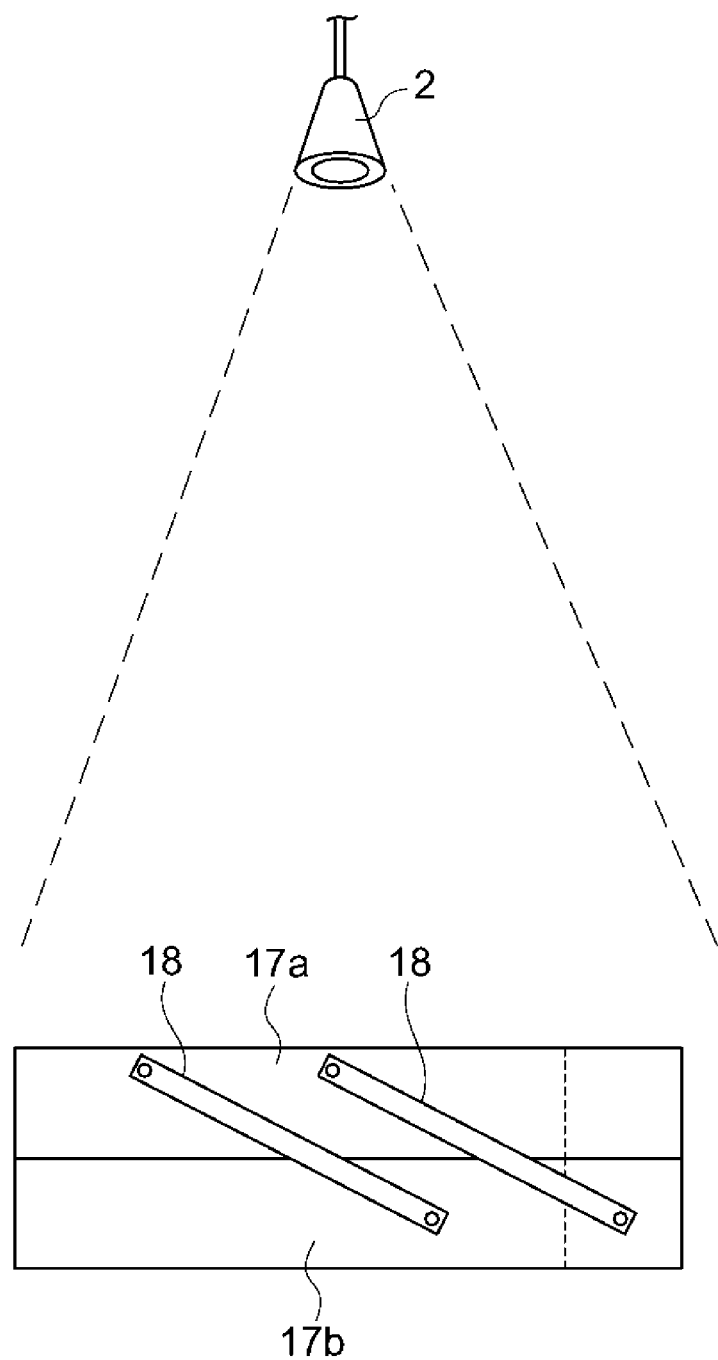
FIG. 14A is a diagram illustrating a relation between a tray for substitute currency for gaming having a two-stage structure and a camera device 2 and is a diagram illustrating a state in which two stages are overlapped.
Figure 14B:
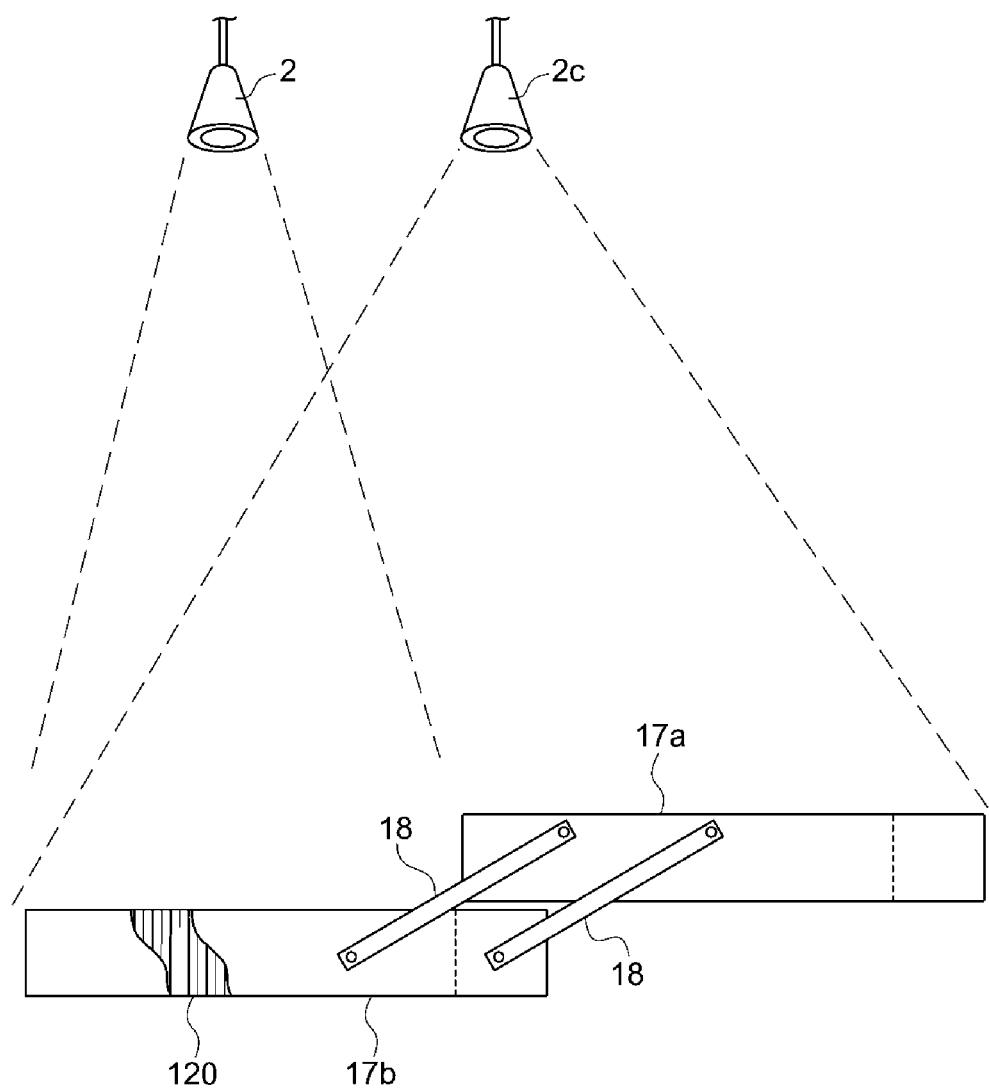
FIG. 14B is a diagram illustrating a relation between a tray for substitute currency for gaming having a two-stage structure and a camera device 2 and is a diagram illustrating a state in which two stages are shifted from each other.

Here, the tray 17 for substitute currency for gaming that is illustrated above has a two-stage structure formed by an upper stage tray 17a for substitute currency for gaming and a lower stage tray 17b for substitute currency for gaming. FIGS. 14A and 14B are diagrams that illustrate a relation between the tray 17 for substitute currency for gaming having a two-stage structure and a camera device 2, FIG. 14A illustrates a state in which two stages overlap each other, and FIG. 14B illustrates a state in which two stages are shifted from each other. In the lower stage of the upper stage tray 17a for substitute currency for gaming, the lower stage tray 17b for substitute currency for gaming is present, and the upper stage tray 17a for substitute currency for gaming and the lower stage tray 17b for substitute currency for gaming are connected through a hinge 17c. In a case where substitute currency 120 for gaming placed in the upper stage tray 17a for substitute currency 120 for gaming is insufficient, substitute currency 120 for gaming is supplemented from the lower stage tray 17b for substitute currency for gaming to the upper stage tray 17a for substitute currency for gaming. On the other hand, in a case where substitute currency 120 for gaming placed in the upper stage tray 17a for substitute currency for gaming is excessive, the substitute currency for gaming is moved to the lower stage tray 17b for substitute currency for gaming.

In order to take in the substitute currency 120 for gaming from the lower stage tray 17b for substitute currency for gaming, the upper stage tray 17a for substitute currency for gaming is moved using the hinge 17c to be in a state illustrated in FIG. 14B. In the state illustrated in FIG. 14A, the upper stage tray 17a for substitute currency for gaming is imaged by the camera device 2, and, in the state illustrated in FIG. 14B, the lower stage tray 17b for substitute currency for gaming can be imaged using the camera device 2. In the state illustrated in FIG. 14B, the upper stage tray 17a for substitute currency for gaming and the lower stage tray 17b for substitute currency for gaming can be imaged by the camera device 2c simultaneously and in a state in which the trays can be identified from each other. In addition, in the state illustrated in FIG. 14B, the upper stage tray 17a for substitute currency for gaming and the lower stage tray 17b for substitute currency for gaming may be separately imaged. The camera devices 2 and 2c may respectively include a visible light camera corresponding to printed ink of a side ID 126 and an infrared-ray camera or may be cameras switchable between a plurality of functions of a visible-light camera corresponding to printed ink and an infrared-ray camera.

Figure 15:
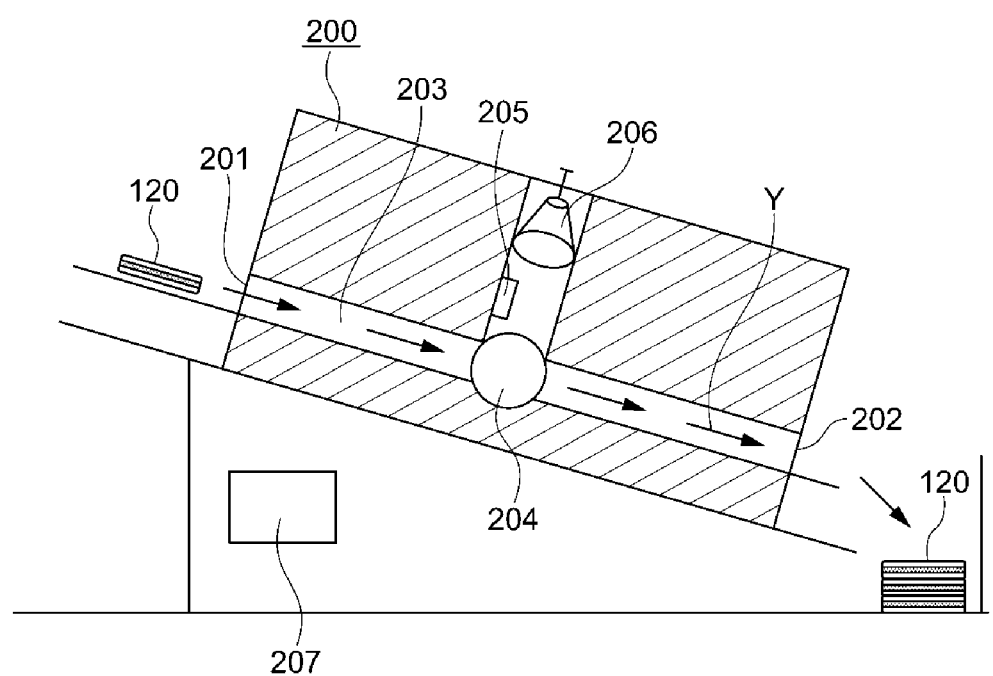
FIG. 15 is a diagram illustrating an inspection device inspecting substitute currency for gaming according to the second embodiment.

Next, an inspection device 200 inspecting the substitute currency 120 for gaming according to an embodiment of the present invention will be described with reference to FIG. 15. The inspection device 200 includes a passage 203 that includes an inlet 201 through which substitute currency 120 for gaming can pass in the radial direction (the direction of an arrow Y) and an outlet 202. The passage 203 inclines, and the substitute currency 120 for gaming passes in the direction of the arrow Y). In the passage 203, a gaming substitute currency type determining device 204 that images the side face of the substitute currency 120 for gaming and determines the color of a stripe pattern of the side face in the stacking direction; a mark reading device 205 that reads a face code as a face code using UV ink or ink (carbon black ink) absorbing infrared rays arranged on the surface of the passing substitute currency 120 for gaming; a print inspecting device 206 that reads the print 123 representing the type arranged on the surface of substitute currency for gaming in the vertical direction with respect to the passage 203; and a control device 207 for the whole device. The control device 207 is configured to inspect whether or not the type of the substitute currency for gaming determined by the gaming substitute currency type determining device 204 matches a content of the print representing the type acquired from the print inspecting device 206.

By using this inspection device 200, it can be inspected whether or not the print 123 of the manufactured substitute currency 120 for gaming matches the type of the substitute currency for gaming according to the color of the stripe pattern of the substitute currency 120 for gaming and is correctly printed.

As above, the substitute currency 120 for gaming according to this embodiment has a stacked structure, in which the coloring layer 121 and the white layer 122 or thin-color layers having the coloring layer 121 interposed therebetween are stacked, formed by a plurality of plastic layers and thus, has a side face on which a stride pattern is formed in the stacking direction. The substitute currency 120 for gaming has a configuration enabling the type of the substitute currency 120 for gaming to be specified using the coloring layer 121 appearing on the side face. In addition, prints are performed for the upper face and the lower face of the substitute currency 120 for gaming. More specifically, prints are performed for the surface of the white layer 122 of the thin-color layer, and the transparent layer 124 is included on the upper face thereof. The coloring layer 121 and the white layer 122 or the thin-color layer and the print layer 124 are thermos-compressed together to form a layered structure.

The white layers 122 or the thin-color layers having the coloring layer 121 interposed therebetween may be configured to have different depths in the vertical direction from each other.

In addition, in this embodiment, the R processing is performed for the outer edges of the upper face and the lower face of the substitute currency 120 for gaming. Accordingly, it can be prevented that a player's hand handling the substitute currency 120 for gaming hurts, or the substitute currency 120 for gaming damages the other substitute currency 120 for gaming.

In addition, in this embodiment, the RFID 125 is tightly fixed between plastic layers each forming one of the coloring layer 121 and the white layer 122 or the thin-color layer.

In addition, in this embodiment, on the upper face and/or the lower face of the substitute currency 120 for gaming, face codes using UV emission ink, infrared absorption ink such as ink (carbon black ink) absorbing infrared rays are arranged. In addition, as a modified example of this embodiment, one or both of a security mark and an optical variable device (OVD) may be printed on the surfaces of the substitute currency 120 for gaming instead of the face codes or together with the face codes.

In addition, the substitute currency 120 for gaming according to this embodiment has a structure in which the side ID 126 is attached to the side face, the RFID 125 is built, and face codes using UV emission ink or infrared absorption ink are arranged on the upper face or the lower face (the print layer 124). Then, the information of a side ID 126 and the information of an RFID 125 are associated with each other, the information of a side ID 126 and information of a face code are associated with each other, or the information of a side ID 126, information of an RFID 125, and the information of a face code are associated with each other.

In addition, the inspection device 200 according to this embodiment includes: the measurement device 19 of the type of substitute currency 120 for gaming that images the side face of the substitute currency 120 for gaming and determines the color of the stripe pattern of the side face in the stacking direction; and the mark reading device 205 that reads the print of the substitute currency for gaming. In this way, a relation between the type of substitute currency for gaming and the content of a print can be inspected.

The management control device 14 according to this embodiment performs imaging for determining the position, the types, and the quantities of substitute currency for gaming placed by a game participant in each game when the first card is drawn from the card distributing device 3, before and after drawing, or after a dealer's sign representing the end of betting.

In addition, the substitute currency 120 for gaming according to this embodiment is manufactured as below. First, a stacked structure body including a plurality of plastic layers is formed by heating and pressing the coloring layer 121 and the white layers 122 or the thin-film layers. Then, a drawing pattern is printed at least on the upper face or the lower face of the stacked structure body, whereby a substitute currency original plate is generated. Then, punching processing is performed for the substitute currency original plate by using a mold, whereby a plurality of substitute currencies for gaming having a predetermined shape are acquired. Here, at the time of punching processing, R processing is performed for the outer edges of the upper and lower faces of the substitute currency 120 for gaming by using a mold.

In addition, in a case where substitute currency 120 for gaming having side IDs is to be manufactured, side IDs are printed on the side faces of the white layers 122 or the thin-color layers through inkjet printing. Furthermore, in a case where substitute currency 120 for gaming including an RFID is to be manufactured, an RFID is interposed between the layers of the stacked structure body, and the layers having the RFID interposed therebetween are heated and welded when the layers are thermos-compressed, whereby the periphery of the RFID is tightly fixed by the plastic layers.

In addition, the management system of table games according to this embodiment includes: the card distributing device 13 that determines and displays a result of winning/losing of each game in the game table 4; the camera device 2 that images substitute currency 120 for gaming placed on the game table 4; and the management control device 14 that specifies and stores the position, the types, and the quantities of substitute currency for gaming placed by the game participant 6 on the game table 4 by using a result of the imaging performed by the camera device 2. The substitute currency 120 for gaming is a stacked structure body in which the coloring layer 121 and the white layers 122 or the thin-color layers are stacked and has a stripe pattern on the side face in the stacking direction. The management control device 14 has a calculation function calculating a balance of the casino side in the game table 4 for each game based on a result of winning/losing acquired from the card distributing device 13 and the position, the types, and the quantities of the substitute currency 120 for gaming specified using the imaging result of the camera device 2.

The management control device 14 has a function of measuring the number of the coloring layers 121 or the white layers 122 or the thin-color layers of substitute currency 120 for gaming placed by each game participant 6, determines the types and the amounts of the substitute currency for gaming by using the colors of the coloring layer 121, and determining the quantities of the substitute currency 120 for gaming.

A system according to a third embodiment relates to a management system of substitute currency for gaming preventing the use of fake substitute currency for gaming in a game house in a casino or other game facilities using substitute currency for gaming.

Among many live table games played in a casino or a game facility, there are Baccarat and blackjack. In such games, a standard deck configured by 52 playing cards is used, and playing cards are distributed to a game table from a shooter including a plurality of decks (6 to 9 decks or 10 decks) shuffled in advance, and a game is played. In a casino or a game facility, substitute currency for gaming is used for such games.

The use of fake substitute currency for gaming should not occur in a casino. In order to prevent the use of fake substitute currency for gaming in a casino, there is a technology for preventing the use of fake substitute currency for gaming by attaching an RFID to substitute currency for gaming. The RFID-attached substitute currency for gaming is known and is disclosed in WO 2008/120749 A.

This embodiment provides a management system or substitute currency for gaming preventing the use of fakes of substitute currency for gaming used in a casino or a game facility, and the use and unjust exchange of fake substitute currency for gaming in a casino or a game facility can be prevented. In recent years, the technologies for manufacturing fake substitute currency for gaming evolve, and technologies advance up to a level of copying an authenticity determination mark or an RFID almost perfectly. As a result, a mark or an RFID that is the same as a genuine authenticity determination mark or a genuine RFID is attached to substitute currency for gaming, genuine and fake substitute currency for gaming cannot be discriminated from each other, and there is a problem in that it is almost impossible to perform an authenticity determination.

In order to solve the conventional problem described above, a management system of substitute currency for gaming according to this embodiment includes: substitute currency for gaming to which a side ID that can be individually identified is attached; an ID reading device that reads a side ID attached to the substitute currency for gaming; a storage in which the substitute currency for gaming is stored in a cashier of a game house; a game table gaming substitute currency tray that stores the substitute currency for gaming; a gaming substitute currency determining device that specifies types and quantities of the substitute currency for gaming stored in the game table gaming substitute currency tray and the storage by using the ID reading device; and a management control device that manages the IDs associated with the substitute currency for gaming in a database. The management control device has functions of registering the IDs of the substitute currency for gaming to be used in the database in advance, managing the IDs of the substitute currency for gaming present at least in the game table gaming substitute currency tray and the storage in the database together with presence information by using the database, specifying the substitute currency for gaming in the game table gaming substitute currency tray and the storage at predetermined timing, searching the database, determining the following events through the database search 1) an ID not present in the database is newly present 2) two or more same IDs are present, and generating an error signal when a situation of 1) or 2) described above is present.

In addition, the management control device has functions capable of, when there is a change in the presence of the substitute currency for gaming at least in the game table gaming substitute currency tray and the storage, recording time or a place at which there is the change in the database in association with the ID, searching the database, when there is a situation in which two or more same IDs are present, extracting the ID and information of time or a place recorded in association with the ID in the database from the database and storing extracted information, and specifying time when the substitute currency for gaming to which the ID is attached, which is detected first, enters/exits the game table gaming substitute currency tray or the storage or a place of the game table gaming substitute currency tray or the storage in which the substitute currency for gaming is stored.

Furthermore, the management system of substitute currency for gaming may further include: a bet area gaming substitute currency determining device specifying the types and quantities of the substitute currency for gaming bet on a bet area of the game table by using the ID reading device and may have functions of determining the following events through a search of the database also for the ID of the substitute currency for gaming present in the bet area of the game table 1) an ID that has not been present in the database is newly present 2) presence of two or more same IDs and generating an error signal when there is a situation of 1) or 2) described above.

In addition, side IDs are attached to at least three positions on the side face of the substitute currency for gaming. The side IDs are attached through inkjet printing by using ink that is visible using visible light. Particularly, a configuration is advantageous in which the side ID is attached as presence/absence of marks of a plurality of rows and a plurality of columns. In addition, transparent coating layers or varnish is disposed on the upper and lower faces of the substitute currency for gaming.

In order to solve the conventional problems, substitute currency for gaming according to this embodiment forms a stripe pattern on the side face in the stacking direction by employing a multi-layer structure in which a plurality of plastic layers having different colors are stacked, a coloring layer is included at least in one layer, white layers or thin-color layers are stacked on a further outer side than the coloring layer and has a configuration enabling the type of the substitute currency for gaming to be specified by the coloring layer. In addition, side IDs are attached to at least three positions on the side faces of the white layers and the thin-color layers, and the type and the manufacturing information of substitute currency for gaming can be specified by reading the ID by using the ID reading device, and a configuration in which the ID can be managed in a database is included. Then, the side ID may be attached using ink (visible ink) that is visible for visible light through inkjet printing. The side ID may be attached using ink (ink absorbing infrared rays, UV ink, or the like) that is not visible for visible light through inkjet printing. In addition, the side ID may be printed using at least two or more of ink that is visible for visible light, ink absorbing infrared rays, and UV ink.

In order to solve the conventional problems described above, substitute currency for gaming according to this embodiment has a side ID that can be individually identified attached thereto, the side ID attached to the substitute currency for gaming is read by an ID reading device, the ID reading device can read the substitute currency for gaming stored in a storage maintained by a cashier of a game house and a gaming substitute currency tray of a game table, in addition, the types and the quantities of the substitute currency for gaming stored in the gaming substitute currency tray and the storage are specified by a gaming substitute currency determining device through the ID reading device, the ID of the substitute currency for gaming present in the gaming substitute currency tray of the game table and the storage is managed in the database together with the presence information thereof, it is inspected whether at least 1) an ID that has not been present in the database is newly present and 2) two or more same IDs are present, and the ID enabling the occurrence of the situation 1) or 2) described above to be determined is included.

Figure 16:
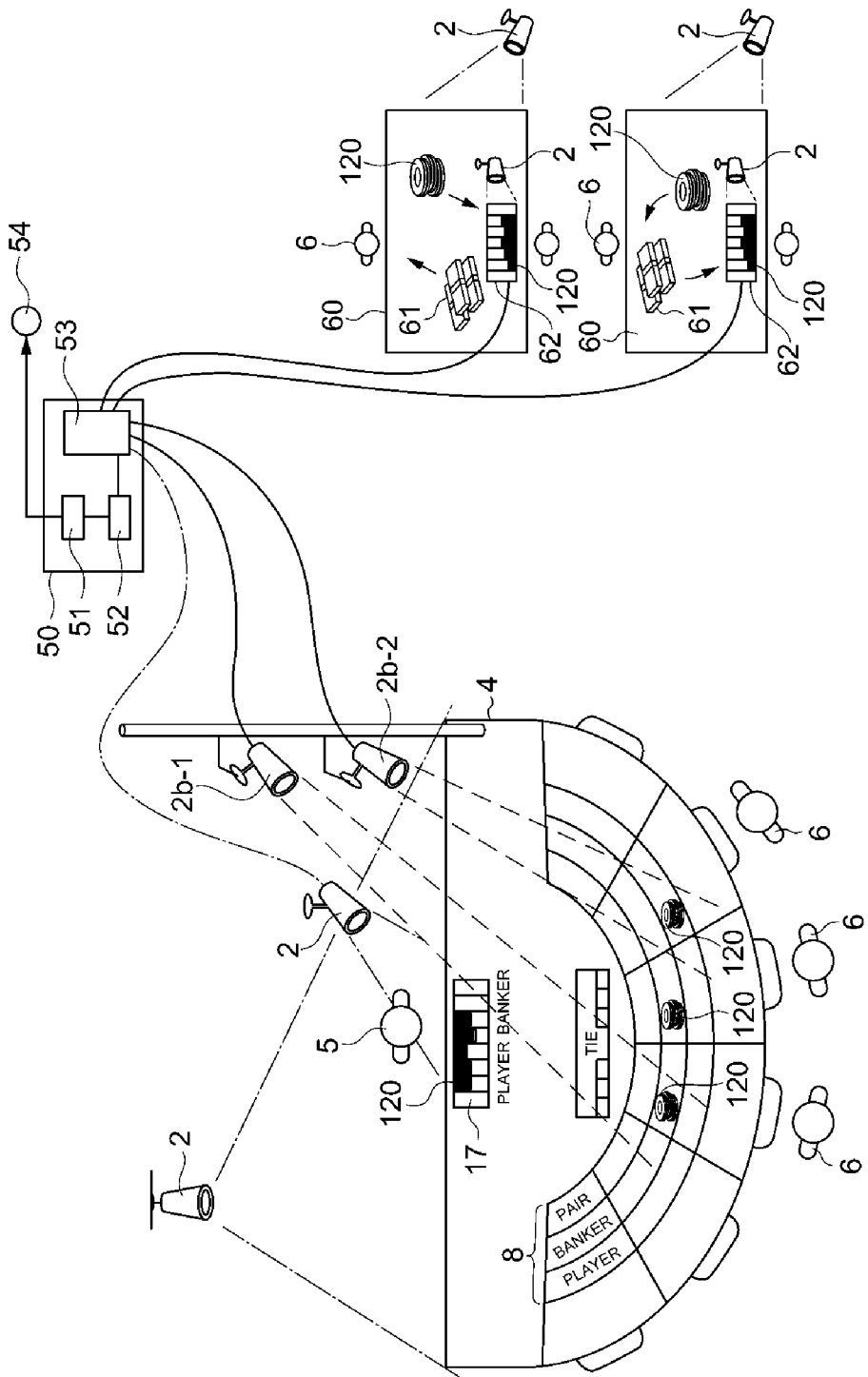
FIG. 16 is a diagram illustrating an overview of the whole management system for substitute currency for gaming according to a third embodiment of the present invention.

Hereinafter, a management system of substitute currency for gaming in a game house including a game table according to an embodiment of the present invention will be described with reference the drawings. FIG. 16 is a diagram that illustrates an overview of the whole system. The management system of substitute currency for gaming in a game house including a plurality of game tables 4 (only one game table is illustrated in FIG. 16) images the state of progress of a game played in the game table 4 including a game participant 6 and a dealer 5 through a plurality of camera devices 2 and stores and manages the state. Particularly, the management system of substitute currency for gaming specifies the types and the quantities of substitute currency 120 for gaming used in the game table 4 by analyzing image information acquired by the camera device 2. A side ID 126 is attached to the side face of the substitute currency 120 for gaming, and the types and the quantities of the substitute currency 120 for gaming is acquired by determining the side ID 126 and reading the types and the quantities. In addition, in this specification, a description of "side ID" or "ID" is used not only in the meaning of an ID as a physical entity attached to the side face of the substitute currency 120 for gaming but also in the meaning of identification information represented thereby. An ID reading device 53 disposed inside a management control device 50 connected to the camera device 2 specifies a side ID 126 by analyzing image information acquired from the camera device 2. Particularly, the management control device 50 includes a gaming substitute currency determining device 52 specifying the types and the quantities of the substitute currency 120 for gaming that is in a horizontally aligned state or in a piled state based on a result of the reading of the side ID 126 acquired by analyzing the image data imaged through the camera device 2 therein.

In addition, the management system according to this embodiment is configured to image substitute currency 120 for gaming disposed on a game table 4 by using a plurality of camera devices 2*b*-1 and 2*b*-2, which have different heights, arranged at predetermined positions in addition to the camera device 2 that images the substitute currency 120 for gaming and records an acquired image. The camera device 2*b*-1 can image substitute currency 120 for gaming disposed at a relatively far position on the game table 4, and the camera device 2*b*-2 is configured to image substitute currency 120 for gaming disposed relatively close on the game table 4. By performing imaging the two camera devices 2*b*-1 and 2*b*-2, substitute currency 120 for gaming disposed at a place that is in a blind area for one of the camera devices can be imaged as well.

In a plurality of cashiers 60 present in a game house, the substitute currency 120 for gaming is exchanged with cash 61 paid by a game participant 6, and, in each cashier 60, substitute currency 120 for gaming is stored in a storage 62 storing the substitute currency 120 for gaming. In each cashier 60 of a game house, substitute currency 120 for gaming brought by a game participant 6 is refunded into cash 61. In the game table 4, substitute currency 120 for gaming is stored in a game table gaming substitute currency tray 17, and a dealer 5 collects substitute currency 120 for gaming bet by a game participant 6 who has lost the game from the table 4 in each game, returns the collected substitute currency 120 for gaming to the game table gaming substitute currency tray 17, and then re-pays the substitute currency 120 for gaming to a game participant 6 who has won each game. All such exchanges between a game participant 6 and a cashier 60 of a game table or a dealer 5 are imaged and recorded by all the camera devices 2. In the storage 62 or the game table gaming substitute currency tray 17, when there is exchange of substitute currency 120 for gaming with a game participant 6, the substitute currency 120 for gaming stored in the storage 62 or the game table gaming substitute currency tray 17 increases or decreases. The types and the quantities of the substitute currency 120 for gaming stored in the game table gaming substitute currency tray 17 and the storage 62 are monitored at predetermined timing or constantly by the ID reading device 53 and the gaming substitute currency determining device 52 through the camera device 2. The management control device 50 stores the side IDs 126 of all the substitute currency 120 for gaming assumed to be used in a game house in the database 51 in advance (the side IDs 126 of all the substitute currency 120 for gaming assumed to be used in the game house are registered).

In addition, also in this embodiment, the gaming substitute currency tray 17, as illustrated in FIGS. 14A and 14B, may be configured by an upper gaming substitute currency tray 17*a* and a lower gaming substitute currency tray 17*b* of upper/lower two stages. In such a case, in the state illustrated in FIG. 14A, the upper gaming substitute currency tray 17*a* can be imaged by the camera device 2, and, in the state illustrated in FIG. 14B, the lower gaming substitute currency tray 17*b* can be imaged by the camera device 2. In the state illustrated in FIG. 14B, additionally, the upper gaming substitute currency tray 17*a* and the lower gaming substitute currency tray 17*b* can be imaged by the camera device 2*c* simultaneously and also in an individually-identifiable state.

In addition, in the state illustrated in FIG. 14B, the upper gaming substitute currency tray 17*a* and the lower gaming substitute currency tray 17*b* may be separately imaged. Each of the camera devices 2 and 2*c* may include a single visible-light camera or a single infrared ray camera corresponding to ink printed for the side ID 126 or a camera capable of performing switching among a plurality of functions of a visible-light camera and an infrared-ray camera corresponding to the printed ink.

In this way, in the game house, by using the database 51, the management control device 50 managing the side IDs 126 associated with substitute currency 120 for gaming manages all the side IDs 126 of at least substitute currency 120 for gaming present in the game table gaming substitute currency tray 17 and the storage 62 in the database 51 together with the presence information thereof (the storage 62, the game table gaming substitute currency tray 17, in the middle of moving from a backyard (not illustrated in the drawing), held by a game participant 6, or the like). The management control device 50 specifies all the substitute currency 120 for gaming disposed in the game table gaming substitute currency tray 17 and the storage 62 by using the side IDs 126 at predetermined timing or constantly, searches the database 51, and determines the following events through the search of the database 51:

1) A side ID 126 that has not been present (or not present) in the database 51 is determined to be newly present.

2) Two or more same IDs are determined to be present.

The management control device 50 has a function of generating an error signal representing an abnormality and giving a notification to a management division or a security division 54 of the game house when the situation of 1) or 2) described above is present. The management control device 50 specifies all the substitute currency 120 for gaming disposed in the game table gaming substitute currency tray 17 and the storage 62 at predetermined timing or constantly by using the side IDs 126 and stores all the substitute currency 120 for gaming in the database 51 and thus, can determine that 1) a side ID 126 that has not been present (or not present) in the database 51 is newly present and 2) two or more same IDs are present.

In addition, when there is a change in the presence of the substitute currency 120 for gaming at least in the game table gaming substitute currency tray 17 and the storage 62, the management control device 50 records time or a place (the storage 62, the game table gaming substitute currency tray 17, or the like) at which the change is present in the database 51 in association with the side ID 126 and, as a result of the search of the database 51, when there is a situation in which two or more same side IDs 126 are present, extracts the side ID 126 and information of time or a place recorded in the database 51 in association with the side ID 126 from the database 51 and stores the side ID and the information that have been extracted, and thus, time at which substitute currency 120 for gaming to which the side ID 126 is attached, which has been detected first (used first or cashed), enters/exits the game table gaming substitute currency tray 17 or the storage 13 or a place of the game table gaming substitute currency tray 17 or the storage 13 in which the substitute currency 120 for gaming is stored can be specified by using the database 51. When the time and the place can be specified, a suspicious person for the use of unjust substitute currency 120 for gaming or the like can be specified from the recorded video of the camera device 2.

In this management system of substitute currency for gaming, the management control device 50 can specify the types and the quantities of the substitute currency 120 for gaming bet on the bet area 8 of the game table 4 by using the ID reading device 53. The substitute currency 120 for gaming of the bet area 8 is imaged by the camera device 2b that particularly images the bet area 8 and, also for the side ID 126 of the substitute currency 120 for gaming present on the bet area 8 of the game table 4, determines the following events by searching the database 51:

1) A side ID 126 that has not been present in the database 51 is newly present in the bet area 16.

2) Two or more same IDs are present.

The management control device 50 has a function of generating an error signal when a situation of 1) or 2) described above is present.

The management control device 50 of this system, the ID reading device 53 disposed inside, and the gaming substitute currency determining device 52 specifying the types and the quantities of substitute currency 120 for gaming have a structure integrally including a computer formed as one body or by a plurality of configurations, a program, and a memory.

Figure 17:
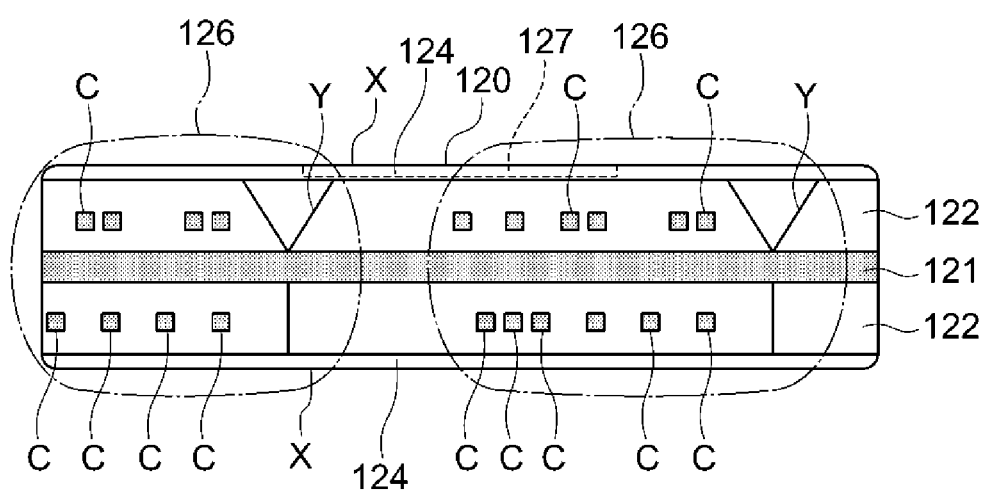
FIG. 17 is a side view of substitute currency for gaming according to the third embodiment of the present invention.

Next, details of substitute currency 120 for gaming (so-called substitute currency for gaming) used in this system will be described. FIG. 17 is a side view of substitute currency 120 for gaming used in this system, the substitute currency 120 for gaming is formed by stacking a plurality of plate-shaped plastic layers having different colors, forming the plastic layers to be integrated using a means of thermo-compressing or the like, and then, punching holes in the shapes of circles and quadrangles. The substitute currency 120 for gaming manufactured in this way has a multi-layer structure in which a coloring layer 121 is included at least in the middle, and white layers 122 or thin-color layers (may be layers of a color thinner than that of the coloring layer 121; not illustrated in the drawing) are stacked on both sides (in FIG. 17, the upper and lower sides) of the coloring layer 121 disposed in the middle. In this way, by employing the multi-layer structure in which the coloring layer 121 is included, and the white layers 122 or the thin-color layers (may be layers of a color thinner than that of the coloring layer 121; not illustrated in the drawing) are stacked on both sides of the coloring layer 121 disposed in the middle, as illustrated in FIG. 17, a stripe pattern (in the stacking direction) when seen from the side face is formed, and, by changing the color (red, green, yellow, blue, or the like) of the coloring layer 121 for each type (10 points, 20 points, 100 points, 1000 points, and the like) of the substitute currency 120 for gaming, the type of the substitute currency 120 for gaming can be specified.

In addition, as illustrated in FIG. 17, in the substitute currency 120 for gaming, a side ID 126 representing the type of substitute currency 120 for gaming is applied to the side faces of the white layers 122.

In the outermost layers, transparent layers 124 are arranged, and each interlayer is thermo-compressed to form a structure of at least five layers. Such substitute currency 120 for gaming is formed by using a plastic material having a thin long shape, and layers (at least the coloring layer 121 and the white layers 122) are thermo-compressed to form a closely adhering state (the structure of five layers or the like) in the state of a long length, and thereafter, holes having a circular shape, a rectangular shape, or the like are formed therein through press or the like.

When a hole is formed through the press, die of mold for punching, and the size of punching are designed, and R processing (round angle) is performed for the ends of the transparent layer 124 of the outermost layer.

The transparent layers 124 may be a coat layer of varnish. The side ID 126 is attached to at least three positions on the side face of the substitute currency 120 for gaming. The side ID 126 is attached through inkjet printing using ink that is visible for visible light.

Figure 18:
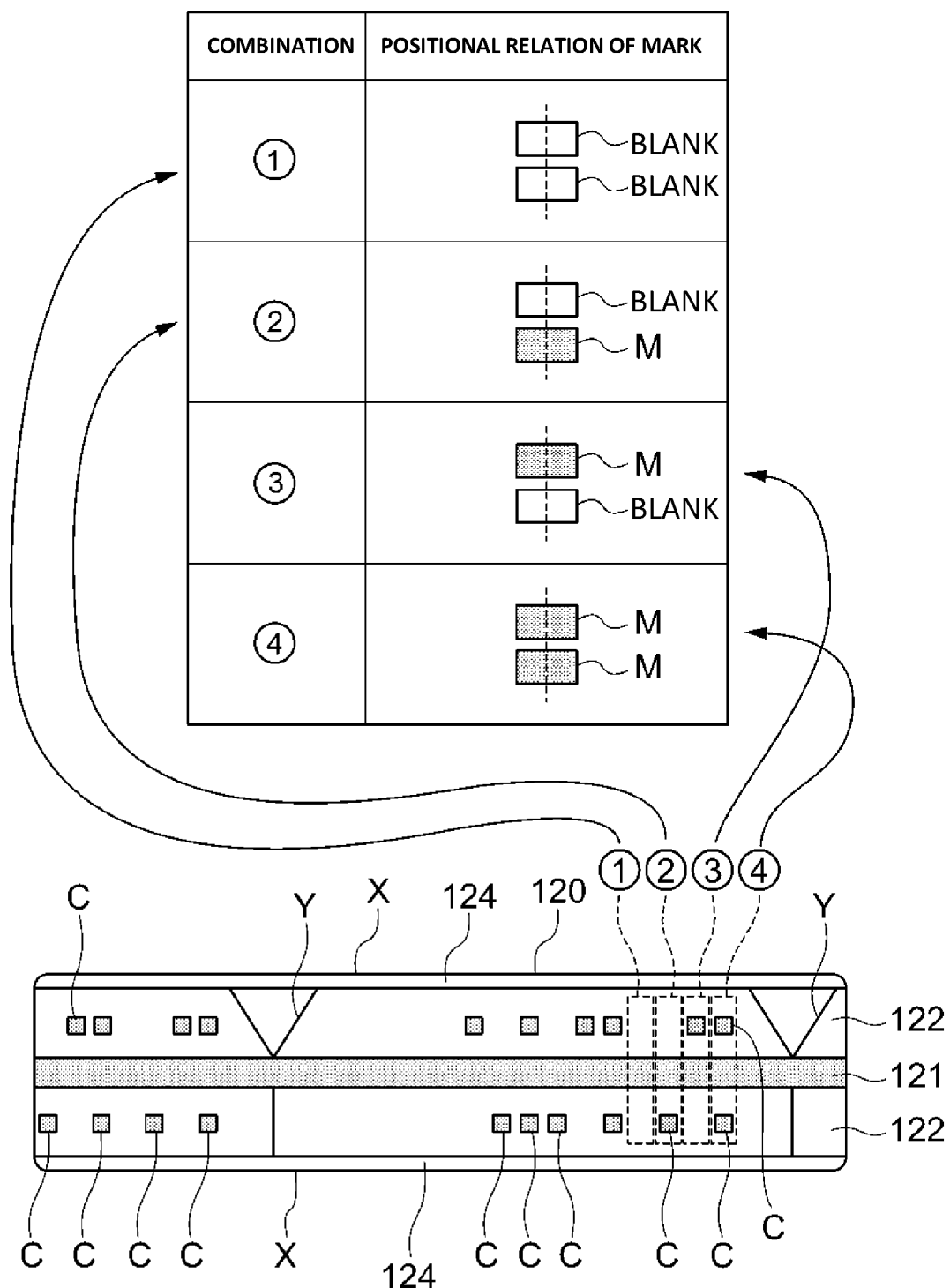
FIG. 18 is a diagram illustrating substitute currency for gaming configuring a code (four kinds) using upper and lower marks C as a pair.

Particularly, in this embodiment, the side ID 126 is configured to be attached as presence/absence of marks C of a plurality of rows and a plurality of columns. In the marks C of the plurality of rows and the plurality of columns, as illustrated in FIG. 17, upper and lower marks C are paired to configure a code, and a code of ten digits is formed in the case illustrated in FIG. 17. A configuration in which upper and lower marks C are paired to configure a code (four types) is illustrated in FIG. 18. A letter "Y" disposed to the side of marks C is an identification mark used for identifying upper and lower sides of a mark. A code configured by marks C is configured to specify a predetermined combination of marks C. As a result, in the example illustrated in FIG. 18, there are four types of combination of the marks C of upper and lower two columns, and, by printing these in ten columns, four to the power of 10 codes can be configured. Since there are four types of a 10-digit code, 4 to the power of 10 codes are acquired, and accordingly, the side IDs 126 of substitute currency 120 for gaming can be sufficiently assigned.

The substitute currency 120 for gaming forms a stripe pattern on the side face in the stacking direction by employing a multi-layer structure in which a plurality of plastic layers having different colors are stacked, the coloring layer 121 is included at least in one layer, the white layers 122 or the thin-color layers are stacked on a further outer side than the coloring layer 121 and has a configuration enabling the type of the substitute currency 120 for gaming to be specified using the coloring layer 121. The side IDs 126 are disposed at least three positions (preferably, six positions) on the side face of the white layer 122 or the thin-color layer, and, in this example, six side IDs are disposed at a predetermined interval of 60 degrees in the rotation direction (circumferential direction). The side IDs 126 individually identifiable (different for each one) are attached to substitute currency 120 for gaming, and the side IDs 126 are disposed at a predetermined interval of 60 degrees in the rotation direction (circumferential direction) such that the side ID is necessarily seen from the lateral side. The side IDs 126 attached to the substitute currency 120 for gaming are read by the ID reading device 53 described above. The type, the manufacturing information, and the like of substitute currency 120 for gaming can be specified by reading the side ID 126 by using the ID reading device 53, and a configuration in which the side ID 126 can be managed in the database 51 is formed. In this embodiment, the side IDs 126 are attached using ink (visible ink) that is visible for visible light through inkjet printing. The side IDs 126 may be printed using at least one or a combination of ink (ink absorbing infrared rays) that is not visible for visible light and ink (including a side ID that is very small and is difficult to see) that is visible for at least visible light. In addition, the side IDs 126 may be printed by combining a plurality of such ink of a plurality of types. The ID reading device 53 includes at least a plurality of cameras (that is, a visible-light camera in a case where ink is visible ink, an infrared-ray camera in a case where ink is infrared reactive ink, and an ultraviolet camera in a case where ink is UV ink (UV radiator and a visible-light camera)) corresponding to the ink used for printing the side ID 126 or includes a camera capable of performing switching among a plurality of functions of cameras (a visible-light camera, an infrared ray camera, and an ultraviolet ray camera (an UV radiator and a visible-light camera or the like)) corresponding to the ink.

Figure 19:
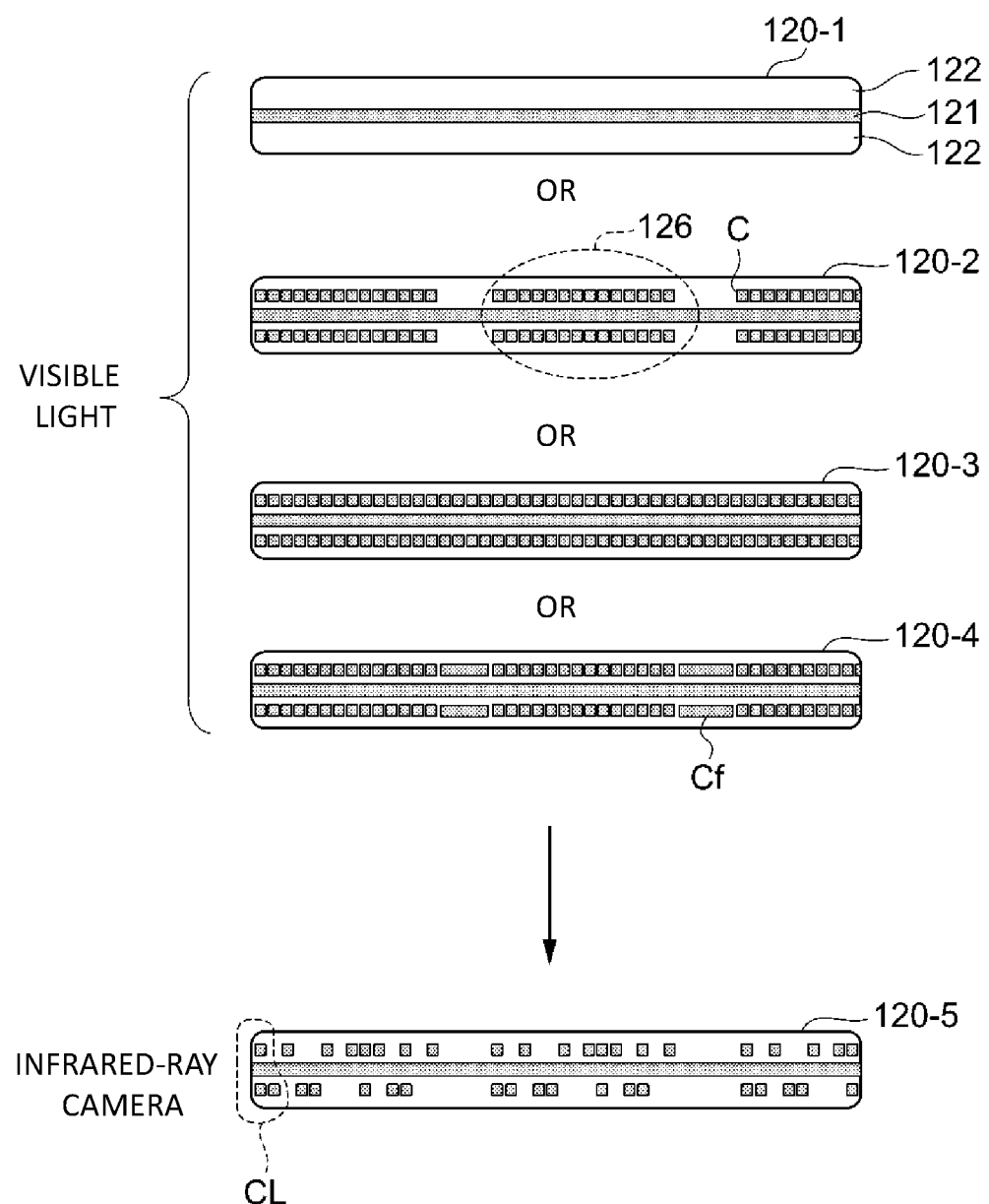
FIG. 19 is a diagram illustrating substitute currency for gaming in which side IDs are printed using ink (ink absorbing infrared rays) that is invisible for visible light.

In the case illustrated in FIG. 19, in substitute currency 120-1 for gaming, side IDs 126 are printed using ink (ink absorbing infrared rays) that is not visible for visible light. In substitute currency 120-2 for gaming, marks C of a plurality of rows and a plurality of columns are printed using ink that is seen dark for visible light. In substitute currency 120-3 for gaming, additionally, marks C are printed using ink seen dark for visible light also between the side IDs 126, and the side IDs 126 are configured to dissolve in the design not to be visually distinguished. In substitute currency 120-4 for gaming, a start point and an end point of the side ID 126 are represented by a mark Cf representing the end. When the substitute currencies 120-1 to 120-4 for gaming are seen using an infrared-ray camera, ink absorbing infrared rays absorbs infrared rays to be seen dark, and the substitute currencies 120-1 to 120-4 for gaming can be imaged in a state (represented as the substitute currency 120-5 for gaming) in which the side ID 126 can be read. In addition, the upper and lower sides of the side ID 126 are illustrated using a mark CL representing the upper and lower sides. A relation between the upper and lower sides of the mark is as illustrated in FIG. 17. In addition, the side IDs 126 may be printed using a combination of ink that is visible for visible light and an infrared ray absorption ink.

Figure 20A:
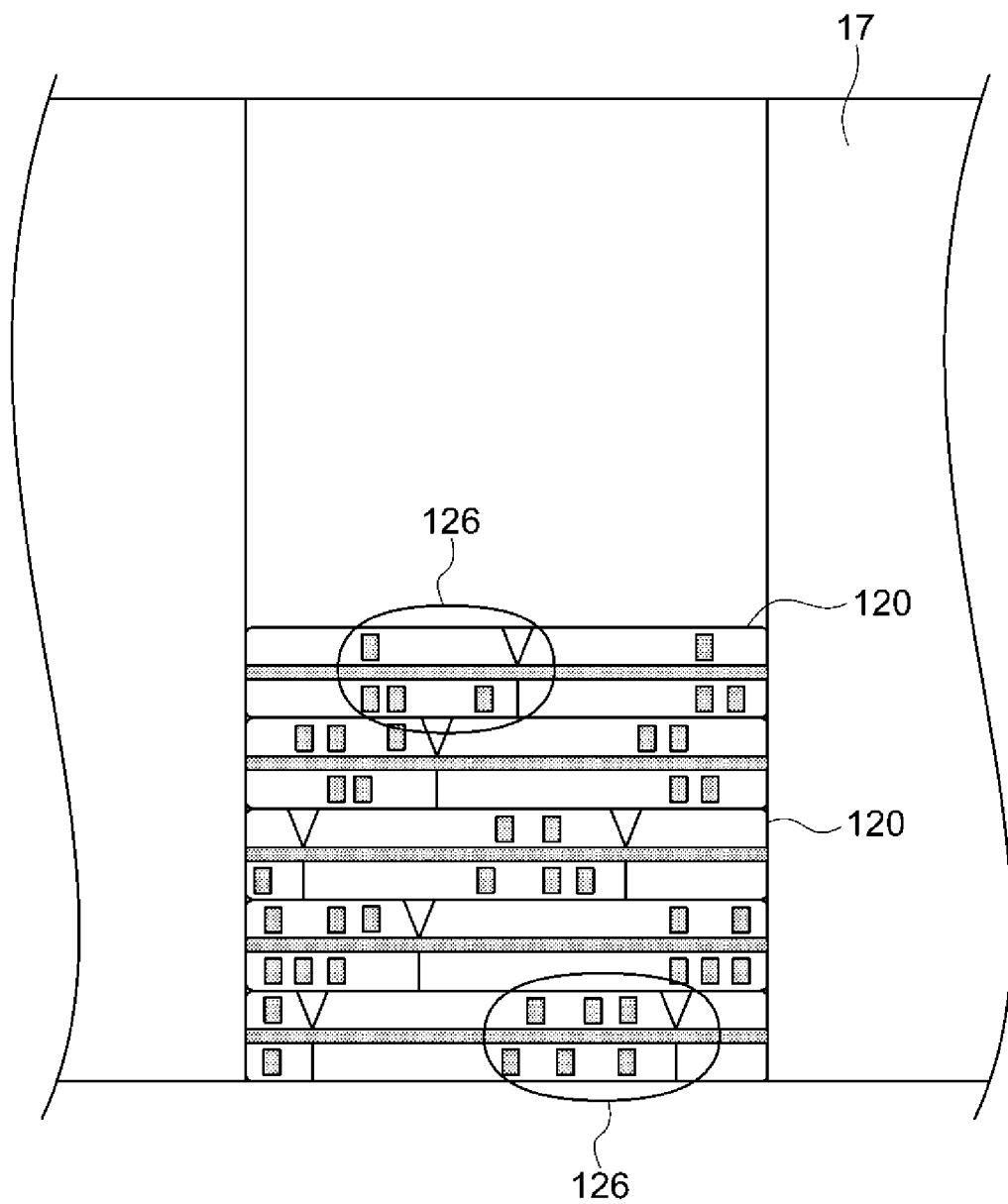
FIG. 20A is a plan view of a main part of a tray for substitute currency for gaming illustrating a state in which substitute currency for gaming according to the third embodiment is held in a tray for substitute currency for gaming of a casino table.
Figure 20B:
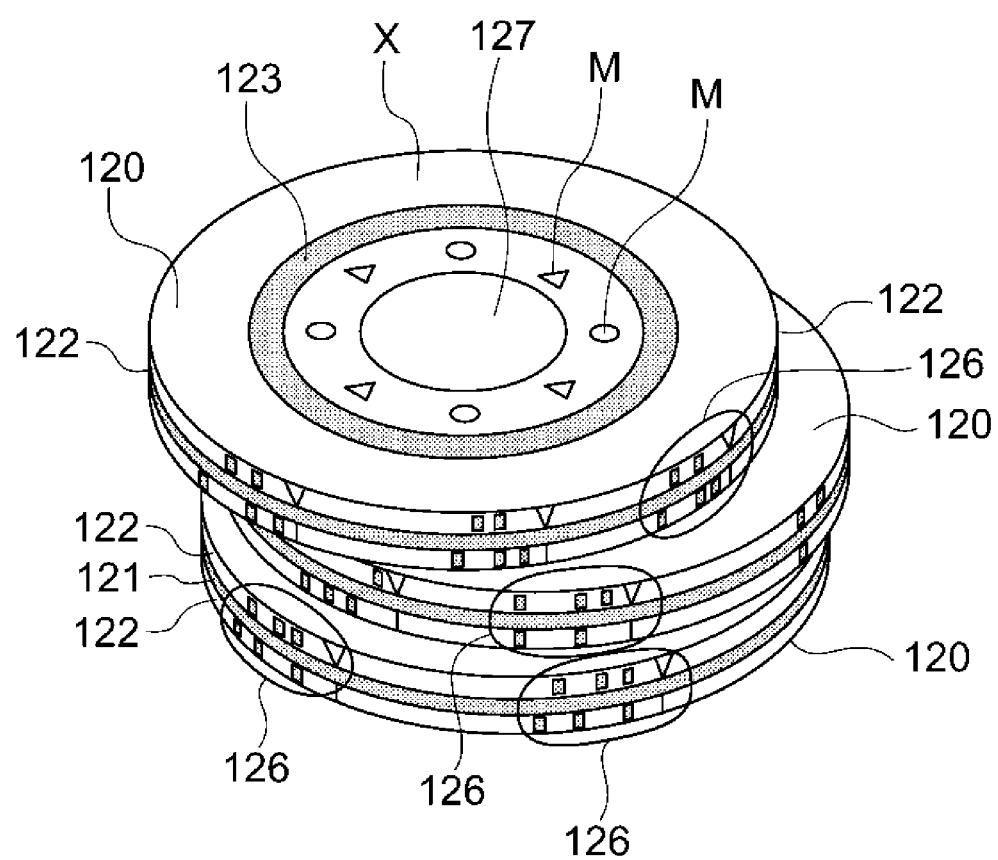
FIG. 20B is a perspective view of a state in which substitute currency for gaming is piled.

The side IDs 126 attached to the substitute currency 120 for gaming are read by the ID reading device 53 described above, and the ID reading device 53 can read the substitute currency 120 for gaming held in the storage 62 of a cashier of a game house and the game table gaming substitute currency tray 17 of the game table, and actually, as illustrated in FIG. 20A, when the substitute currency 120 for gaming is stacked horizontally, the side IDs 126 can be read. In addition, the substitute currency 120 for gaming stacked in the bet area 8 or the like, as illustrated in FIG. 20B, can be also read.

Furthermore, in the substitute currency 120 for gaming, a face code using UV ink or ink (carbon black ink) absorbing infrared rays is arranged on the surface (X) of the white layer 122 (see FIG. 9B).

This face code represents authenticity of substitute currency 120 for gaming, and, when ultraviolet rays (or infrared rays) hit the face code, the face code becomes visible to the eyes and represents authenticity based on a combination of the forms and a number. While the transparent layers (print layers) 124 are thermos-compressed or coated in the outermost layers to cover a print 123 (100 points or the like) used for specifying a game house and a face code disposed on the surface, embossing process or varnish processing is performed for the transparent layers 124, and the substitute currency 120 for gaming is prevented from adhering to each other and is caused to slide well. In the substitute currency 120 for gaming, a circular recess 127 is arranged at the center of each of the upper and lower faces.

According to the recesses 127, the substitute currency 120 for gaming is prevented from being adhere to each other, and, by increasing the diameter of the recesses 127, the substitute currency 120 for gaming can slide well.

The R processing (R) is performed for the ends of the transparent layers (print layers) 124 of the outermost layers for which a print 123 (100 points or the like) is performed, and, in the punching process of the substitute currency 100 for gaming, the surfaces of the white layers 122 are prevented from being deformed to appear on the side face. In addition, it is prevented that a sharp end remains in the substitute currency 100 for gaming and damages the hands or the other substitute currency 120 for gaming. The coloring layer 121 may be formed by colored one layer or a plurality of layers. In addition, metal or ceramic used for increasing the weight may be built in a layer included in the layer of the coloring layer 121. More specifically, in the material of the layer included in the layer of the coloring layer 121, for example, metal powders (for example, a metal oxide of one or a plurality of metal oxides of zinc oxide and titanium oxide) may be contained. In addition, a part of the coloring layer 121 is hollowed out, or a space is arranged between the coloring layer 121 and the white layer 122, and an RFID may be built therein. In such a case, as the side ID 126 of the substitute currency 120 for gaming, a side ID 126 according to a code using the marks C and a side ID using the RFID are used together.

In the substitute currency 120 for gaming configured in this way, the types and the quantities of the substitute currency 120 for gaming that is held in the game table gaming substitute currency tray 17 and the storage 62 are specified by the gaming substitute currency determining device 52 through the camera device 2 and the ID reading device 53, and the side IDs 126 of the substitute currency 120 for gaming present on the game table gaming substitute currency tray 17 and the storage 62 are managed in the database 51 together with the presence information thereof. In this way, at least, it is inspected whether 1) a side ID 126 that has not been present in the database 51 is newly present 2) two or more same side IDs 126 are present. By determining the occurrences of the situations of 1) and 2) described above by searching for all the side IDs 126, the inspection is realized.

As described above, while a game participant 6 can perform exchange of cash 61 for substitute currency for gaming in the cashier 60, exchange of cash 61 for substitute currency 120 for gaming can be performed also in the game table 4. The camera device 2 images bills placed on the game table 4 to exchange them for substitute currency 120 for gaming. That is, a plurality of camera devices 2 imaging the substitute currency 120 for gaming disposed on the game table 4 are arranged at different positions to have different heights.

The management control device 50 specifies the types and the quantities of substitute currency 120 for gaming to be discharged from the gaming substitute currency tray 17 in the exchange from bills by using a result of imaging of bills using the camera device 2. The management control device 50 compares real total amounts of the substitute currency 120 for gaming housed in the gaming substitute currency tray 17 before and after the payment and determines whether or not this difference corresponds to the specified types and quantities of the substitute currency 120 for gaming to be discharged.

That is, the management control device 50 determines through a comparison whether or not a total amount of the substitute currency 120 for gaming perceived in the gaming substitute currency tray 17 corresponds to an increase/decrease according to a paid amount of the substitute currency 120 for gaming corresponding to exchanged bills after the exchange of the bills and the substitute currency 120 for gaming. In addition, when collection and re-payment according to a result of winning/losing of a game are simultaneously performed, the management control device 50 determines through a comparison whether or not the total amount corresponds to an amount of the substitute currency 120 for gaming bet by all the players 6 and an increase/decrease in the substitute currency 120 for gaming calculated based on a result of the winning/losing of the game.

Here, the management control device 50 is a control device having an artificial intelligence-utilizing or deep-learning structure capable of acquiring information of the types and the quantities of the substitute currency 120 for gaming even in a state in which a part or whole one unit of the substitute currency 120 for gaming is hidden when the types and the quantities of the substitute currency 120 for gaming are measured and determined.

As described above, the side IDs 126 are attached to the white layers 122 or the thin-color layers of the side face of the substitute currency 120 for gaming at least at three or more positions spaced apart in a rotation direction (circumferential direction). The types and the manufacturing information of substitute currency 120 for gaming can be specified by reading the side IDs 126 by using the ID reading device 53. The specified information specified through measurement has a configuration that can be collated and managed with the database 51.

The management control device 50 may be a control device having an artificial intelligence-utilizing or deep learning structure. The management control device 50 can perceive the position 8 (a position betting on a player, a banker, or a pair), the types (a value of a different amount is assigned to the substitute currency for gaming for each color), and the quantities of the substitute currency 120 for gaming by using an artificial intelligence-utilizing type computer or control system, a deep-learning (structure) technology, a self-learning function, or the like.

Figure 21:
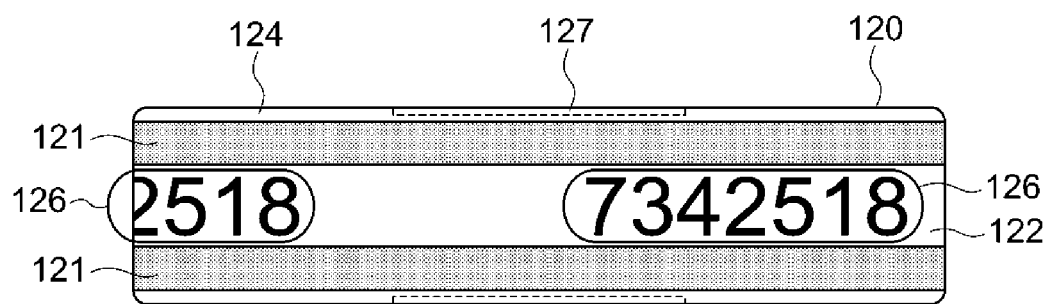
FIG. 21 is a diagram illustrating another example of substitute currency for gaming according to the third embodiment.

Hereinafter, a modified example of the substitute currency 120 for gaming will be described. In the modified example, on the side face of the substitute currency 120 for gaming, a seven-digit number is printed as the side ID 126. In the example illustrated in FIG. 21, a white layer 122 is disposed in the middle, and, under the white layer, a coloring layer 121 is disposed. A number as a mark is printed on the white layer 122 disposed in the middle and configured a side ID 126. When 10 types of combinations of numbers are printed in seven digits, 10 to the power of 7 codes can be configured, and accordingly, the side IDs 126 of substitute currency 120 for gaming can be sufficiently assigned. In the camera device 2 and an image analysis thereof, there are cases where it is difficult to determine and read a number, a combination of marks C described in the previous embodiment is considered to be advantageous in the image analysis.

Figure 22:
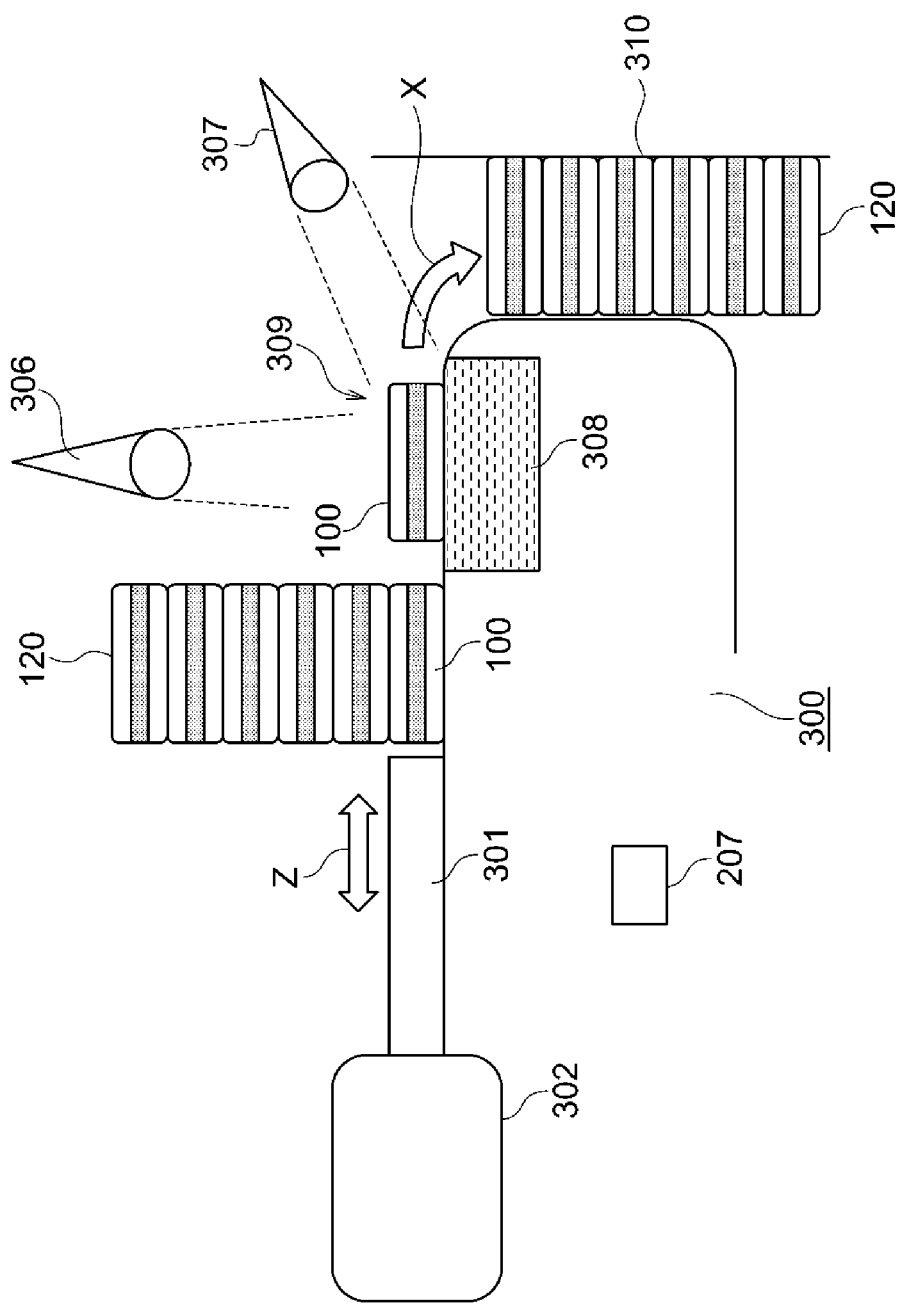
FIG. 22 is a diagram illustrating another example of an inspection device inspecting substitute currency for gaming.

Another inspection device 300 inspecting the substitute currency 120 for gaming will be described with reference to FIG. 22. The inspection device 300 includes: a face code reading device 306 that reads a face code M formed using UV emission ink or ink absorbing infrared rays disposed on the surface of the substitute currency 120 for gaming; an ID reading device 307 that reads the side ID 126 of the side face; an RFID reading device 308 that reads information of an RFID (not illustrated in the drawing) of the substitute currency 120 for gaming; and a control device 207. The control device 207 is configured to inspect a relation among the information of the side ID 126 acquired by the ID reading device 307, the information acquired from the face code reading device 306, and the information acquired from the RFID reading device 308. There is a correct database (not illustrated in the drawing), and the relation among the information is inspected by comparing a reading result with the database. This inspection is used for preventing the occurrence of a defect by detecting a print error in the face code M and the side ID 126 or for discrimination with a fake.

This example (FIG. 22) includes an extrusion device 302 that supplies substitute currency 120 for gaming one at each time to a reading stage 309 by using an extruder 301 that in moved in the direction of an arrow Z by the extrusion device 302, and the stacked substitute currency 120 for gaming is supplied from the extrusion device 302 to the reading stage 309. In this way, previous substitute currency 120 for gaming for which the inspection is completed is extruded and falls in the direction of an arrow X, and the substitute currency 120 for gaming that has fallen in the direction of the arrow X is held on a holding stage 310.

Figure 23:
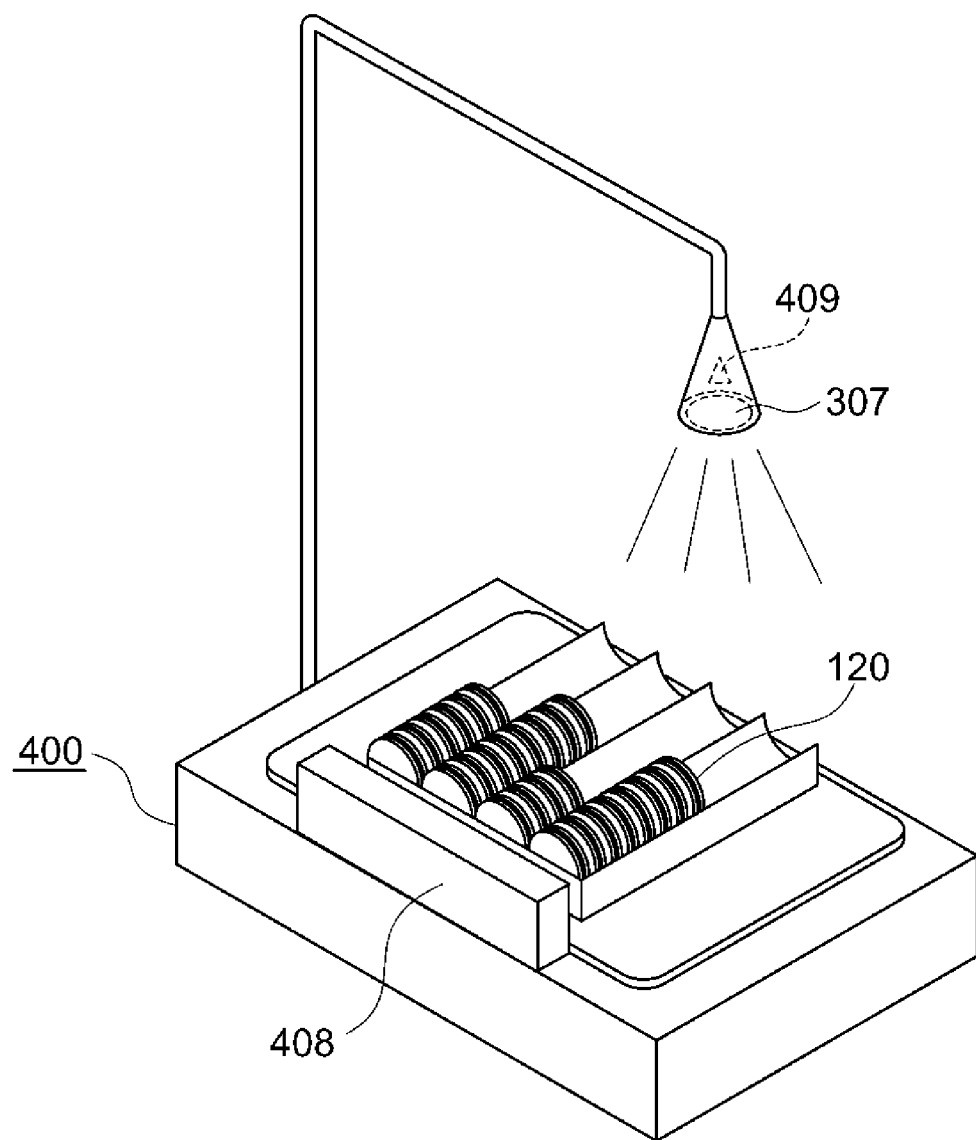
FIG. 23 is a diagram illustrating another example of an inspection device inspecting substitute currency for gaming.

Further another inspection device 400 that inspects substitute currency 120 for gaming will be described with reference to FIG. 23. The inspection device 400 includes: an RFID reading device 408 that reads information of an RFID (not illustrated in the drawing) of the substitute currency 120 for gaming; an ID reading device 307 that reads the side ID 126 of the side face; and a control device 207 and is configured to inspect a relation between the information of the side ID 126 acquired by the ID reading device 307 and the information acquired from the RFID reading device 408. There is a correct database (not illustrated in the drawing), and the relation among the information is inspected by comparing a reading result with the database. This inspection is used for preventing the occurrence of a defect by detecting a print error in the face code M and the side ID 126 or for discrimination with a fake.

The ID reading device 307 includes a single visible-light camera or a single infrared-ray camera corresponding to ink used for print the side ID 126 and is configured to include a camera 409 capable of performing switching among a plurality of functions of a visible-light camera and an infrared-ray camera corresponding to the printed ink. The visible-light camera can read the number and the color of the substitute currency 120 for gaming, and the infrared-ray camera can read the side ID 126 of the substitute currency 120 for gaming.

Figure 24:
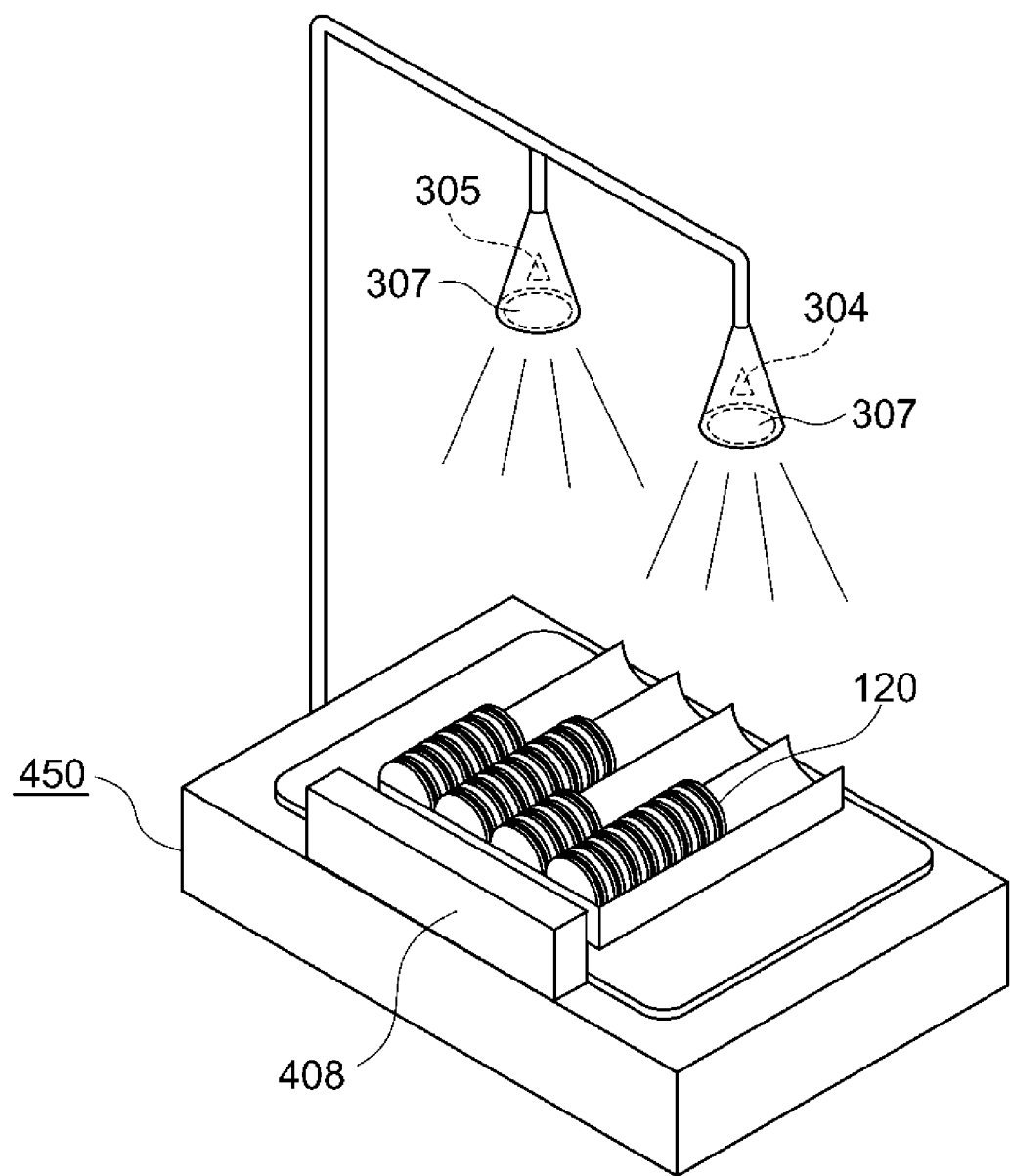
FIG. 24 is a diagram illustrating another example of an inspection device inspecting substitute currency for gaming.

Still another inspection device 450 inspecting substitute currency 120 for gaming will be described with reference to FIG. 24. A same reference numeral is assigned to a same component as that of the inspection device 400 (the description thereof will not be presented). An ID reading device 307 is configured to include a plurality of visible-light cameras 304 or infrared-ray cameras 305 corresponding to ink used for printing the side ID 126. The visible-light camera 304 can read the number and the color of the substitute currency 120 for gaming, and the infrared-ray camera 305 can read the side ID 126 of the substitute currency 120 for gaming.

A management control device 50 acquires a total amount of substitute currency for gaming (chips) placed in a gaming substitute currency tray 17 after a settlement at the time of the end of a game through a gaming substitute currency determining device 52. A determination of "after a settlement" is when any one of the following 1) to 4) occurs:

1) when re-payment for winning substitute currency 120 for gaming (winning chips) is completed
2) when cards C used in this game are collected and are disposed in a disposal area or a disposal slot of the table
3) when a predetermined button accompanying a card distributing device 3 functioning as a winning/losing result determining device is pressed
4) when a marker 43 representing winning/losing is returned to the original state In addition, in this embodiment, an image analyzing device 18 according to the second embodiment that records a state of process of a game played in the game table 4 as a video including game participants 6 and a dealer 5 through a plurality of camera devices 2 and performs an image analysis of the recorded video of the state of process of the game to analyze and perceive a total amount of the substitute currency 120 for gaming in the gaming substitute currency tray 17 of a dealer 5 of the game table 4 and a measurement device 19 that performs an analysis and measurement by using information acquired by the image analyzing device 18 and determines the types and the quantities of the substitute currency 120 for gaming, and/or a mark reading device 205 that reads a face code formed using UV emission ink or ink absorbing infrared rays disposed on the surface of the substitute currency 120 for gaming are combined, and an RFID reading device 308 that reads information of an RFID 125 of the substitute currency 120 for gaming is combined as is necessary, whereby an inspection device as below including a management control device 50 can be configured.

That is, by combining the RFID reading device 308 reading the information of the RFID 125 of the substitute currency 120 for gaming with the configuration described above, an inspection device including the ID reading device 53 reading the side ID 126 of the side face and the management control device 50 can be configured. In this inspection device, the management control device 50 inspects a relation between the information of the side ID 126 read by the ID reading device 53 and the information of the RFID 125 read by the RFID reading device 308 is inspected.

In addition, by combining the mark reading device 205 of the second embodiment that reads a face code formed using UV emission ink or an infrared-ray absorption ink arranged on the upper face or the lower face of the substitute currency 120 for gaming with the configuration described above, an inspection device including the ID reading device 53 reading the side ID 126 of the side face and the management control device 50 can be configured. In this inspection device, the management control device 50 inspects a relation between the information of the side ID 126 read by the ID reading device 53 and the information of the face code read by the mark reading device 205.

In addition, by combining the mark reading device 205 of the second embodiment that reads a face code formed using UV emission ink or an infrared-ray absorption ink arranged on the surface of the substitute currency 120 for gaming and an RFID reading device 308 reading information of the RFID 125 of the substitute currency 120 for gaming with the configuration described above, an inspection device including the ID reading device 53 reading the side ID 126 of the side face and the management control device 50 can be configured. In this inspection device, the management control device 50 inspects a relation among the information of the side ID 126 read by the ID reading device 53, the information of the face code read by the mark reading device 205, and the information of the RFID 125 read by the RFID reading device 308.

As described above, in this embodiment, in the substitute currency 120 for gaming, side IDs 126 used for identifying each individual is attached to the outer faces of the white layer 122 or the thin-color layer.

The side IDs 126 are attached to at least three or more positions spaced apart in a rotation direction (circumferential direction) of the substitute currency 120 for gaming.

In addition, the side IDs 126 are printed using non-visible ink (for example, infrared-ray absorption ink or UV emission ink) that is not visible for visible light.

Furthermore, the side IDs 126 are disposed in a plurality of rows on the side faces of two layers of the white layers 122 or the thin-color layers.

In addition, at least one layer among the plurality of plastic layers configuring the coloring layer 121 and the white layers 122 is a layer containing metal powders (for example, a metal oxide of one or a plurality of metal oxides of zinc oxide and titanium oxide) used for increasing the weight in the layer.

In addition, the side IDs 126 may be printed using at least two or more types of ink among ink that is visible for visible light, an infrared-ray absorption ink, and UV ink. In such a case, the ID reading device 53 includes a plurality of cameras corresponding to each ink used for printing the side IDs 126 or includes a camera capable of performing switching among a plurality of imaging functions corresponding to each ink.

In addition, the substitute currency 120 for gaming is manufactured as below. First, a coloring layer 121 and white layers 122 or thin-color layers having the coloring layer 121 interposed therebetween are thermos-compressed, whereby a stacked structure body including a plurality of plastic layers is formed. Then, drawing patterns are printed on at least the upper face or the lower face of the stacked structure body, whereby a substitute currency original plate is generated. Then, punching processing is performed for the substitute currency original plate by using a mold, whereby a plurality of substitute currencies for gaming having a predetermined shape are acquired. Here, in at least one layer among the plurality of plastic layers, a layer containing metal powders or a metal oxide used for increasing the weight is used.

On side faces of the substitute currency 120 for gaming manufactured in this way, side IDs 126 used for identifying each individual are printed. At this time, the side IDs 126 may be printed through inkjet printing.

In addition, an RFID 125 is interposed between the layers of the stacked structure body, and the layers having the RFID 125 interposed therebetween are heated and welded when the layers are thermos-compressed, whereby the periphery of the RFID 125 is fixed to be adhering to the plastic layers.

In addition, the management system of table games according to this embodiment includes: a gaming substitute currency tray 17 that is disposed on a game table 4 and holds substitute currency 120 for gaming for each type; a camera device 2 that images the substitute currency 120 for gaming held in the gaming substitute currency tray 17; and a management control device 50 that specifies the types and the quantities of substitute currency 120 for gaming held in the gaming substitute currency tray 17 and measures a total amount of the substitute currency 120 for gaming disposed on the gaming substitute currency tray 17 by using a result of the imaging performed by the camera device 2.

The substitute currency 120 for gaming is a stacked structure body in which the coloring layer 121 and the white layers 122 or the thin-color layers are stacked and has a stripe pattern on the side face in the stacking direction. The management control device 50 has a function of measuring the number of the coloring layers 121 or the white layers 122 or the thin-color layers of the substitute currency for gaming placed by each game participant and determining the types and the amount of the substitute currency for gaming based on the colors of the coloring layers 121.

The management control device 50 determines whether or not a real total amount of the substitute currency 120 for gaming after the end of a game that is perceived on the gaming substitute currency tray 17 corresponds to an increase/decrease amount of the substitute currency 120 for gaming calculated based on the amount of the substitute currency 120 for gaming bet by all the players 6 and a result of winning/losing of the game.

In the management control device 50, the acquisition of the total amount of the substitute currency 120 for gaming in the gaming substitute currency tray 17 after a settlement at the time of end of a game may be performed at one of:

1) time when re-payment for winning substitute currency 120W for gaming ends;

2) time when cards used in the game are collected and are disposed in a disposal area of the table;

3) time when a predetermined button accompanying a card distributing device 3 functioning as a winning/losing result determining device is pressed; and 4) time when a marker representing winning/losing is returned to the original state.

The camera device 2 can also image bills place on the game table 4 for exchange of the substitute currency 120 for gaming, and the management control device 50 specifies the types and the quantities of substitute currency 120 for gaming disposed on the gaming substitute currency tray 17 to be decreased according to exchange of the substitute currency 120 for gaming disposed on the gaming substitute currency tray 17 and bills by using a result of the imaging of the bills and performs a comparison with a real total amount of the substitute currency 120 for gaming disposed on the gaming substitute currency tray 17.

The management control device 50 determines through a comparison whether a total amount of substitute currency 120 for gaming perceived in the gaming substitute currency tray 17 corresponds to an increase/decrease according to a paid amount of substitute currency 120 for gaming corresponding to exchanged bills after the exchange of the bills and substitute currency 120 for gaming is performed and an increase/decrease in substitute currency 120 for gaming calculated based on the amount of substitute currency 120 for gaming bet by all the players 6 and a result of winning/losing of the game.

The management control device 50 is a control device having an artificial intelligence-utilizing or deep-learning structure capable of acquiring information of the types and the quantities of substitute currency 120 for gaming also in a state in which a part or one unit of the substitute currency 120 for gaming is hidden when the types and the quantities of the substitute currency 120 for gaming are measured and determined.

The side IDs 126 attached to the white layers 122 or the thin-color layers of the side face of the substitute currency 120 for gaming at least at three or more positions spaced apart in a rotation direction (circumferential direction), the types and manufacturing information of substitute currency 120 for gaming can be specified by reading the side ID 126 by using the ID reading device 53, and the specified information specified through measurement has a configuration that can be collated and managed with the database 51.

The side IDs 126 may be printed using two or more types of ink among ink (visible ink) that is visible for visible light, infrared-ray absorption ink, and UV emission ink. In such a case, the ID reading device 53 includes a plurality of types of cameras (a plurality of types of a visible-light camera, an infrared-ray camera, and an ultraviolet camera (a UV radiator and a visible-light camera, and the like) corresponding to ink used for printing the side IDs 126.

Alternatively, a camera capable of performing switching among a plurality of imaging functions (a visible-light camera, an infrared-ray camera, and an ultraviolet camera (a UV radiator and a visible-light camera, and the like) corresponding to each ink may be included.

In addition, a configuration may be employed in which substitute currency 120 for gaming disposed on the game table 4 is imaged by using a plurality of camera devices 2b-1 and 2b-2 that are arranged at predetermined positions and have different heights.

In the embodiments described above, while the image analyzing device 12 and the control device 14 are devices having an artificial intelligence-utilizing or deep learning structure, more specifically, the image analyzing device 12 and the control device 14 may perform an image analysis and various control processes described above by using a scale-invariant feature transform (SIFT) algorithm, a convolutional neural network (CNN), deep learning, machine learning, or the like. Such technologies are technologies for recognizing a target included in an image by performing image recognition for a captured image, and particularly, in recent years, a target is recognized with high accuracy by using a deep learning technology having multi-layered neural network.

In this deep learning technology, generally, in an intermediate layer between an input layer and an output layer of a neural network, layers overlap each other over a plurality of stages, and accordingly, a target is recognized with high accuracy.

In these deep learning technologies, particularly, a convolutional neural network has attracted attention owing to high performance according to recognition of a target based on conventional image features.

In the convolutional neural network, a recognition target image to which labels are assigned is learned, and main target included in the recognition target image is recognized. In a case where a plurality of main targets are present in a learning image, a designation is made using an area rectangular, and learning is performed with a label assigned to an image corresponding to the designated area. In addition, in the convolutional neural network, a main target in an image and the position of the target can be determined.

The convolutional neural network will be further described. In a target recognition process, by performing an edge extracting process and the like for a recognition target image, candidate areas are extracted based on local features, and, after feature vectors are extracted by inputting the candidate areas to the convolutional neural network, classification is performed, and a candidate area having a classified highest certainty factor is acquired as a result of the recognition.

Here, the certainty factor is an amount representing a relative degree of highness of the similarity of a subject of an image learned together with an image area and a label relative to the similarity of the other classes.

In addition, devices having artificial intelligence-utilizing or deep-learning structures are disclosed in U.S. Pat. No. 9,361,577, US 2016-171336 A, US 2015-036920 A, JP 2016-110232 A, and the like, the content of which is incorporated herein by reference.

As above, while various embodiments of the present invention have been described, it is apparent that the embodiments described above may be changed by a person skilled in the art within the scope of the present invention, and the devices according to these embodiments may be appropriately changed as is necessary for an application game.

REFERENCE SIGNS LIST

1 Playing card
1s Plurality of sample playing card
2 Camera device
3 Card distributing device 4 Game table
5 Dealer
6 Guest (game participant/player)
7 Chair
8 Bet area
10 Area
10P Player area
10B Banker area
11 Game recording device
12 Image analyzing device
13 Result display lamp
14 Control device
14C Card distribution detecting device
15 Output (abnormality determination result and the like)
16 Abnormality display lamp
30 Distribution limiting device
33 Slot
34 Lock member
35 Driving unit
36 Lock member
37 Driving unit
40 Distribution limiting device
102 Card housing unit
103 Index
105 Card guiding unit
106 Opening portion
107 Card guide
109 Control unit
112 Side monitor
120 Substitute currency for gaming
121 Coloring layer
122 White layer
123 Print
124 Transparent layer (print layer)
125 RFID
126 Side ID
200 Inspection device
201 Inlet
202 Outlet
203 Passage
204 Determination device
205 Mark reading device
206 Print inspecting device
207 Control device

The invention claimed is:

1. A management system for managing gaming chips, wherein at least one gaming chip of the gaming chips includes a radio frequency identification (RFID) tag that stores a first information, and each gaming chip of the gaming chips has a second information represented on a side surface of the gaming chip, the second information is readable when the gaming chips are stacked on top of each other, the management system comprising:
    an image capture device configured to capture an image of a portion of the side surface of each gaming chip of a stack of one or more gaming chips;
    a reader configured to read a set of RFID tags associated with the one or more gaming chips included in the stack to obtain the first information for each read RFID tag;
    an image analysis device configured to, based on the image and for each gaming chip included in the stack, identify the second information;
    a database in which the first information and the second information for each gaming chip of the gaming chips is associated and recorded; and
    a controller configured to inspect, by referring to the database, an association between the first information obtained by the reader and the second information obtained by the image analysis device.

2. The management system according to claim 1, wherein the image analysis device is further configured to, based on the image and for each gaming chip included in the stack, obtain a position of the gaming chip.

3. The management system according to claim 1, wherein, for each gaming chip, the second information is represented on at least three locations on the side surface of the gaming chip.

4. The management system according to claim 1, further comprising:
    a holder configured to hold a plurality of gaming chips in a stacked state, wherein:
    the image capture device is configured to capture an image of the plurality of gaming chips held by the holder, and
    the reader is configured to read the RFID tags of the plurality of gaming chips held by the holder.

5. The management system according to claim 1, further comprising:
    a game table on which games using the gaming chips are played, wherein
    the image capture device is configured to capture the image of the portion of the side surface of each gaming chip of the stack on the game table, and
    the reader is configured to read the RFID tags of a plurality of gaming chips stacked on the game table.

6. The management system according to claim 1, wherein, for each gaming chip, the second information includes information representing a type of the gaming chip.

7. The management system according to claim 1, wherein the second information is code information represented by the presence or absence of a plurality of marks.

8. The management system according to claim 1, wherein the controller is further configured to generate an error signal based on a determination that the second information of a particular gaming chip is not present in the database.

9. The management system according to claim 1, wherein the controller is further configured to generate an error signal based on a determination that two or more identical second information are present in the database.

10. The management system according to claim 1, wherein:
    the set of RFID tags read by reader includes RFID tags of a first number of gaming chips of the stack; and
    the stack includes a total of a second number of gaming chips that is different from the first number of gaming chips.

11. The management system according to claim 1, wherein at least one gaming chip included in the stack is a counterfeit gaming chip that is without an RFID tag that stores the first information.

12. A gaming chip used in a management system, the gaming chip comprising:
    an RFID tag configured to store first information; and
    a side surface configured to represent second information of the gaming chip at least three different locations on the side surface, wherein:
    the second information is readable when the gaming chip is included in a stack of a plurality of chips in which the chips of the plurality of chips are stacked on top of each other, and
    the first information and the second information are associated with each other in a database to enable inspection between the first information read from the RFID tag and the second information read from the side surface.

13. A management system for managing gaming chips, the management system comprising:
   an image capture device configured to capture an image of a portion of a side surface of each gaming chip included in a stack of gaming chips, one or more of the gaming chip includes a radio frequency identification (RFID) tag that stores first information, and the side surface of each of the gaming chips is associated with second information;
   a reader configured to read a set of RFID tags associated with one or more gaming chips included in the stack to obtain the first information of each read RFID tag;
   an image analysis device configured to, based on the image, identify the second information associated with each of the gaming chips; and
   a controller configured to inspect, based on data stored in a database, an association between the first information obtained by the reader and the second information identified by the image analysis device.

14. The management system according to claim 13, wherein, for each gaming chip included in the stack of gaming chips, the side surface of the gaming chip represents the second information.

15. The management system according to claim 13, wherein the side surface is configured to be readable to determine the second information.

16. The management system according to claim 13, further comprising the database in which first information of one or more gaming chips and second information of the one or more gaming chips are associated and stored.

17. The management system according to claim 13, wherein, to inspect the association, the controller is further configured to determine whether the second information is present in the database.

18. The management system according to claim 13, wherein the controller is further configured to generate an error signal based on a determination that the second information of a particular gaming chip is not present in the database.

19. The management system according to claim 13, wherein, to inspect the association, the controller is further configured determine whether the second information is present in the database and associated with two or more different gaming chips.

20. The management system according to claim 13, wherein the controller is further configured to generate an error signal based on a determination that two or more identical second information are present in the database.

21. The management system of claim 13, wherein:
   the stack includes a plurality of gaming chips, the plurality of gaming chips including the gaming chip and a second gaming chip, the second gaming chip includes an RFID tag that stores first information of the second gaming chip and a side surface associated with second information of the second gaming chip;
   the reader is further configured to read the RFID tags of the second gaming chip to obtain the first information of the second gaming chip;
   the image analysis device is further configured to, based on the image, identify the second information associated with the second gaming chip; and
   the controller is configured to:
      receive the first information of the second gaming chip from the reader,
      receive the second information of the second gaming chip from the image analysis device,
      access the database, and
      inspect, based on the data stored in a database, an association between the first information of the second gaming chip and the second information of the second gaming chip.

* * * * *